(12) United States Patent
Tanaka et al.

(10) Patent No.: US 12,224,558 B2
(45) Date of Patent: Feb. 11, 2025

(54) LIGHT EMITTING ELEMENT AND METHOD FOR MANUFACTURING SAME

(71) Applicant: SONY GROUP CORPORATION, Tokyo (JP)

(72) Inventors: Masayuki Tanaka, Tokyo (JP); Kentaro Fujii, Tokyo (JP); Tatsushi Hamaguchi, Tokyo (JP); Rintaro Koda, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 919 days.

(21) Appl. No.: 17/286,335

(22) PCT Filed: Sep. 11, 2019

(86) PCT No.: PCT/JP2019/035711
§ 371 (c)(1),
(2) Date: Apr. 16, 2021

(87) PCT Pub. No.: WO2020/084942
PCT Pub. Date: Apr. 30, 2020

(65) Prior Publication Data
US 2021/0384707 A1    Dec. 9, 2021

(30) Foreign Application Priority Data
Oct. 26, 2018    (JP) .................. 2018-201549

(51) Int. Cl.
*H01S 5/00* (2006.01)
*H01S 5/183* (2006.01)
*H01S 5/343* (2006.01)

(52) U.S. Cl.
CPC ...... *H01S 5/18361* (2013.01); *H01S 5/34333* (2013.01); *H01S 5/34346* (2013.01)

(58) Field of Classification Search
CPC .. H01S 5/18388; H01S 5/183; H01S 5/18327; H01S 5/18361; H01S 5/18369;
(Continued)

(56) References Cited

U.S. PATENT DOCUMENTS 6,026,111 A    2/2000  Jiang et al.
6,376,269 B1   4/2002  Chen et al.
(Continued)

FOREIGN PATENT DOCUMENTS

CN    1369940 A     9/2002
CN    109923742 A   6/2019
(Continued)

OTHER PUBLICATIONS

Extended European Search Report of JP Application No. 19877046. 3, issued on Dec. 10, 2021, 11 pages.
(Continued)

*Primary Examiner* — Kinam Park
(74) *Attorney, Agent, or Firm* — CHIP LAW GROUP

(57) ABSTRACT

There is provided a semiconductor device that comprises a layered structure configured by layering a first compound semiconductor layer, an active layer, and a second compound semiconductor layer. The semiconductor device further includes a substrate, a first light reflecting layer arranged on the first surface side of the first compound semiconductor layer, and a second light reflecting layer arranged on the second surface side of the second compound semiconductor layer. Further, the second light reflecting layer has a flat shape, a concave surface portion is formed on a substrate surface, the first light reflecting layer is formed on at least the concave surface portion, the first compound semiconductor layer is formed to extend from the substrate surface onto the concave surface portion, and a cavity is (Continued)

present between the first light reflecting layer and the first compound semiconductor layer.

9 Claims, 27 Drawing Sheets

(58) Field of Classification Search
CPC ............ H01S 5/18375; H01S 5/18377; H01S 5/34333; H01S 5/0425; H01S 5/04253
See application file for complete search history.

(56) References Cited

U.S. PATENT DOCUMENTS

| | | | |
|---|---|---|---|
| 2002/0105988 A1* | 8/2002 | Park | H01S 5/18388 372/45.01 |
| 2002/0163688 A1* | 11/2002 | Zhu | H04B 10/2581 398/91 |
| 2002/0186737 A1 | 12/2002 | Marion | |
| 2002/0196548 A1* | 12/2002 | Kuznetsov | H01S 5/18388 359/578 |
| 2004/0179559 A1* | 9/2004 | Butterworth | H01S 5/141 372/21 |
| 2005/0069012 A1* | 3/2005 | Shimomura | H01S 5/04253 372/87 |
| 2005/0147142 A1* | 7/2005 | Kito | H01S 5/18388 372/43.01 |
| 2005/0286597 A1* | 12/2005 | Mukoyama | H01S 5/02253 372/50.23 |
| 2007/0280320 A1 | 12/2007 | Feezell et al. | |
| 2019/0267774 A1* | 8/2019 | Sato | H01S 5/0267 |
| 2021/0104870 A1 | 4/2021 | Sato et al. | |

FOREIGN PATENT DOCUMENTS

| | | |
|---|---|---|
| DE | 60034607 T2 | 1/2008 |
| DE | 112017005532 T5 | 7/2019 |
| EP | 1026798 A2 | 8/2000 |
| EP | 1233493 A2 | 8/2002 |
| EP | 1257027 A1 | 11/2002 |
| FR | 2824188 A1 | 10/2002 |
| JP | 05-55713 A | 3/1993 |
| JP | 2000-022277 A | 1/2000 |
| JP | 2000-252584 A | 9/2000 |
| JP | 3219823 B2 | 10/2001 |
| JP | 2002-237653 A | 8/2002 |
| JP | 2002-374045 A | 12/2002 |
| JP | 2006-114753 A | 4/2006 |
| JP | 4673951 B2 | 4/2011 |
| JP | 2018010940 A | 1/2018 |
| JP | 2018-78134 A | 5/2018 |
| JP | 6962330 B2 | 11/2021 |
| JP | 7078045 B2 | 5/2022 |
| JP | 7211362 B2 | 1/2023 |
| JP | 7259763 B2 | 4/2023 |
| KR | 10-2002-0064521 A | 8/2002 |
| WO | 2007/133766 A2 | 11/2007 |
| WO | 2018/083877 A1 | 5/2018 |
| WO | 2018/116596 A1 | 6/2018 |

OTHER PUBLICATIONS

International Search Report and Written Opinion of PCT Application No. PCT/JP2019/035711, issued on Dec. 17, 2019, 08 pages of ISRWO.

* cited by examiner

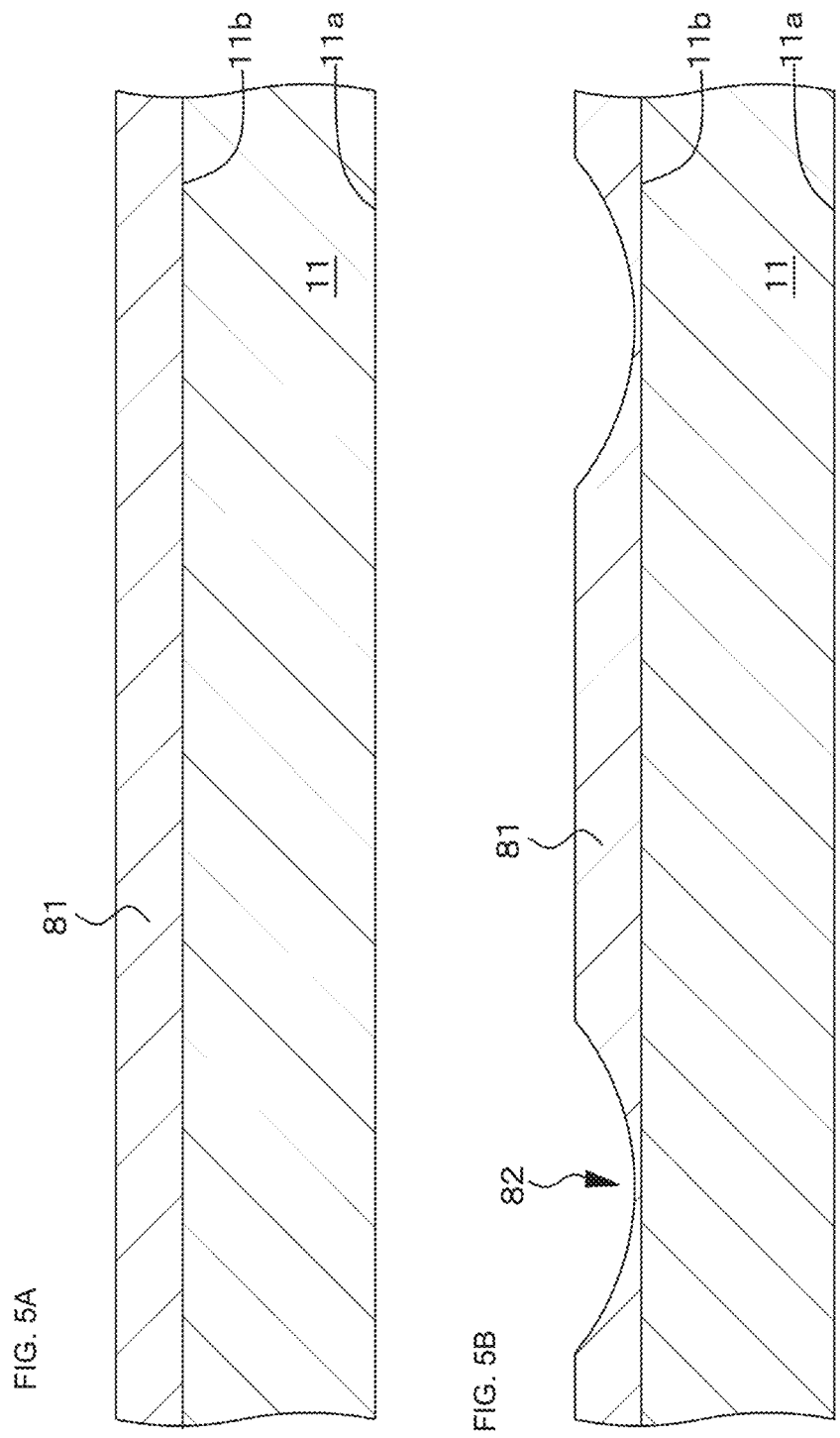

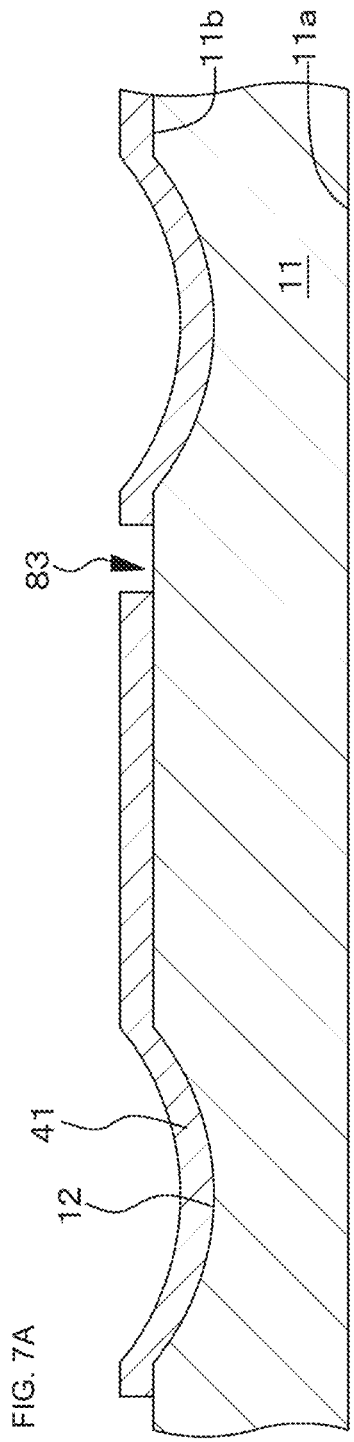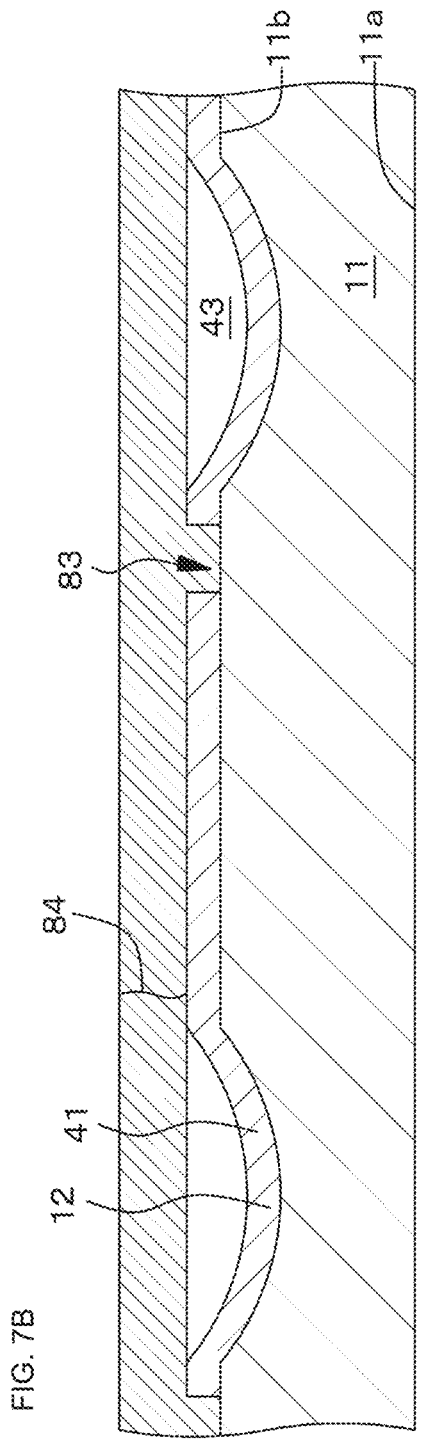

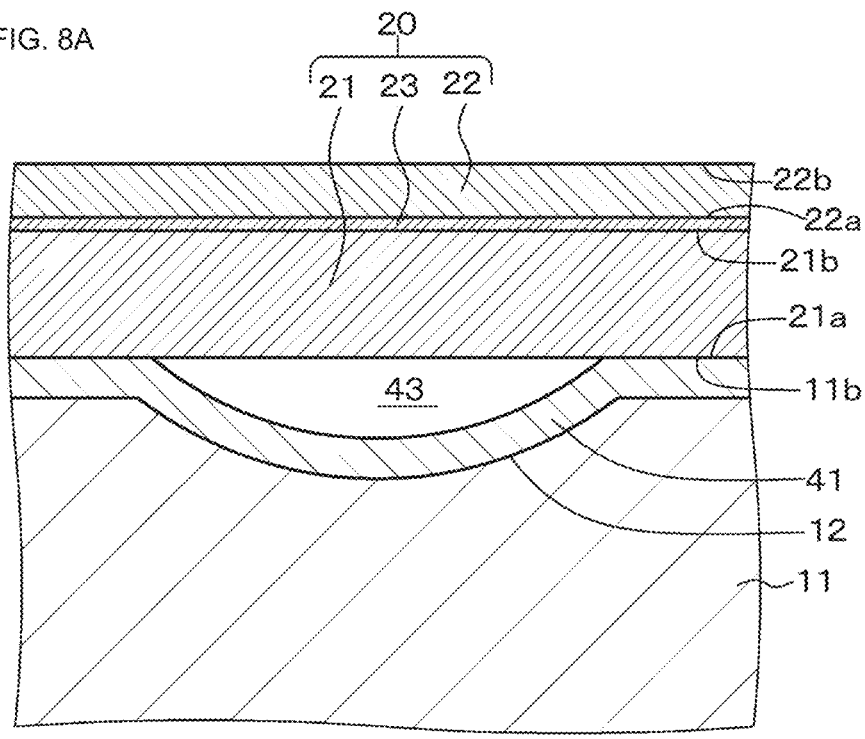
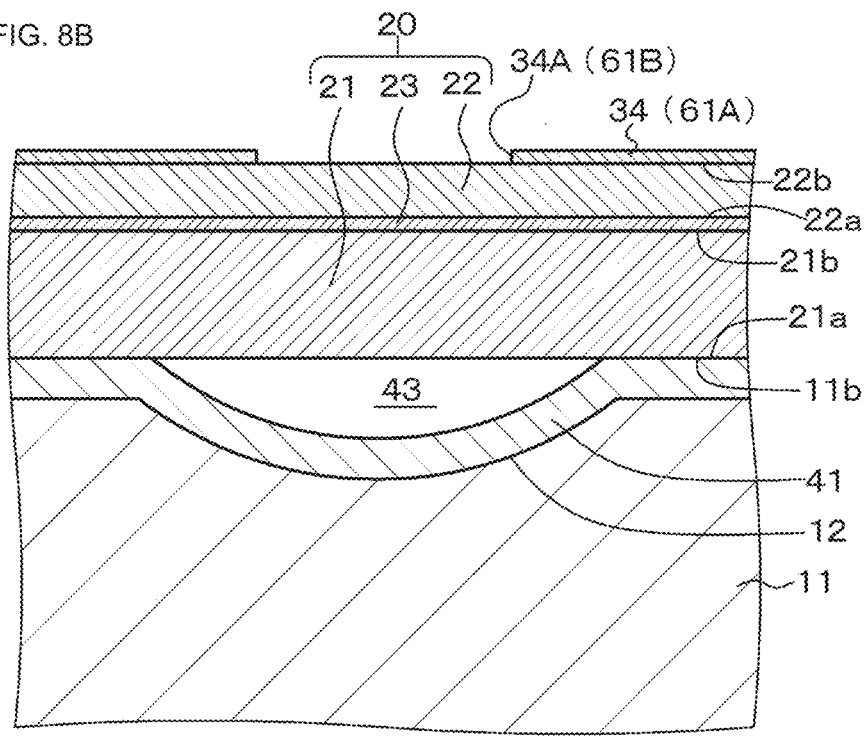

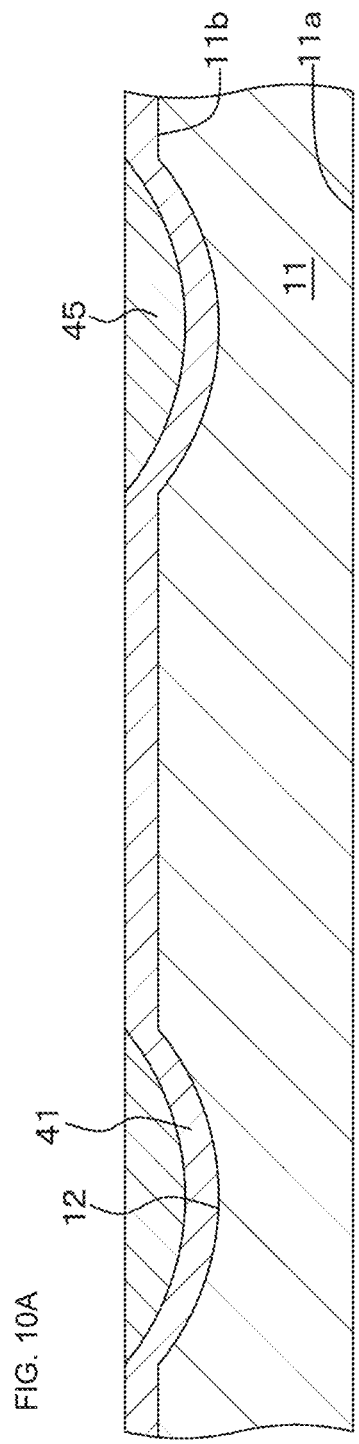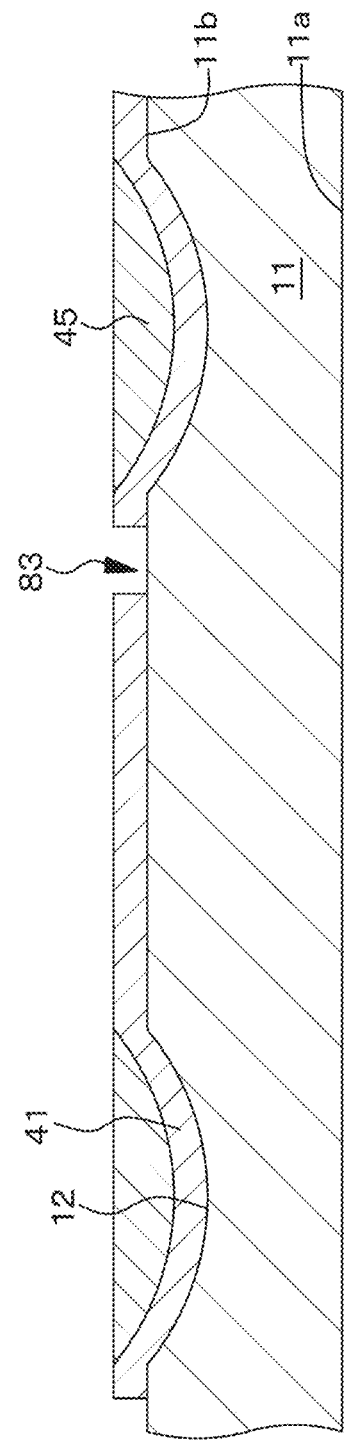

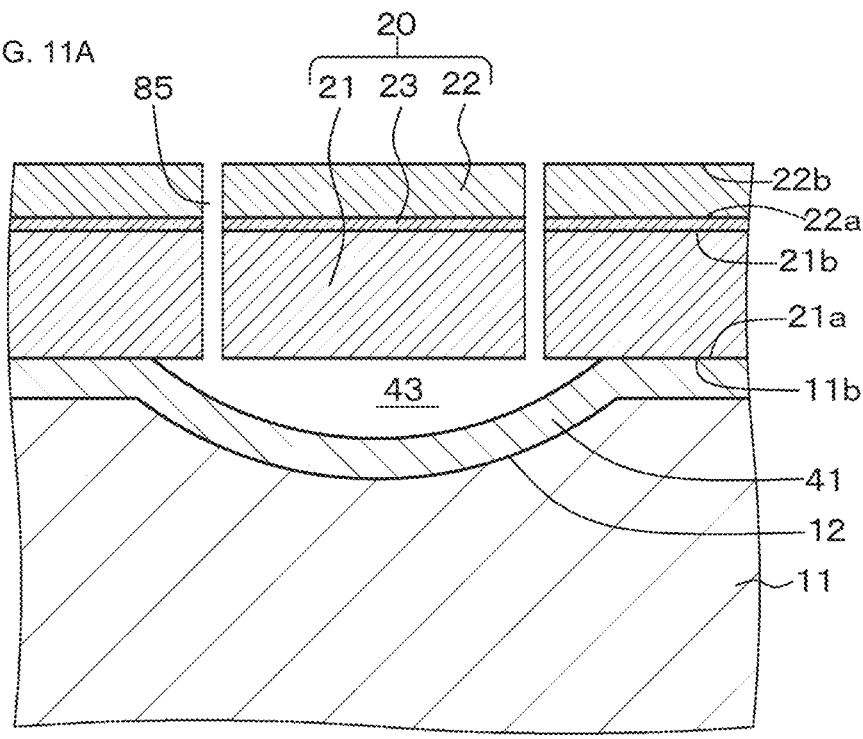
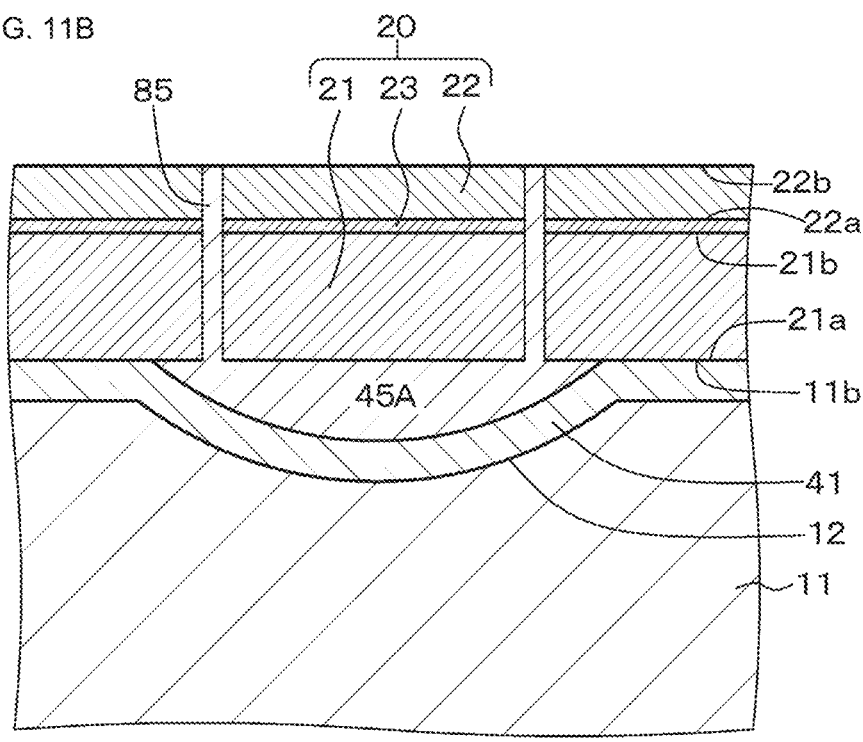

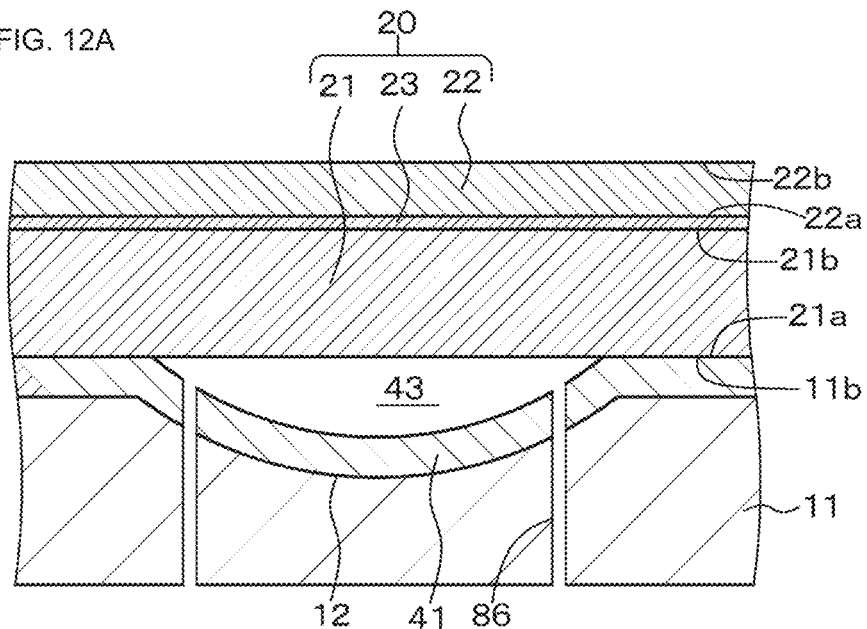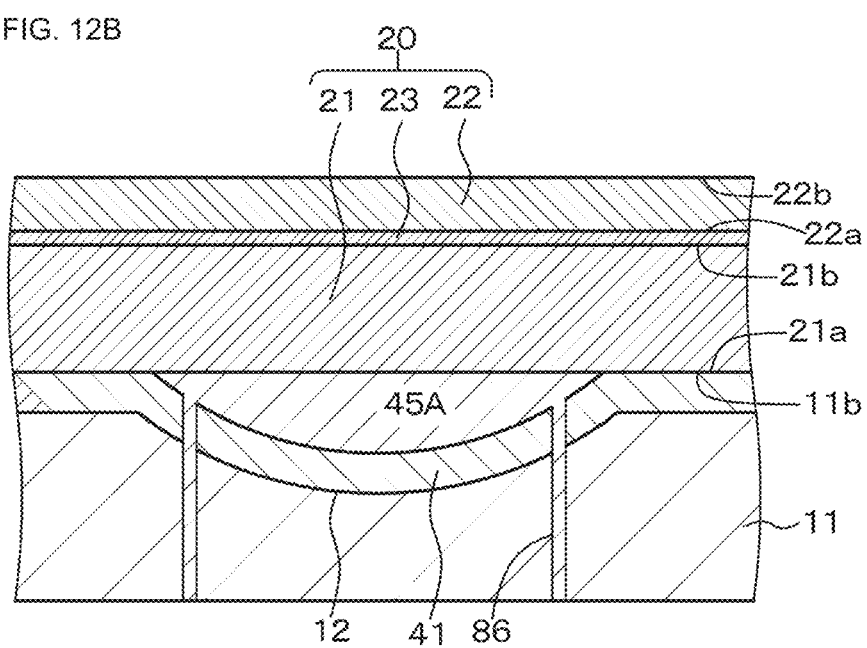

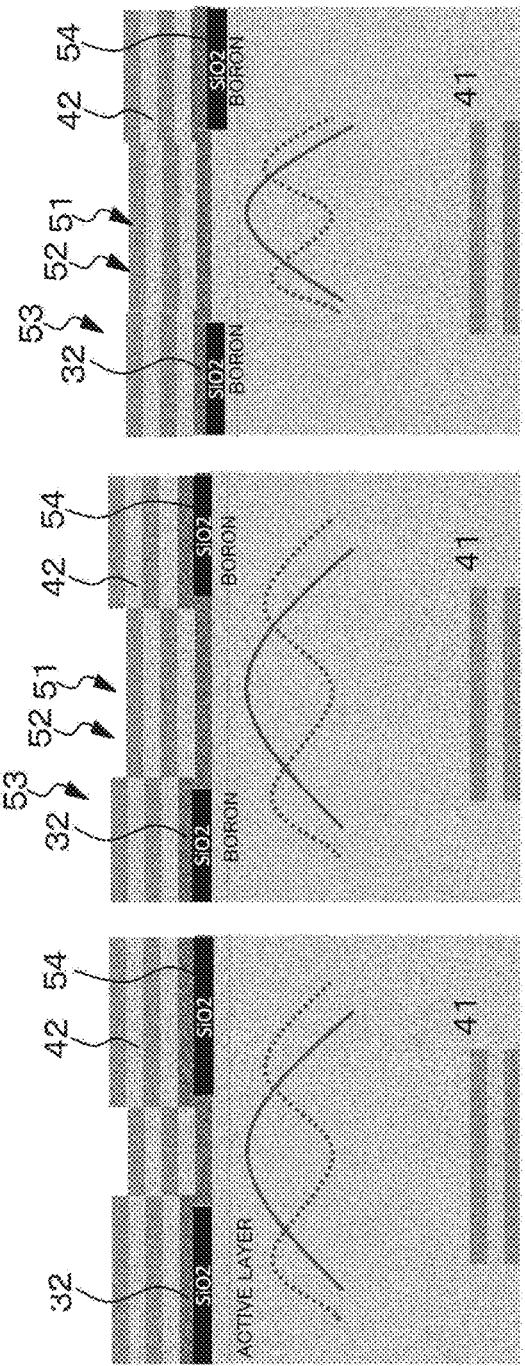

[FIRST LIGHT REFLECTING LAYER]

[FIRST LIGHT REFLECTING LAYER]

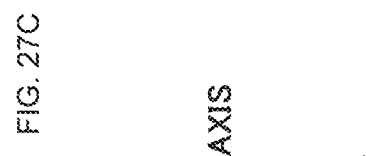
FIG. 27A
FIG. 27B
FIG. 27C
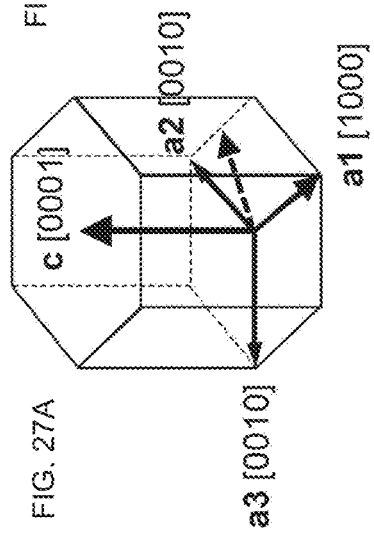
FIG. 27D
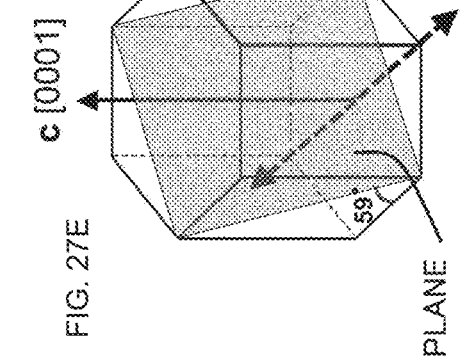
FIG. 27E
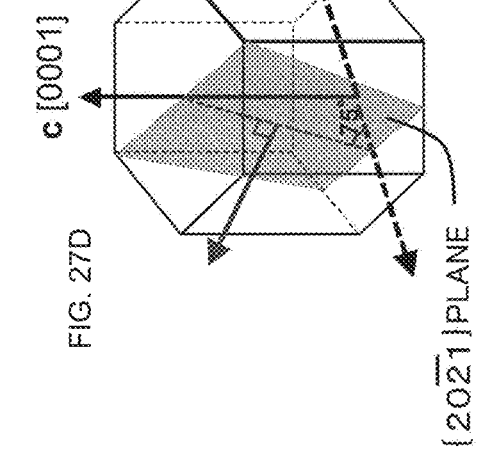

LIGHT EMITTING ELEMENT AND METHOD FOR MANUFACTURING SAME

CROSS REFERENCE TO RELATED APPLICATIONS

This application is a U.S. National Phase of International Patent Application No. PCT/JP2019/035711 filed on Sep. 11, 2019, which claims priority benefit of Japanese Patent Application No. JP 2018-201549 filed in the Japan Patent Office on Oct. 26, 2018. Each of the above-referenced applications is hereby incorporated herein by reference in its entirety.

TECHNICAL FIELD

The present disclosure relates to a light emitting element and a method for manufacturing same.

BACKGROUND ART

In a light emitting element composed of a surface-emitting laser element (VCSEL), laser oscillation generally occurs as a result of causing resonance of laser light between two light reflecting layers (Distributed Bragg Reflector layers, DBR layers). In a surface-emitting laser element having a layered structure in which an n-type compound semiconductor layer, an active layer (light emitting layer) composed of a compound semiconductor, and a p-type compound semiconductor layer are layered, generally, a second electrode composed of a transparent conductive material is formed on the p-type compound semiconductor layer, and a second light reflecting layer composed of a layered structure of insulating materials is formed on the second electrode. In addition, a first light reflecting layer composed of a layered structure of insulating materials is formed between the n-type compound semiconductor layer and a substrate. For convenience, the axis passing through the center of the resonator formed by the two light reflecting layers is referred to as a Z axis, and a virtual plane orthogonal to the Z axis is referred to as an XY plane.

Where the layered structure is composed of a GaAs-based compound semiconductor, a resonator length $L_{OR}$ is about 1 μm. Meanwhile, when the layered structure is configured of a GaN-based compound semiconductor, the resonator length $L_{OR}$ is usually several times or more larger than the wavelength of the laser light emitted from the surface emitting laser element. That is, the resonator length $L_{OR}$ is considerably larger than 1 μm.

Where the resonator length $L_{OR}$ becomes large in this way, the diffraction loss increases, which makes laser oscillation difficult, unlike in the conventional GaAs-based surface-emitting laser element that uses a resonator length $L_{OR}$ of about 1 μm. That is, there is a risk that the element will function as an LED, rather than as a surface-emitting laser element. Here, the "diffraction loss" generally refers to a phenomenon in which the laser light reciprocating in the resonator gradually dissipates to the outside of the resonator because the light tends to spread due to the diffraction effect. Techniques for imparting a function of a concave mirror to the light reflecting layer in order to solve this problem are well known from, for example, JP 2006-114753A, JP 2000-022277A, and WO 2018/0838777A1.

CITATION LIST

Patent Literature

[PTL 1]
JP 2006-114753 A
[PTL 2]
JP 2000-022277 A
[PTL 3]
WO 2018/0838777 A1

SUMMARY

Technical Problem

As described above, by imparting the function of a concave mirror to the light reflecting layer, the occurrence of diffraction loss can be effectively suppressed. However, due to a large resonator length $L_{OR}$, it becomes difficult to obtain a single longitudinal mode, and the longitudinal mode tends to be in multiple modes.

Therefore, it is an object of the present disclosure to provide a light emitting element having a configuration and a structure which make it possible to obtain a single longitudinal mode and also to provide a method for manufacturing the light emitting element.

Solution to Problem

A light emitting element according to the first mode to fourth mode of the present disclosure for achieving the above object comprises:
a layered structure in which
a first compound semiconductor layer having a first surface and a second surface that is opposite to the first surface,
an active layer facing the second surface of the first compound semiconductor layer, and
a second compound semiconductor layer having a first surface facing the active layer and a second surface that is opposite to the first surface
are layered;
a substrate;
a first light reflecting layer arranged on the first surface side of the first compound semiconductor layer; and
a second light reflecting layer arranged on the second surface side of the second compound semiconductor layer, wherein
the second light reflecting layer has a flat shape,
a concave surface portion is formed on a substrate surface,
the first light reflecting layer is formed on at least the concave surface portion, and
the first compound semiconductor layer is formed to extend from the substrate surface onto the concave surface portion.

In the light emitting element according to the first mode of the present disclosure, there is a cavity between the first light reflecting layer formed on the concave surface portion and the first compound semiconductor layer. Further, in the light emitting element according to the second mode of the present disclosure, a material different from a material constituting the first compound semiconductor layer is filled between the first light reflecting layer formed on the concave surface portion and the first compound semiconductor layer. Furthermore, in the light emitting element according to the third mode of the present disclosure, a material having a refractive index $n_2$ is filled between the first light reflecting layer formed on the concave surface portion and the first compound semiconductor layer, and assuming that the refractive index of the material constituting the first compound semiconductor layer is $n_1$, $n_1 \neq n_2$ is satisfied. Further, in the light emitting element according to the fourth mode of the present disclosure, a resonator structure is configured of the first light reflecting layer formed on the concave surface portion and a portion of the first compound semiconductor layer above the concave surface portion. The length of the resonator structure is such that the main light emitted from the active layer and having an oscillation wavelength $\lambda_0$ satisfies a resonance condition of the resonator structure, and the light having a wavelength $\lambda'$ adjacent to the oscillation wavelength $\lambda_0$ does not satisfy the resonance condition of the resonator structure.

A method for manufacturing a light emitting element of the present disclosure for achieving the above object comprises the steps of:
   forming a concave surface portion on a surface of a substrate, then
   forming a first light reflecting layer on at least the concave surface portion, next
   forming a layered structure, in which a first compound semiconductor layer, an active layer, and a second compound semiconductor layer are layered, on the substrate surface and above the concave surface portion, and then
   forming a second light reflecting layer on the second compound semiconductor layer.

BRIEF DESCRIPTION OF DRAWINGS

FIGS. 5A and 5B are schematic partial end views of a substrate and the like for explaining a method for manufacturing the light emitting element of Embodiment 1.

FIGS. 7A and 7B are schematic partial end views of a substrate and the like for explaining a method for manufacturing the light emitting element of Embodiment 1, following FIG. 6B.

FIGS. 8A and 8B are schematic partial end views of a substrate and the like for explaining a method for manufacturing the light emitting element of Embodiment 1, following FIG. 7B.

FIGS. 10A and 10B are schematic partial end views of a substrate and the like for explaining a method for manufacturing the light emitting element of Embodiment 2.

FIGS. 11A and 11B are schematic partial end views of a substrate and the like for explaining a modification example of the method for manufacturing the light emitting element of Embodiment 2.

FIGS. 12A and 12B are schematic partial end views of a substrate and the like for explaining another modification example of the method for manufacturing the light emitting element of Embodiment 2.

In FIGS. 15A, 15B, and 15C are conceptual diagrams showing the light field intensities of the conventional light emitting element, the light emitting element of Embodiment 4, and a light emitting element of Embodiment 7, respectively.

FIGS. 27A, 27B, 27C, 27D, and 27E are schematic views showing the crystal structure of a hexagonal nitride semiconductor for explaining a polar plane, a non-polar plane, and a semi-polar plane in a nitride semiconductor crystal.

DESCRIPTION OF EMBODIMENTS

Figure 1:
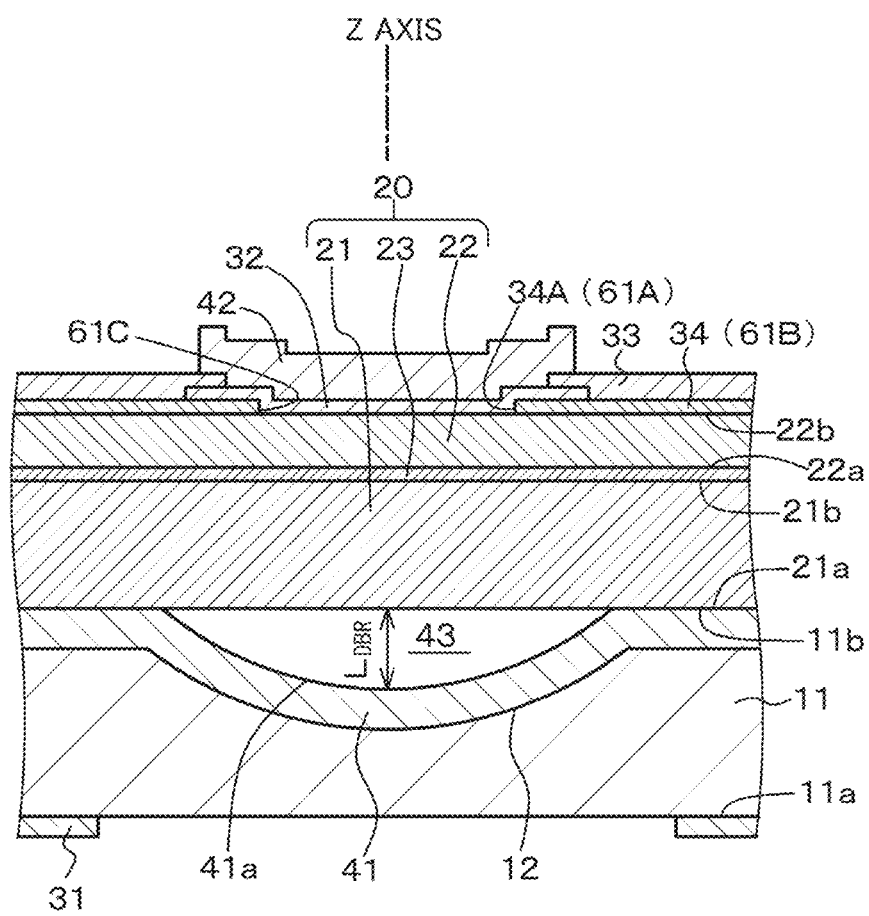
FIG. 1 is a schematic partial end view of a light emitting element of Embodiment 1.

Hereinafter, the present disclosure will be described based on embodiments with reference to the drawings, but the present disclosure is not limited to the embodiments, and various numerical values and materials in the embodiments are merely illustrative. The description will be given in the following order.
   1. General Description of Light Emitting Elements According to First Mode to Fourth Mode of Present Disclosure and Method for Manufacturing Light Emitting Element of Present Disclosure.
   2. Embodiment 1 (light emitting elements of the first mode to the fourth mode of the present disclosure, and a method for manufacturing same)
   3. Embodiment 2 (light emitting elements of the second mode and the third mode of the present disclosure, and a method for manufacturing same)

4. Embodiment 3 (modifications of Embodiment 1 and Embodiment 2, light emitting element having the first configuration)
5. Embodiment 4 (modifications of Embodiment 1 to Embodiment 3, light emitting elements having the second-A configuration)
6. Embodiment 5 (modification of Embodiment 4, light emitting element having the second-B configuration)
7. Embodiment 6 (modifications of Embodiment 4 and Embodiment 5, light emitting elements having a second-C configuration)
8. Embodiment 7 (modifications of Embodiment 4 to Embodiment 6, light emitting elements having a second-D configuration)
9. Embodiment 8 (modifications of Embodiment 1 and Embodiment 7, light emitting elements having a third configuration)
10. Embodiment 9 (modification of Embodiment 8)
11. Embodiment 10 (another modification of Embodiment 8)
12. Other General Description of Light Emitting Elements According to First Mode to Fourth Mode of Present Disclosure and Method for Manufacturing Light Emitting Element of Present Disclosure A method for manufacturing the light emitting element of the present disclosure can be implemented in a mode in which there is a void between the first light reflecting layer formed on the concave surface portion and the first compound semiconductor layer. Alternatively, a mode is possible that includes a step of filling a material different from the material constituting the first compound semiconductor layer between the first light reflecting layer formed on the concave surface portion and the first compound semiconductor layer. Alternatively, a mode is possible that includes a step of filling a material having a refractive index $n_2$ different from the refractive index $n_1$ of the material constituting the first compound semiconductor layer between the first light reflecting layer formed on the concave surface portion and the first compound semiconductor layer. Alternatively, a mode is possible in which a resonator structure is configured by the first light reflecting layer formed on the concave surface portion and a portion of the first compound semiconductor layer above the concave surface portion, and the length of the resonator structure is such that the main light emitted from the active layer and having an oscillation wavelength $\lambda_0$ satisfies a resonance condition of the resonator structure, and the light having a wavelength $\lambda'$ adjacent to the oscillation wavelength $\lambda_0$ does not satisfy the resonance condition of the resonator structure.

The light emitting element according to the first mode of the present disclosure and the light emitting element according to the first mode of the present disclosure that is obtained by the method for manufacturing the light emitting element of the present disclosure may be hereinafter collectively referred to as "the light emitting element etc. according to the first mode of the present disclosure". Further, the light emitting element according to the second mode of the present disclosure and the light emitting element according to the second mode of the present disclosure that is obtained by the method for manufacturing the light emitting element of the present disclosure may be hereinafter collectively referred to as "the light emitting element etc. according to the second mode of the present disclosure". Furthermore, the light emitting element according to the third mode of the present disclosure and the light emitting element according to the third mode of the present disclosure that is obtained by the method for manufacturing the light emitting element of the present disclosure may be hereinafter collectively referred to as "the light emitting element etc. according to the third mode of the present disclosure". Further, the light emitting element according to the fourth mode of the present disclosure and the light emitting element according to the fourth mode of the present disclosure that is obtained by the method for manufacturing the light emitting element of the present disclosure may be hereinafter collectively referred to as "the light emitting element etc. according to the fourth mode of the present disclosure". Further, the light emitting element etc. according to the first mode of the present disclosure, the light emitting element etc. according to the second mode of the present disclosure, the light emitting element etc. according to the third mode of the present disclosure, and the light emitting element etc. according to the fourth mode of the present disclosure may be hereinafter collectively referred to as "the light emitting element etc. according to the present disclosure".

In the light emitting element etc. according to the third mode of the present disclosure, it is preferable that $$|n_2 - n_1| \geq 1.0,$$

desirably $|n_2 - n_1| \geq 1.5$ is satisfied. Further, in a possible mode of the light emitting element etc. according to the third mode of the present disclosure including these preferable modes, the material having a refractive index $n_2$ is composed of a material different from the material constituting the first compound semiconductor layer.

In a possible mode of the light emitting element etc. of the present disclosure including the preferred modes described above, the substrate is configured of a compound semiconductor substrate.

Further, in a possible mode of the light emitting element etc. of the present disclosure including the preferred modes described above, the layered structure is composed of a GaN-based compound semiconductor.

When the first compound semiconductor layer is formed by lateral growth by using a method of causing epitaxial growth in the lateral direction, such as the ELO (Epitaxial Lateral Overgrowth) method, where the epitaxially grown first compound semiconductor layers meet above the central portion of the concave surface portion from the substrate surface many crystal defects may occur in the meeting portion. Where the meeting portion where many crystal defects are present is located in the central portion of an element region (described hereinbelow), the characteristics of the light emitting element may be adversely affected. In a possible mode of the light emitting element etc. of the present disclosure including the preferred modes described above, a meeting portion in which many crystal defects are present is not present on the normal line passing through the center of the concave surface portion, and in this case, a mode is possible in which the orthogonal projection image of the meeting portion on the substrate is not included in the concave surface portion. By adopting such a mode, it is possible to suppress reliably the occurrence of an adverse effect on the characteristics of the light emitting element.

In the light emitting element etc. according to the first mode of the present disclosure, air is confined in the cavity, or an inactive gas (nitrogen gas or the like) is confined in the cavity, or a process gas at the time of forming the first compound semiconductor layer is confined in the cavity, or the cavity is in a vacuum state or a reduced pressure state.

In the preferred mode of the light emitting element etc. according to the second mode of the present disclosure or the light emitting element etc. according to the third mode of the present disclosure, a material (hereinafter, may be referred to as a "filling material" for convenience) different from the material constituting the first compound semiconductor layer is filled between the first light reflecting layer formed on the concave surface portion and the first compound semiconductor layer. The filling material can be specifically exemplified by transparent dielectric materials such as $TiO_x$, $TaO_x$, SiN, AlN, $HfO_x$, $NbO_x$, $AlO_x$, $BiO_x$, and $SiO_2$ including SOG (Spin On Glass), silicone-based resins, and epoxy-based resins, and can also be exemplified by BCB-based resins, polyimide-based resins, fluorine-based resins, novolak-based resins, and compound semiconductor materials different from the compound semiconductor material constituting the first compound semiconductor layer and the second compound semiconductor layer.

In the light emitting element etc. according to the third mode of the present disclosure, $n_1 \neq n_2$ is satisfied, but $n_1 > n_2$ or $n_1 < n_2$ may be satisfied.

With the light emitting element etc. of the present disclosure including various preferred modes and configurations described above, a surface emitting laser element (vertical cavity laser, VCSEL) that emits laser light through the first light reflecting layer can be configured, or a surface emitting laser element that emits laser light through the second light reflecting layer can also be configured.

In the light emitting element etc. of the present disclosure including various preferred modes described above, the figure drawn by the surface (hereinbelow, referred to as "the inner surface of the first light reflecting layer") of a portion of the first light reflecting layer that is in contact with the concave mirror portion when the first light reflecting layer is cut in a virtual plane (virtual plane including the Z axis) including the layering direction of the layered structure, this surface being opposite to the first compound semiconductor layer, can be in the form of a part of a circle or a part of a parabola. The figure may not be strictly a part of a circle, or the figure may not be strictly a part of a parabola. That is, "a figure is a part of a circle or a part of a parabola" is inclusive of the case where the figure is generally a part of a circle or generally a part of a parabola. A portion (region) of the first light reflecting layer that is such a part of a circle or a part of a parabola may be referred to as an "effective region of the first light reflecting layer". The figure drawn by the inner surface of the first light reflecting layer can be obtained by measuring the shape of the interface with a measuring instrument and analyzing the obtained data on the basis of a least squares method.

In the light emitting element etc. of the present disclosure, the layered structure can have a configuration composed of a GaN-based compound semiconductor material. Here, the GaN-based compound semiconductor can be more specifically exemplified by GaN, AlGaN, InGaN, and AlInGaN. Further, these compound semiconductors may include, if desired, a boron (B) atom, a thallium (Tl) atom, an arsenic (As) atom, a phosphorus (P) atom, and an antimony (Sb) atom. The active layer preferably has a quantum well structure. Specifically, it may have a single quantum well structure (SQW structure) or a multiple quantum well structure (MQW structure). The active layer having a quantum well structure has a structure in which at least one well layer and at least one barrier layer are layered, and a combination of (a compound semiconductor constituting the well layer and a compound semiconductor constituting the barrier layer) can be exemplified by $(In_yGa_{(1-y)}N, GaN)$, $(In_yGa_{(1-y)}N, InzGa_{(1-z)}N)$ [where $y>z$], and $(In_yGa_{(1-y)}N, AlGaN)$. The first compound semiconductor layer can be configured of a first conductive type (for example, n type) compound semiconductor, and the second compound semiconductor layer can be configured of a second conductive type (for example, p type), which is different from the first conductive type, compound semiconductor. The first compound semiconductor layer and the second compound semiconductor layer are also referred to as a first clad layer and a second clad layer. It is preferable that a current constriction structure be formed between the second electrode and the second compound semiconductor layer. The first compound semiconductor layer and the second compound semiconductor layer may be layers having a single-layer structure, layers having a multilayer structure, or layers having a superlattice structure. Further, the layer may be provided with a composition gradient layer and a concentration gradient layer.

Further, in the light emitting element etc. of the present disclosure including the preferred modes and configurations described above, it is preferable that there is no variation in the refractive index of 10% or more (the refractive index is not different by 10% or more from the average refractive index of the layered structure as a reference) in the materials constituting the various compound semiconductor layers located between the active layer and the first light reflecting layer, whereby generation of disturbance of the light field in the resonator can be suppressed.

In order to obtain a current constriction structure, a current constriction layer composed of an insulating material (for example, $SiO_x$, $SiN_x$, or $AlO_x$) may be formed between the second electrode and the second compound semiconductor layer, or a mesa structure may be formed by etching the second compound semiconductor layer by an RIE method and the like, or a layer which is a part of the layered second compound semiconductor layer may be partially oxidized from the lateral direction to form a current constriction region, or an impurity may be ion-injected into the second compound semiconductor layer to form a region having reduced conductivity, or these methods may be combined as appropriate. However, the second electrode needs to be electrically connected to the portion of the second compound semiconductor layer through which the current flows due to the current constriction.

The layered structure and the first light reflecting layer are formed on the surface of the substrate (for convenience, referred to as "the second surface of the substrate"). As the substrate, a conductive substrate, a semiconductor substrate, an insulating substrate, specifically, a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAL_2O_4$ substrate, an InP substrate, Si substrate, and these substrates provided with an underlayer or a buffer layer formed on the surface (main surface) of the substrate can be used, and it is preferable to use a GaN substrate because the defect density is low. It is known that polarity/non-polarity/semi-polarity and characteristics of a GaN substrate change depending on the growth surface, but any main surface (second surface) of the GaN substrate can be used for forming a compound semiconductor layer. Further, regarding the main surface of the GaN substrate, depending on a crystal structure (for example, a cubic type, a hexagonal type, or the like), crystal orientation planes such as so-called A plane, B plane, C plane, R plane, M plane, N plane, S plane, and the like, planes obtained by making these planes offset in a specific direction, and the like can also be used. Alternatively, a configuration may be also used in which the substrate is composed of a GaN substrate having a {20-21} plane, which is a semi-polar plane, as the main surface (a GaN substrate where a plane obtained by inclining the c-plane by about 75 degrees in the m-axis direction is the main surface).

A method for forming various compound semiconductor layers constituting the light emitting element can be exemplified by, but is not limited to, metalorganic vapor phase deposition methods (MOCVD method, Metal Organic-Chemical Vapor Deposition method, MOVPE method, Metal Organic-Vapor Phase Epitaxy method), molecular beam epitaxy method (MBE method), hydride vapor deposition method (HVPE method) in which a halogen contributes to transport or reaction, atomic layer deposition method (ALD method, Atomic Layer Deposition method), migration enhanced epitaxy methods (MEE method, Migration-Enhanced Epitaxy method), plasma assisted physical vapor phase deposition method (PPD method), and the like. Here, when the layered structure is configured of a GaN-based compound semiconductor, an organic gallium source gas in the MOCVD method can be exemplified by trimethylgallium (TMG) gas and triethylgallium (TEG) gas, and a nitrogen source gas can be exemplified by ammonia gas and hydrazine gas. In the formation of a GaN-based compound semiconductor layer having an n-type conductivity, for example, silicon (Si) may be added as an n-type impurity (n-type dopant), and in the formation of a GaN-based compound semiconductor layer having a p-type conductivity, for example, magnesium (Mg) may be added as a p-type impurity (p-type dopant). When aluminum (Al) or indium (In) is included as a constituent atom of the GaN-based compound semiconductor layer, trimethylaluminum (TMA) gas may be used as an Al source, or trimethylindium (TMI) gas may be used as an In source. Further, monosilane gas ($SiH_4$ gas) may be used as a Si source, and biscyclopentadienylmagnesium gas, methylcyclopentadienylmagnesium, and biscyclopentadienylmagnesium ($Cp_2Mg$) may be used as a Mg source. Ge, Se, Sn, C, Te, S, O, Pd, and Po can be mentioned, in addition to Si, as n-type impurities (n-type dopants), and Zn, Cd, Be, Ca, Ba, C, Hg, and Sr can be mentioned, in addition to Mg, as p-type impurities (p-type dopants).

The substrate thickness may be reduced by a wet etching method using an alkaline aqueous solution such as sodium hydroxide aqueous solution or potassium hydroxide aqueous solution, ammonia solution+hydrogen peroxide solution, sulfuric acid solution+hydrogen peroxide solution, hydrochloric acid solution+hydrogen peroxide solution, phosphoric acid solution+hydrogen peroxide solution, or the like, a chemical/mechanical polishing method (CMP method), a mechanical polishing method, a dry etching method, a lift-off method using a laser, and the like, or by a combination thereof.

As described above, a configuration is possible in which the layered structure is formed on the polar surface of the GaN substrate. Alternatively, a configuration is possible in which the layered structure is formed on a main surface composed of a semi-polar surface or a non-polar surface (non-polar surface) of the GaN substrate. In this case, a configuration is possible in which an angle between the plane orientation of the main surface and the c-axis is 45 degrees or more and 80 degrees or less. Furthermore, a configuration is possible in which the main surface of the GaN substrate is composed of a {20-21} plane. For convenience, the notation {$hk\bar{i}l$} plane {$h\bar{k}il$} plane of crystal planes exemplified below in, for example, the hexagonal system is referred to as {hk-il} plane and {h-kil} plane in the present description.

The polar plane, non-polar plane, and semi-polar plane in a nitride semiconductor crystal will be described below with reference to FIGS. 27A, 27B, 27C, 27D, and 27E. In FIG. 27A, A is a schematic view showing the crystal structure of a hexagonal nitride semiconductor. FIG. 27B is a schematic view showing an m-plane and a {1-100} plane, which are non-polar planes, and the m-plane shown by the gray plane is a plane perpendicular to an m-axis direction. FIG. 27C, (e) is a schematic view showing an a-plane and a {11-20} plane, which are non-polar planes, and the a-plane shown by the gray plane is a plane perpendicular to an a-axis direction. FIG. 27D, (d) is a schematic view showing a {20-21} plane which is a semi-polar plane. The [20-21] direction perpendicular to the {20-21} plane shown by the gray plane is inclined by 75 degrees from the c-axis to the m-axis direction. FIG. 27E is a schematic view showing a {11-22} plane which is a semi-polar plane. A [11-22] direction perpendicular to the {11-22} plane shown by the gray plane is inclined by 59 degrees from the c-axis to the a-axis direction. Table 1 below shows the angles formed by the plane orientations of various crystal planes and the c-axis. Planes represented by {11-2n} planes such as {11-21} plane, {11-22} plane, and {11-24} plane, {1-101} plane, {1-102} plane, and {1-103} plane are semi-polar planes.

TABLE 1

| Plane orientation | Angle with c-axis (degrees) |
| --- | --- |
| {1-100} | 90.0 |
| {11-20} | 90.0 |
| {20-21} | 75.1 |
| {11-21} | 72.9 |
| {1-101} | 62.0 |
| {11-22} | 58.4 |
| {1-102} | 43.2 |
| {1-103} | 32.0 |

It is also possible to form a surface emitting laser element in which the second light reflecting layer is supported by a support substrate and laser light is emitted through the first light reflecting layer. The support substrate may be configured of, for example, various substrates exemplified by the above-mentioned substrates, or may be configured of an insulating substrate composed of AlN and the like, a semiconductor substrate composed of Si, SiC, Ge and the like, a metal substrate, or an alloy substrate, but it is preferable to use a conductive substrate, and from the viewpoints of mechanical properties, elastic deformation, plastic deformability, heat dissipation, and the like, it is preferable to use a metal substrate or an alloy substrate. As the thickness of the support substrate, for example, 0.05 mm to 1 mm can be exemplified. As a method for fixing the second light reflecting layer to the supporting substrate, a known method such as a solder bonding method, a room temperature bonding method, a bonding method using a pressure-sensitive adhesive tape, a bonding method using wax bonding, and a method using an adhesive can be used. However, from the viewpoint of ensuring conductivity, it is desirable to use the solder bonding method or the room temperature bonding method. For example, where a silicon semiconductor substrate, which is a conductive substrate, is used as the support substrate, it is desirable to use a method capable of bonding at a low temperature of 400° C. or lower in order to suppress warpage due to a difference in thermal expansion coefficient. Where a GaN substrate is used as the support substrate, a bonding temperature may be 400° C. or higher.

The first compound semiconductor layer is electrically connected to the first electrode. That is, the first electrode is electrically connected to the first compound semiconductor layer through the substrate. Further, the second compound semiconductor layer is electrically connected to the second electrode, and the second light reflecting layer is formed on the second electrode. In a possible mode, the first electrode is composed of a metal or an alloy, and in a possible mode, the second electrode is composed of a transparent conductive material. By configuring the second electrode of a transparent conductive material, the current can be spread in the lateral direction (in-plane direction of the second compound semiconductor layer), and the current can be efficiently supplied to the element region. The second electrode is formed on the second surface of the second compound semiconductor layer. Here, the "element region" refers to a region in which a constricted current is injected, a region in which light is confined due to a difference in refractive index or the like, a region in which laser oscillation occurs in a region sandwiched between the first light reflecting layer and the second light reflecting layer, or a region that actually contributes to laser oscillation in a region sandwiched between the first light reflecting layer and the second light reflecting layer.

The first electrode may be formed on the first surface of the substrate that is opposite to the second surface of the substrate. The first electrode desirably has a single-layer configuration or a multilayer configuration including at least one kind of metal (inclusive of alloy) selected from the group consisting of, for example, gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn) and indium (In), and can be specifically exemplified by Ti/Au, Ti/Al, Ti/Al/Au, Ti/Pt/Au, Ni/Au, Ni/Au/Pt, Ni/Pt, Pd/Pt and Ag/Pd. The layer before the "/" in the multilayer configuration is located closer to the active layer. The same applies to the following description. The first electrode can be formed by a PVD method such as a vacuum vapor deposition method or a sputtering method.

The second electrode can be configured of a transparent conductive material. Examples of the transparent conductive material constituting the second electrode include an indium-based transparent conductive material [specifically, for example, indium-tin oxide (including ITO, Indium Tin Oxide, Sn-doped $In_2O_3$, crystalline ITO and amorphous ITO), indium-zinc oxide (IZO, Indium Zinc Oxide), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO], tin-based transparent conductive material [specifically, for example, tin oxide ($SnO_2$), ATO (Sb-doped $SnO_2$), FTO (F-doped $SnO_2$)], zinc-based transparent conductive material [specifically, for example, zinc oxide (including ZnO, Al-doped ZnO (AZO) and B-doped ZnO), gallium-doped zinc oxide (GZO), AlMgZnO (aluminum oxide- and magnesium oxide-doped zinc oxide)], and NiO. Alternatively, as the second electrode, a transparent conductive film having gallium oxide, titanium oxide, niobium oxide, antimony oxide, nickel oxide and the like as a base layer can be mentioned, and transparent conductive materials such as a spinel-type oxide and an oxide having an $YbFe_2O_4$ structure can be mentioned. However, the material constituting the second electrode depends on the arrangement state of the second light reflecting layer and the second electrode, but is not limited to the transparent conductive material, and a metal such as palladium (Pd), platinum (Pt), nickel (Ni), gold (Au), cobalt (Co), and rhodium (Rh) can also be used. The second electrode may be configured of at least one of these materials. The second electrode can be formed by, for example, a PVD method such as a vacuum vapor deposition method or a sputtering method. Alternatively, a low-resistance semiconductor layer can be used as the transparent electrode layer, and in this case, specifically, an n-type GaN-based compound semiconductor layer can also be used. Furthermore, when the layer adjacent to the n-type GaN-based compound semiconductor layer is of a p-type, the electrical resistance at the interface can be reduced by joining the two layers via a tunnel junction. By configuring the second electrode of a transparent conductive material, the current can be spread in the lateral direction (in-plane direction of the second compound semiconductor layer), and the current can be efficiently supplied to the current injection region (described hereinbelow).

A pad electrode may be provided on the first electrode or the second electrode for electrical connection to an external electrode or circuit. The pad electrode desirably has a single-layer configuration or a multilayer configuration including at least one kind of metal selected from the group consisting of Ti (titanium), aluminum (Al), Pt (platinum), Au (gold), Ni (nickel), and Pd (palladium). Alternatively, the pad electrode may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. Where the first electrode includes an Ag layer or an Ag/Pd layer, a cover metal layer composed of, for example, Ni/TiW/Pd/TiW/Ni is preferably formed on a surface of the first electrode, and a pad electrode composed of, for example, a multilayer configuration of Ti/Ni/Au or a multilayer configuration of Ti/Ni/Au/Cr/Au is preferably formed on the cover metal layer.

The light reflecting layers (Distributed Bragg Reflector layers, DBR layers) constituting the first light reflecting layer and the second light reflecting layer are configured of, for example, a semiconductor multilayer film (for example, AlInGaN film) or a dielectric multilayer film. The dielectric material can be exemplified by oxides and nitrides (for example, $SiN_X$, $AlN_X$, $AlGaN_X$, $GaN_X$, $BN_X$, etc.), or fluorides and the like of Si, Mg, Al, Hf, Nb, Zr, Sc, Ta, Ga, Zn, Y, B, Ti, and the like. Specific examples include $SiO_X$, $TiO_X$, $NbO_X$, $ZrO_X$, $TaO_X$, $ZnO_X$, $AlO_X$, $HfO_X$, $SiN_X$, $AlN_X$, and the like. A light reflecting layer can be obtained by alternately laminating two or more types of dielectric films composed of dielectric materials having different refractive indexes among these dielectric materials. For example, multilayer films such as $SiO_X/SiN_Y$, $SiO_X/TaO_X$, $SiO_X/NbO_Y$, $SiO_X/ZrO_Y$, and $SiO_X/AlN_Y$ are preferable. In order to obtain a desired light reflectance, the material, film thickness, number of layers, and the like constituting each dielectric film may be selected as appropriate. The thickness of each dielectric film can be adjusted, as appropriate, depending on the material used and the like, and is determined by the oscillation wavelength (emission wavelength) $\lambda_0$ and the refractive index n' at the oscillation wavelength $\lambda_0$ of the material used. Specifically, it is preferable to set an odd multiple of $\lambda_0/(4n')$ or a value close to the odd multiple. For example, in a light emitting element having an oscillation wavelength $\lambda_0$ of 410 nm, when the light reflecting layer is composed of $SiO_X/NbO_Y$, the thickness can be exemplified by about 40 nm to 70 nm. The number of layers can be exemplified by 2 or more, preferably about 5 to 20. The thickness of the entire light reflecting layer is, for example, about 0.6 µm to 1.7 µm. Further, it is desirable that the light reflectance of the light reflecting layer be 95% or more.

The light reflecting layer can be formed based on a well-known method, specifically, for example, a PVD method such as a vacuum deposition method, a sputtering method, a reactive sputtering method, an ECR plasma sputtering method, a magnetron sputtering method, an ion beam assist vapor deposition method, an ion plating method, and a laser ablation method; various CVD methods; coating methods such as a spray method, a spin coating method, and a clip method; methods that combine two or more of these methods; methods that combine these methods with one or more of total or partial pretreatment, inert gas (Ar, He, Xe, etc.) or plasma irradiation, oxygen gas, ozone gas, or plasma irradiation, oxidation treatment (heat treatment), or exposure treatment.

The size and shape of the light reflecting layer are not particularly limited as long as the current injection region or the element region is covered. Specific examples of the shape of the element region, first light reflecting layer, second light reflecting layer, boundary between the current injection region and the current non-injection inner region, the shape of the boundary between the current non-injection inner region and the current non-injection outer region, and the planar shape of the opening provided in the element region and the current constriction region include a circle, an ellipse, a rectangle, and a polygon (triangle, quadrangle, hexagon, and the like). Further, the planar shape of the first electrode may be an annular shape. It is desirable that the planar shapes of the element region, first light reflecting layer, second light reflecting layer, and the opening provided in the current constriction layer the planar shape of the inner ring of the annular first electrode, the shape of the boundary between the current injection region and the current non-injection inner region, and the shape of the boundary between the current non-injection inner region and the current non-injection outer region be similar to each other. Where the shape of the boundary between the current injection region and the current non-injection inner region is circular, the diameter is preferably about 5 µm to 100 µm. The current injection region, current non-injection inner region, and current non-injection outer region will be described hereinbelow.

The side surface or the exposed surface of the layered structure may be covered with a coating layer (insulating film). The coating layer (insulating film) can be formed based on a well-known method. The refractive index of the material constituting the coating layer (insulating film) is preferably smaller than the refractive index of the material constituting the layered structure. The insulating material constituting the coating layer (insulating film) can be exemplified by $SiO_X$-based materials including $SiO_2$, $SiN_X$-based materials, $SiO_YN_Z$-based materials, $TaO_X$, $ZrO_X$, $AlN_X$, $AlO_X$, and $GaO_X$, or can be exemplified by organic materials such as polyimide resins. Examples of the method for forming the coating layer (insulating film) include a PVD method such as a vacuum deposition method and a sputtering method, or a CVD method, and the coating layer (insulating film) can also be formed based on a coating method.

In the light emitting elements and the like of the present disclosure including the various preferable modes described above, assuming that the resonator length is $L_{OR}$, $$L_{OR} \geq 1 \times 10^{-6} \, m$$

is preferably satisfied.

Embodiment 1

Figure 2:
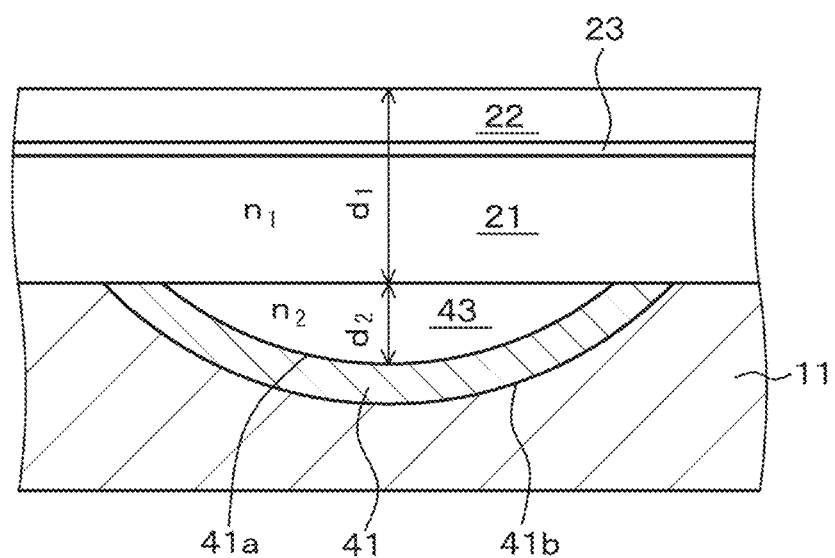
FIG. 2 is a schematic partial end view of a layered structure, a concave surface portion, and the like in the light emitting element of Embodiment 1.

Embodiment 1 relates to a light emitting element and a method for manufacturing the same according to the first mode and the fourth mode of the present disclosure. More specifically, the light emitting element of Embodiment 1 or Embodiment 2 to Embodiment 10 described hereinbelow is composed of a surface emitting laser element (vertical cavity laser, VCSEL) that emits laser light from the top surface of the second compound semiconductor layer via the second light reflecting layer. A schematic partial end view of the light emitting element of Embodiment 1 is shown in FIG. 1. Further, a schematic partial end view of the layered structure, concave surface portion, and the like is shown in FIG. 2. In FIG. 2, the hatching line is omitted.

The light emitting element of Embodiment 1 or the light emitting elements of Embodiment 2 to Embodiment 10 described hereinbelow includes
a layered structure 20 in which
a first compound semiconductor layer 21 having a first surface 21a and a second surface 21b that is opposite to the first surface 21a, an active layer (light emitting layer) 23 facing the second surface 21b of the first compound semiconductor layer 21, and
a second compound semiconductor layer 22 having a first surface 22a facing the active layer 23 and a second surface 22b that is opposite to the first surface 22a are layered;
a substrate 11;
a first light reflecting layer 41 provided on the first surface 21a side of the first compound semiconductor layer 21; and
a second light reflecting layer 42 provided on the second surface 22b side of the second compound semiconductor layer 22, wherein
the second light reflecting layer 42 has a flat shape,
a concave surface portion 12 is formed on the surface of the substrate 11,
the first light reflecting layer 41 is formed on at least the concave surface portion 12 (specifically, in the embodiments, the first light reflecting layer 41 is formed to extend from above the concave surface portion 12 onto a part of the second surface 11b of the substrate 11), and
the first compound semiconductor layer 21 is formed to extend from the surface of the substrate 11 onto the concave surface portion 12.

In the light emitting element of Embodiment 1, there is a cavity 43 between the first light reflecting layer 41 formed on the concave surface portion 12 and the first compound semiconductor layer. Specifically, air is trapped in the cavity 43, or an inert gas (nitrogen gas, etc.) is trapped, or the process gas at the time of forming the first compound semiconductor layer is trapped therein. Alternatively, the resonator structure is configured of the first light reflecting layer 41 formed on the concave surface portion 12 and a portion of the first compound semiconductor layer 21 (specifically, the first surface 21a of the first compound semiconductor layer 21) above the concave surface portion 12, and the length $L_{DBR}$, of the resonator structure is such that main light having an oscillation wavelength $\lambda_0$ and emitted from the active layer 23 satisfies the resonance condition of the resonator structure and the light having a wavelength $\lambda'$ adjacent to the oscillation wavelength $\lambda_0$ does not satisfy the resonance condition of the resonator structure.

The substrate 11 is configured of a compound semiconductor substrate, specifically, a GaN substrate having a C plane, which is a polar plane, and a {0001} plane as main surfaces. The layered structure 20 is composed of a GaN-based compound semiconductor. The first compound semiconductor layer 21 has a first conductivity type (specifically, n type), and the second compound semiconductor layer 22 has a second conductivity type (specifically, p type) different from the first conductivity type. The surface of the substrate 11 in contact with the first light reflecting layer 41 is the second surface 11 of the substrate 11. The surface of the substrate 11 that is opposite to the second surface 11b is referred to as the first surface 11a of the substrate 11.

The resonator is configured of the region of the first light reflecting layer 41 from an inner surface 41a of the first light reflecting layer 41 to a certain depth, the cavity 43, the layered structure 20 (first compound semiconductor layer 21, active layer 23, and second compound semiconductor layer 22), the second electrode 32, and the region of the second light reflecting layer 42 from the second surface 22b of the second compound semiconductor layer 22 to a certain depth. Here, assuming that the resonator length is $L_{OR}$, $$L_{OR} \geq 1 \times 10^{-6} \text{ m } (1 \text{ μm})$$

is satisfied.

In the light emitting element of Embodiment 1, the figure drawn by the inner surface 41a (effective region 44 of the first light reflecting layer 41) of the first light reflecting layer 41 in contact with the concave surface portion 12 when the first light reflecting layer 41 is cut in the virtual plane (virtual plane including the Z axis) including the layering direction of the layered structure 20 is a part of a circle or a part of a parabola. However, the shape (figure of the cross-sectional shape) of the first light reflecting layer 41 located outside the effective region 44 does not have to be a part of a circle or a part of a parabola. The first light reflecting layer 41 extends onto a part of the second surface 11b of the substrate 11, and the shape of this part (figure of the cross-sectional shape) is flat. The first light reflecting layer 41 and the second light reflecting layer 42 are configured of a multilayer light reflecting film. The planar shape of the outer edge of the concave surface portion 12 is circular. Further, the planar shape of the outer edge portion of the first light reflecting layer 41 left on the second surface 11b of the substrate 11 is a regular hexagon.

Further, assuming that the radius of the effective region 44 of the first light reflecting layer 41 is r'DBR and the radius of curvature is $R_{DBR}$, $$R_{DBR} \leq 1 \times 10^{-3} \text{ m}$$

is satisfied. Specifically, but not limited to, $$L_{OR} = 50 \text{ μm}$$

$$R_{DBR} = 70 \text{ μm}$$

$$r'_{DBR} = 25 \text{ μm}$$

can be exemplified. Further, the oscillation wavelength $\lambda_0$ of the main light emitted from the active layer 23 can be exemplified by $$\lambda_0 = 445 \text{ nm}.$$

Here, assuming that the distance from the active layer 23 to the inner surface 41a of the first light reflecting layer 41 is $T_0$, the ideal parabolic function x=f(z) can be represented by $$x = z^2/t_0$$

$$L_{DBR} = r'_{DBR}{}^2/2T_0,$$

but it goes without saying that when the figure drawn by the inner surface 41a is a part of the parabola, the parabola may deviate from such an ideal parabola.

Further, the value of the thermal conductivity of the layered structure 20 is higher than the value of the thermal conductivity of the first light reflecting layer 41. The value of the thermal conductivity of the dielectric material constituting the first light reflecting layer 41 is about 10 watts/(m·K) or less. Meanwhile, the value of the thermal conductivity of the GaN-based compound semiconductor constituting the layered structure 20 is about 50 watts/(m·K) to about 100 watts/(m·K).

The first compound semiconductor layer 21 is composed of an n-GaN layer, the active layer 23 is composed a five-layer multiple quantum well structure in which an $In_{0.04}Ga_{0.96}N$ layer (barrier layer) and an $In_{0.16}Ga_{0.84}N$ layer (well layer) are layered, and the second compound semiconductor layer 22 is composed of a p-GaN layer. The first electrode 31 is formed on the first surface 11a of the compound semiconductor substrate 11. Meanwhile, the second electrode 32 is formed on the second compound semiconductor layer 22, and the second light reflecting layer 42 is formed on the second electrode 32. The second light reflecting layer 42 on the second electrode 32 has a flat shape. The first electrode 31 is composed of Ti/Pt/Au, and the second electrode 32 is composed of a transparent conductive material, specifically ITO. On the edge of the first electrode 31, a pad electrode (not shown) composed of, for example, Ti/Pt/Au or V/Pt/Au and serving for electrically connecting to an external electrode or circuit is formed or connected. On the edge of the second electrode 32, a pad electrode 33 composed of, for example, Pd/Ti/Pt/Au, Ti/Pd/Au or Ti/Ni/Au and serving for electrically connecting to an external electrode or circuit is formed or connected. The first light reflecting layer 41 and the second light reflecting layer 42 are composed of a layered structure of a $Ta_2O_5$ layer and a $SiO_2$ layer (total number of dielectric films layered: 20 layers). Although the first light reflecting layer 41 and the second light reflecting layer 42 have a multi-layer structure in this way, they are represented by one layer for the sake of simplification of the drawings. The planar shape of each of the first electrode 31, the first light reflecting layer 41, the second light reflecting layer 42, and the opening 34A provided in the insulating layer (current constriction layer) 34 is circular. As will be described hereinbelow, the insulating layer 34 having the opening 34A defines the current constriction region (current injection region 61A and current non-injection region 61B), and the opening 34A defines the current injection region 61A.

The parameters in the following description are as follows (see also FIG. 2).

$\lambda_0$: Oscillation wavelength of the main light emitted from the active layer 23

$\lambda'$: Wavelength of the light adjacent to the main light (oscillation wavelength $\lambda_0$)

$R_1$: Light reflectance of the inner surface 41a of the first light reflecting layer 41

$R_2$: Light reflectance of the first surface 21a of the first compound semiconductor layer 21

$d_1$: Thickness of the layered structure 20

$d_2$, $L_{DBR}$: The maximum length between the portion of the first light reflecting layer 41 inside the concave surface portion 12 and the first surface 21a of the first compound semiconductor layer 21, or the maximum length between the inner surface 41a of the first light reflecting layer 41 inside the concave surface portion 12 along the normal line of the active layer 23 passing through the area center of gravity of the active layer 23 and the first surface 21a of the first compound semiconductor layer 21, or the length of the resonator structure configured of the inner surface 41a of the first light reflecting layer 41 inside the concave surface portion 12 and the first surface 21a of the first compound semiconductor layer 21

$n_1$: Equivalent refractive index (average refractive index) of the material constituting the layered structure 20

$n_2$: Refractive index of the material occupying the space between the portion of the first light reflecting layer 41 inside the concave surface portion 12 and the first surface 21a of the first compound semiconductor layer 21 (here, $n_2 \neq n_1$)

$L_{OR}$: Resonator length of the resonator configured of the first light reflecting layer 41 and the second light reflecting layer 42

When the cavity 43 is occupied by air, the refractive index $n_2$ is 1.00.

The resonator length $L_{OR}$ is represented by $L_{OR} = n_1 \times n_1 + n_2 \times n_2 = (\lambda_0/2) \times m$. Further, when $n_1 > n_2$, $n_1 \times n_1 = (\lambda_0/2) \times p$ $n_2 \times n_2 = (\lambda_0/2) \times (q+\frac{1}{2})$. Here, $m$, $p$, and $q$ are positive integers. Meanwhile, when $n_1 < n_2$ $n_1 \times n_1 = (\lambda_0/2) \times (p+\frac{1}{2})$ $n_2 \times n_2 = (\lambda_0/2) \times q$.

Figure 3:
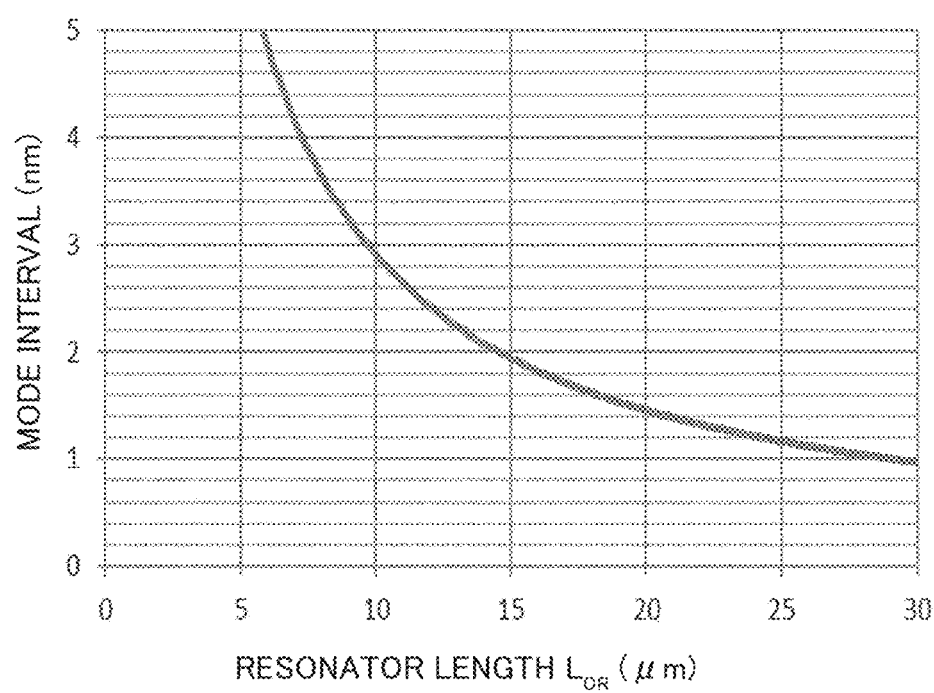
FIG. 3 is a graph showing the result of calculating the mode interval when a plurality of longitudinal modes is generated at $\lambda 0 = 445$ nm in the light emitting element of Embodiment 1.

FIG. 3 shows the result of calculating the mode interval when a plurality of longitudinal modes is generated at $\lambda_0=445$ nm. The horizontal axis in FIG. 3 is the resonator length $L_{OR}$ (unit: μm), and the vertical axis is the mode interval (unit: nm). When the resonator length $L_{OR}$ is 20 μm and $n_1$ is 3.4, the mode interval ($\Delta\lambda = |\lambda_0 - \lambda'|$) is 1.5 nm.

The gain in the surface emitting laser element is about 1%. That is, when the light generated in the active layer 23 reciprocates once in the resonator, the light intensity increases by about 1%. Therefore, where the light transmittance of the light (light in the longitudinal mode) having the wavelength λ' adjacent to the oscillation wavelength $\lambda_0$ is less than 0.99, that is, where a loss exceeding a gain of 1% achieved when the light reciprocates once in the resonator having a wavelength λ' occurs, the oscillation of light having a wavelength of A' does not occur. That is, where the light transmittance is less than 0.99 at λ'=445±1.5 nm, the oscillation of light having the wavelength λ' will not occur.

The light transmittance T of the resonator (Fabry-Perot resonator) configured of the first light reflecting layer 41 and the first compound semiconductor layer 21 is expressed by the following equation (see Advanced Optical Electronics, Series 6 *"Kouha Kougaku* (Light Wave Optics)"), page 97, by Mitsuaki Kokubun, Kyoritsu Shuppan Co., Ltd., Jun. 10, 1999, First edition).

$$T = [1 + [\{(4R)/(1-R)^2\} \times \sin^2(k_0 \cdot n \cdot L_{DBR})]]^{-1} \quad (1)$$

Here, n is a refractive index $R = (R_1 \times R_2)^{1/2}$ $k_0 = 2\pi/\lambda_0$ When the surface emitting laser element is designed with $R_1 = 1.00$ $R_2 = 0.18$ $\lambda_0 = 445$ nm $T = 1.00$, the value of the term of sine in the Formula (1) is 0. Therefore, $k_0 \cdot n \cdot L_{DBR} = \pi \times m'$, where m' is a positive integer.

Further, where k'=2π/λ' when T=0.99, from Formula (1)

$\sin^2(k' \cdot n \cdot L_{DBR}) = 0.044418$.

Therefore, $k' \cdot n \cdot L_{DBR} = \pi \times m' + 0.044432 = (k_0 \cdot n \cdot L_{DBR}) + 0.044432$.

As a result, $(2\pi/\lambda') \cdot n \cdot L_{DBR} = \{(2\pi/\lambda_0) \cdot n \cdot L_{DBR} + 0.044432.$ Where n=1 and $\lambda_0=0.445$ μm and these values are substituted to transform the above formula, the result is $$L_{DBR} = (0.044432/2\pi)(1/\lambda' \cdot 1/0.445) \quad (2)$$

Figure 4:
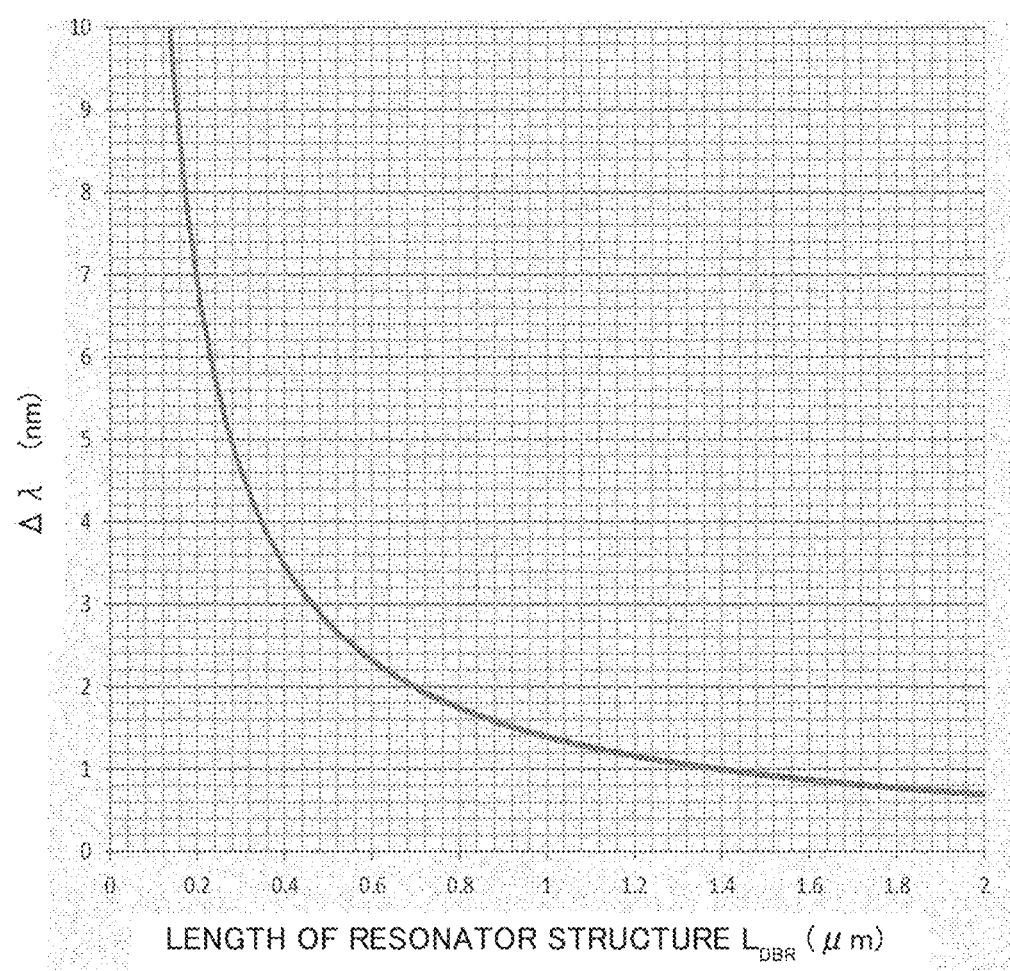
FIG. 4 is a graph showing the relationship between $\lambda'$ and LDBR, which was obtained based on Formula (2) in the light emitting element of Embodiment 1.

Here, where the relationship between λ' and $L_{DBR}$ is obtained and graphed based on the Formula (2), the result is as shown in FIG. 4. The vertical axis of FIG. 4 is Δλ (the difference between λ' and $\lambda_0$, which corresponds to the mode interval; unit: nm), and the horizontal axis is the length $L_{DBR}$ (unit: μm) of the resonator structure. When Δλ=1.5 nm, where the length $L_{DBR}$ of the resonator structure, that is, $d_2$ is about 1 μm, the light having the wavelength λ' does not oscillate. In other words, the length $L_{DBR}$ ($d_2$) of this resonator structure is the length such that the main light having an oscillation wavelength $\lambda_0$ and emitted from the active layer 23 satisfies the resonance condition of the resonator structure, and the light having the wavelength λ' adjacent to the oscillation wavelength $\lambda_0$ does not satisfy the resonance condition of the resonator structure.

Hereinafter, a method for manufacturing the light emitting element of Embodiment 1 will be described with reference to FIGS. 5A, 5B, 6A, 6B, 7A, 7B, 8A, and 8B. FIGS. 5A, 5B, 6A, 6B, 7A, and 7B show two light emitting elements, and FIGS. 8A and 8B show one light emitting element.

[Step-100]

Figure 6A:
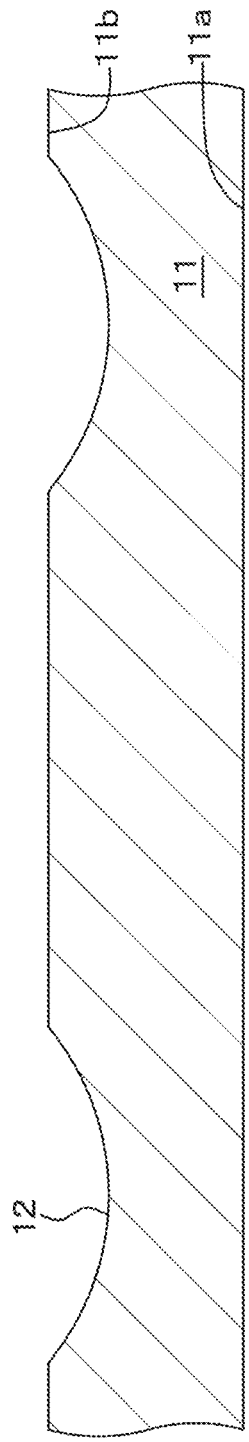
FIGS. 6A and 6B are schematic partial end views of a substrate and the like for explaining a method for manufacturing the light emitting element of Embodiment 1, following FIG. 5B.
Figure 6B:
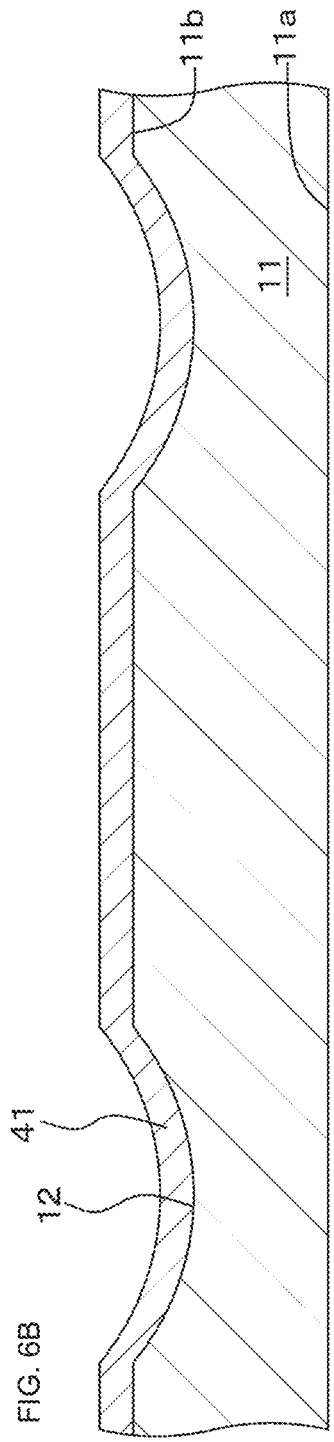

First, the concave surface portion 12 is formed on the surface (second surface 11b) of the substrate 11. Specifically, a resist layer 81 is formed on the second surface 11b of the substrate 11 (see FIG. 5A), the resist layer is patterned, and the resist layer on the substrate 11 on which the concave surface portion 12 is to be formed is removed. Then, the resist layer is heat-treated to form a recess 82 in the resist layer 81. In this way, the structure shown in FIG. 5B can be obtained. Next, the resist layer 81 and the substrate 11 are etched back. In this way, as shown in FIG. 6A, the concave surface portion 12 can be formed on the second surface 11b of the substrate 11.

[Step-110]

Next, the first light reflecting layer is formed on at least the concave surface portion. Specifically, the first light reflecting layer 41 composed of, for example, a dielectric multilayer film is formed by a well-known method on the second surface 11b of the substrate 11 including the concave surface portion 12. Specifically, a dielectric multilayer film is formed on the basis of a well-known method such as a sputtering method or a vacuum vapor deposition method to extend from the exposed surface (second surface 11b) of the substrate 11 onto the concave surface portion 12 (see FIG. 6B). Then, the first light reflecting layer 41 between the region where the light emitting element is to be formed and the region where the light emitting element is to be formed is removed based on a patterning method such as a wet etching method or a dry etching method. At this time, the first light reflecting layer 41 is removed so that a meeting portion in which many crystal defects are present is not formed on the normal line passing through the center of the concave surface portion 12. The removed portion of the first light reflecting layer 41 is indicated by reference numeral 83. In this way, the structure shown in FIG. 7A can be obtained. The planar shape of the outer edge portion of the first light reflecting layer 41 left on the second surface 11b of the substrate 11 is a regular hexagon.

[Step-120]

After that, a layered structure 20 in which the first compound semiconductor layer 21, the active layer 23, and the second compound semiconductor layer 22 are layered is formed on the surface (second surface 11b) of the substrate 11 and above the concave surface portion 12. That is, the layered structure 20 formed by layering the first compound semiconductor layer 21 that is composed of a GaN-based compound semiconductor and has the first surface 21a and the second surface 21b that is opposite to the first surface 21a, the active layer (light emitting layer) 23 that is composed of a GaN-based compound semiconductor and is in contact with the second surface 21b of the first compound semiconductor layer 21, and the second compound semiconductor layer 22 that is composed of a GaN-based compound semiconductor and has the first surface 22a and the second surface 22b that is opposite to the first surface 22a, the first surface 22a being in contact with the active layer 23, is formed on the second surface 11b of the substrate 11 including the first light reflecting layer 41. Specifically, the layered structure 20 can be obtained by forming the first compound semiconductor layer 21 composed of n-GaN (see FIG. 7B) from the second surface 11b of the exposed substrate 11 (from the portion 83 from which the first light reflecting layer 41 has been removed) by the lateral growth by using a method for epitaxial growth in the lateral direction, such as the ELO method, and then forming the active layer 23 and the second compound semiconductor layer 22 on the basis of an epitaxial growth method on the first compound semiconductor layer 21 (see FIG. 8A).

The space between the first light reflecting layer 41 formed on the concave surface portion 12 and the first compound semiconductor layer 21 becomes the cavity 43. Further, the resonator structure is configured by the first light reflecting layer 41 formed on the concave surface portion 12 and the portion of the first compound semiconductor layer 21 above the concave surface portion 12, and the length $L_{DBR}$, of the resonator structure is such that main light having an oscillation wavelength $\lambda_0$ and emitted from the active layer 23 satisfies the resonance condition of the resonator structure, and the light having a wavelength $\lambda'$ adjacent to the oscillation wavelength $\lambda_0$ does not satisfy the resonance condition of the resonator structure.

The first compound semiconductor layers 21 epitaxially grown from the second surface 11b of the substrate 11 do not meet above the central portion of the concave surface portion 12. Where the meeting portion (indicated by reference numeral 84 in FIG. 7B) where many crystal defects are present is located in the central portion of the element region, the characteristics of the light emitting element may be adversely affected. In Embodiment 1, the meeting portion 84 where many crystal defects are present is not present on the normal line passing through the center of the concave surface portion 12. Further, the normal projection image of the meeting portion 84 on the substrate 11 is not included in the concave surface portion 12. Therefore, it is possible to reliably suppress the occurrence of adverse effects on the characteristics of the light emitting element.

[Step-130]

Next, the insulating layer (current constriction layer) 34 composed of $SiO_2$ and having the opening 34A is formed on the second surface 22b of the second compound semiconductor layer 22 on the basis of a combination of a film forming method such as a CVD method, a sputtering method, or a vacuum vapor deposition method and a wet etching method or a dry etching method (see FIG. 8B). The current constriction region (current injection region 61A and current non-injection region 61B) is defined by the insulating layer 34 having the opening 34A. That is, the current injection region 61A is defined by the opening 34A.

In order to obtain the current constriction region, an insulating layer (current constriction layer) composed of an insulating material (for example, $SiO_X$, $SiN_X$, $AlO_X$) may be formed between the second electrode 32 and the second compound semiconductor layer 22, or a mesa structure may be formed by etching the second compound semiconductor layer 22 by an RIE method and the like, or some layers of the layered second compound semiconductor layer 22 may be partially oxidized from the lateral direction to form the current constriction region, or an impurity may be ion-implanted into the second compound semiconductor layer 22 to form a region having reduced conductivity, or these methods may be combined as appropriate. However, the second electrode 32 needs to be electrically connected to the portion of the second compound semiconductor layer 22 through which the current flows due to the current constriction.

[Step-140]

After that, the second electrode 32 and the second light reflecting layer 42 are formed on the second compound semiconductor layer 22. Specifically, the second electrode 32 is formed on the basis of, for example, a lift-off method to extend from the second surface 22b of the second compound semiconductor layer 22 exposed on the bottom surface of the opening 34A (current injection region 61A) onto the insulating layer 34, and then the pad electrode 33 is formed on the basis of a combination of a film forming method such as a sputtering method or a vacuum vapor deposition method and a patterning method such as a wet etching method or a dry etching method. Next, the second light reflecting layer 42 is formed on the basis of a combination of a film forming method such as a sputtering method or a vacuum vapor deposition method and a patterning method such as a wet etching method or a dry etching method to extend from above the second electrode 32 onto the pad electrode 33. The second light reflecting layer 42 on the second electrode 32 has a flat shape.

[Step-150]

After that, the first electrode 31 is formed on the first surface 11a of the substrate 11 on the basis of a combination of a film forming method such as a sputtering method or a vacuum vapor deposition method and a patterning method such as a wet etching method or a dry etching method. In this way, the structure shown in FIG. 1 can be obtained. Further, the light emitting element is separated by performing so-called element separation, and the side surface and the exposed surface of the layered structure 20 are covered with a coating layer composed of an insulating material such as $SiO_2$. Then, the light emitting element of Embodiment 1 can be completed by packaging or sealing.

In the light emitting element of Embodiment 1, a cavity is formed between the first light reflecting layer formed on the concave surface portion and the first compound semiconductor layer, the resonator structure is configured of the first light reflecting layer formed on the concave surface portion and the portion of the first compound semiconductor layer above the concave surface portion, and the length of the resonator structure is such that main light having the oscillation wavelength $\lambda_0$ and emitted from the active layer satisfies the resonance condition of the resonator structure, and the light that has the wavelength $\lambda'$ adjacent to the oscillation wavelength $\lambda_0$ does not satisfy the resonance condition of the resonator structure. Therefore, since the oscillation of the light adjacent to the main light (oscillation wavelength $\lambda_0$) emitted from the active layer can be suppressed, a light emitting element having a configuration and a structure capable of obtaining a single longitudinal mode can be provided.

Moreover, in the light emitting element of Embodiment 1, since the first light reflecting layer is formed on the concave surface, the light that has diffracted and spread from the active layer and then fell on the first light reflecting layer can be reliably reflected toward the active layer and collected in the active layer. Therefore, it is possible to avoid an increase in diffraction loss and laser oscillation can be reliably performed. Here, "thermal saturation" is a phenomenon in which the light output is saturated due to self-heating when the surface-emitting laser element is driven. The material used for the light reflecting layer (for example, a material such as $SiO_2$ or $Ta_2O_5$) has a lower thermal conductivity value than the GaN-based compound semiconductor. Therefore, increasing the thickness of the GaN-based compound semiconductor layer leads to suppressing thermal saturation. However, where the thickness of the GaN-based compound semiconductor layer is increased, the resonator length $L_{OR}$ is increased, so that the longitudinal mode can easily be changed to multiple modes. However, in the light emitting element of Embodiment 1, a single longitudinal mode can be obtained even if the resonator length is increased. Further, since the resonator length $L_{OR}$ can be increased, the tolerance of the manufacturing process of the light emitting element is increased, and as a result, the yield can be improved. The same applies to the light emitting element of Embodiment 2 described below.

Embodiment 2

Figure 9:
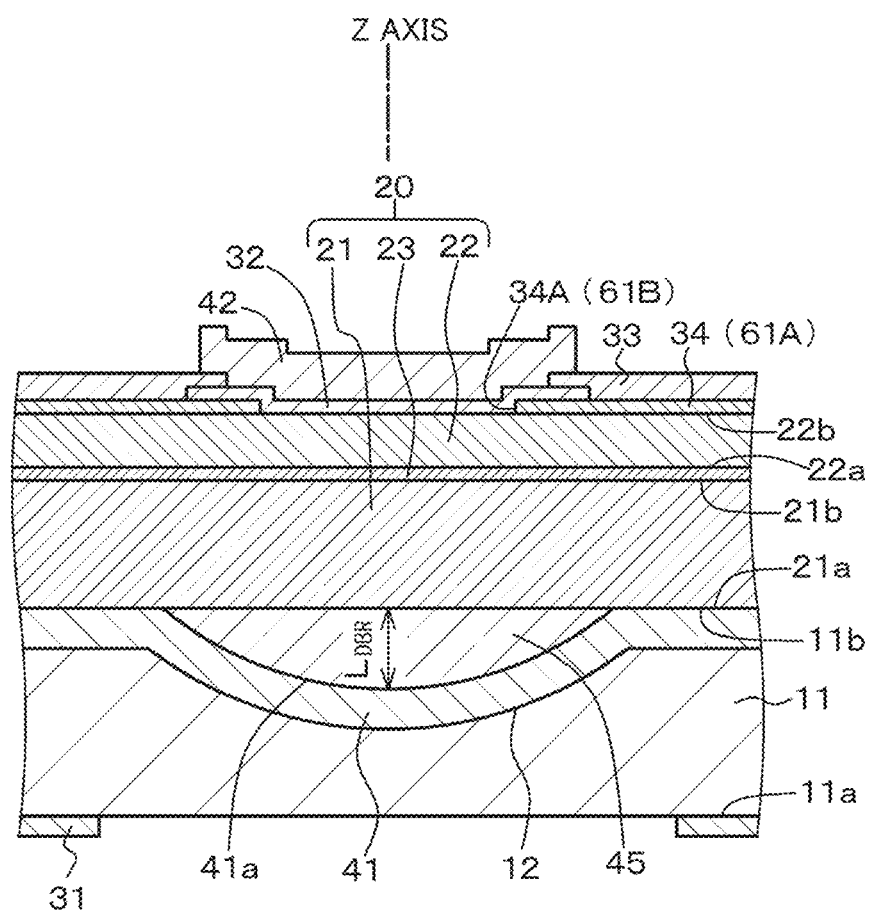
FIG. 9 is a schematic partial end view of a light emitting element of Embodiment 2.

Embodiment 2 relates to a light emitting element according to the second mode and the third mode of the present disclosure. A schematic partial end view of the light emitting element of Embodiment 2 is shown in FIG. 9.

The structure of the light emitting element of Embodiment 2 is basically the same as that of the light emitting element of Embodiment 1. In the light emitting element of Embodiment 2, a material (filling material 45) different from the material constituting the first compound semiconductor layer 21 is filled between the first light reflecting layer 41 formed on the concave surface portion 12 and the first compound semiconductor layer 21. Alternatively, a material (filling material 45) having a refractive index $n_2$ is filled between the first light reflecting layer 41 formed on the concave surface portion 12 and the first compound semiconductor layer 21. When the refractive index of the material constituting the first compound semiconductor layer is $n_1$, $n_1 \neq n_2$ is satisfied.

In Embodiment 2, specifically, the material constituting the first compound semiconductor layer 21 is composed of an n-GaN layer having a refractive index $n_1=2.5$, and the material constituting the filling material 45 is composed of a fluororesin having a refractive index $n_2=1.4$. Here, $|n_2-n_1| \geq 1.0$ is satisfied.

In the light emitting element of Embodiment 2, a material (filling material) different from the material constituting the first compound semiconductor layer is filled between the first light reflecting layer formed on the concave surface portion and the first compound semiconductor layer. Alternatively, a material (filling material) having a refractive index different from that of the material constituting the first compound semiconductor layer is filled between the first light reflecting layer formed on the concave surface portion and the first compound semiconductor layer. Therefore, since the oscillation of the light adjacent to the main light (oscillation wavelength $\lambda_0$) emitted from the active layer can be suppressed, a light emitting element having a configuration and a structure capable of obtaining a single longitudinal mode can be provided.

In order to manufacture the light emitting element of Embodiment 2, in a step similar to [Step-110] of Embodiment 1, for example, the first light reflecting layer 41 composed of a dielectric multilayer film is formed by a well-known method on the second surface 11b of the substrate 11 including the concave surface portion 12, then a layer composed of the filling material is formed on the entire surface including the top of the first light reflecting layer 41 above the concave surface portion 12, and then this layer is planarized, whereby the portion of the first light reflecting layer 41 above the concave surface portion 12 may be filled with the filling material 45 (see FIG. 10A). Next, in a step similar to [Step-110] of Embodiment 1, the first light reflecting layer 41 between the region where the light emitting element is to be formed and the region where the light emitting element is to be formed is removed on the basis of a patterning method such as a wet etching method or a dry etching method (see FIG. 10B). Then, in a step similar to [Step-120] of Embodiment 1, the layered structure 20 in which the first compound semiconductor layer 21, the active layer 23, and the second compound semiconductor layer 22 are layered may be formed on the surface (second surface 11b) of the substrate 11 and on the filling material 45. However, a method for forming the layered structure 20 is not limited to the method of epitaxially growing in the lateral direction such as the ELO method, and other methods may be used. Further, as the GaN substrate, a GaN substrate having a polar/non-polar/semi-polar main surface can be used. Where a polar GaN substrate is used, the luminous efficiency tends to decrease due to a piezo field effect in the active layer, but when a non-polar GaN substrate or a semi-polar GaN substrate is used, such a problem can be solved or mitigated.

In some cases, after performing the step similar to [Step-120] of Embodiment 1, the filling material 45 may be obtained by forming a hole 85 reaching the cavity 43 in a desired portion of the layered structure 20 (see FIG. 11A), injecting the liquid material 45A into the cavity 43 through the hole 85 (see FIG. 11B) and then curing the liquid material 45A. Alternatively, in some cases, after performing the step similar to [Step-120] of Embodiment 1, the filling material 45 may be obtained by forming a hole 86 (see FIG. 12A) reaching the cavity 43 in a desired portion of the substrate 11, injecting the liquid material 45A into the cavity 43 via the hole 86 (see FIG. 12B) and then curing the liquid material 45A.

Hereinafter, before explaining Embodiment 3 to Embodiment 10, various modification examples of the light emitting element etc. of the present disclosure will be described.

As described above, the insulating layer 34 having the opening 34A defines the current constriction region (current injection region 61A and current non-injection region 61B). That is, the current injection region 61A is defined by the opening 34A. The second compound semiconductor layer 22 is provided with the current injection region 61A and the current non-injection region 61B surrounding the current injection region 61A, and the shortest distance Do from the area center of gravity of the current injection region 61A to the boundary 61C between the current injection region 61A and the current non-injection region 61B satisfies the following formula. Here, for convenience, a light emitting element having such a configuration is referred to as a "light emitting element having a first configuration". For the derivation of the following formula, refer to, for example, H. Kogelnik and T. Li, "Laser Beams and Resonators", Applied Optics/Vol. 5, No. 10/October 1966. Further, $\omega_0$ is also called a beam waist radius.

$$D_{CI} \geq \omega_0/2 \tag{A}$$

where $$\omega_0^2 = (\lambda_0/\pi)\{L_{OR}(R_{DBR}-L_{OR})\}^{1/2} \tag{B}$$

Figure 22:
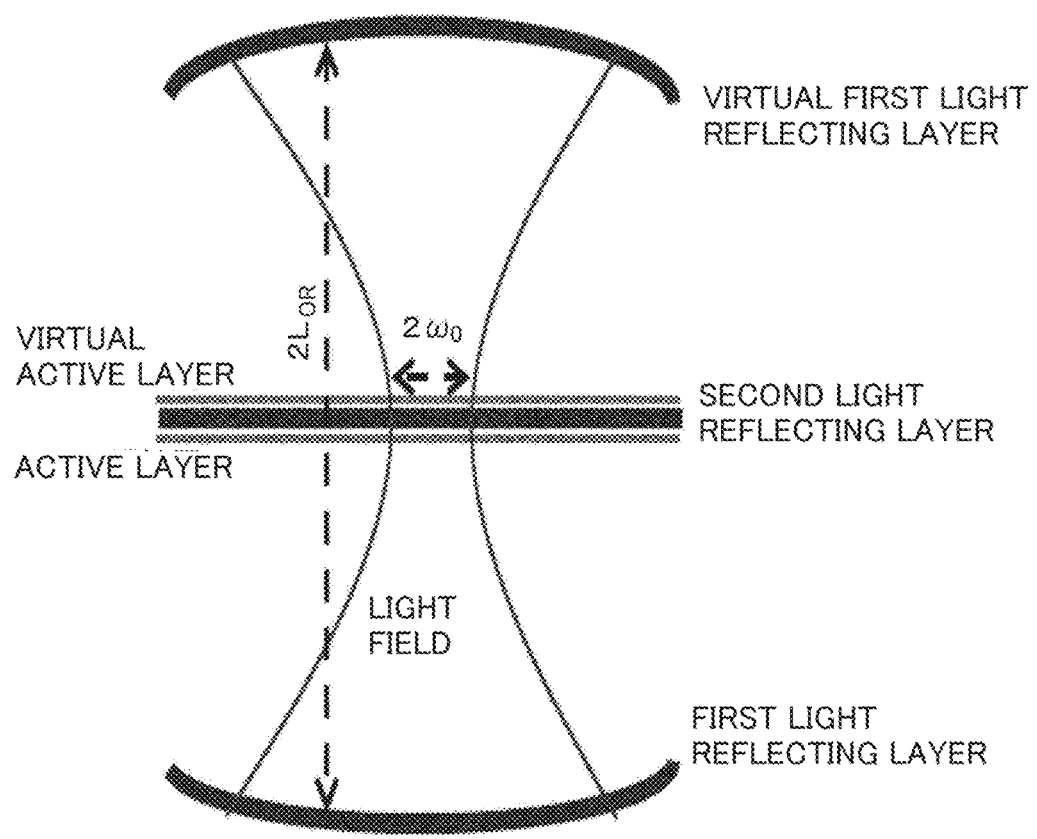
FIG. 22 is a conceptual diagram obtained assuming a Fabry-Perot type resonator sandwiched between two concave mirror portions having the same radius of curvature in the light emitting element of the present disclosure.
Figure 23:
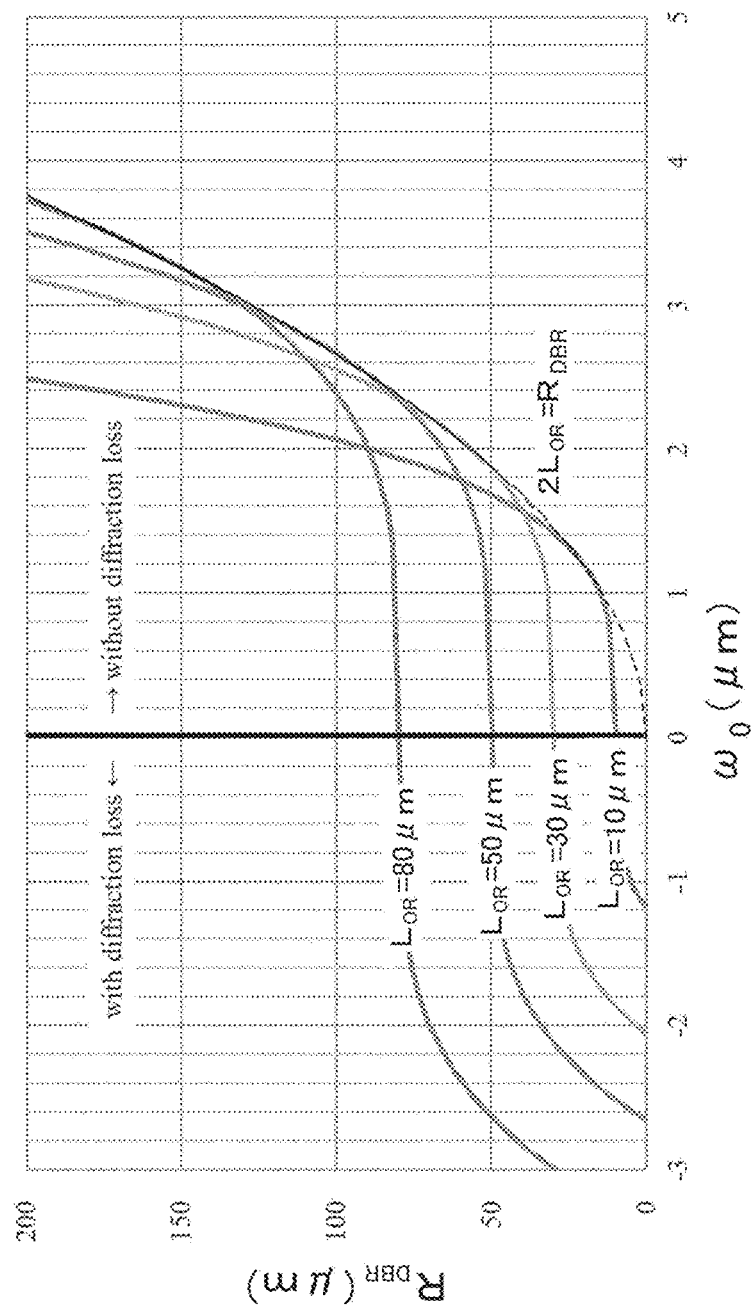
FIG. 23 is a graph showing the relationship between the value of $\omega 0$, the value of a resonator length LOR, and the value of the radius of curvature RDBR of the concave mirror portion of the first light reflecting layer.
Figure 24:
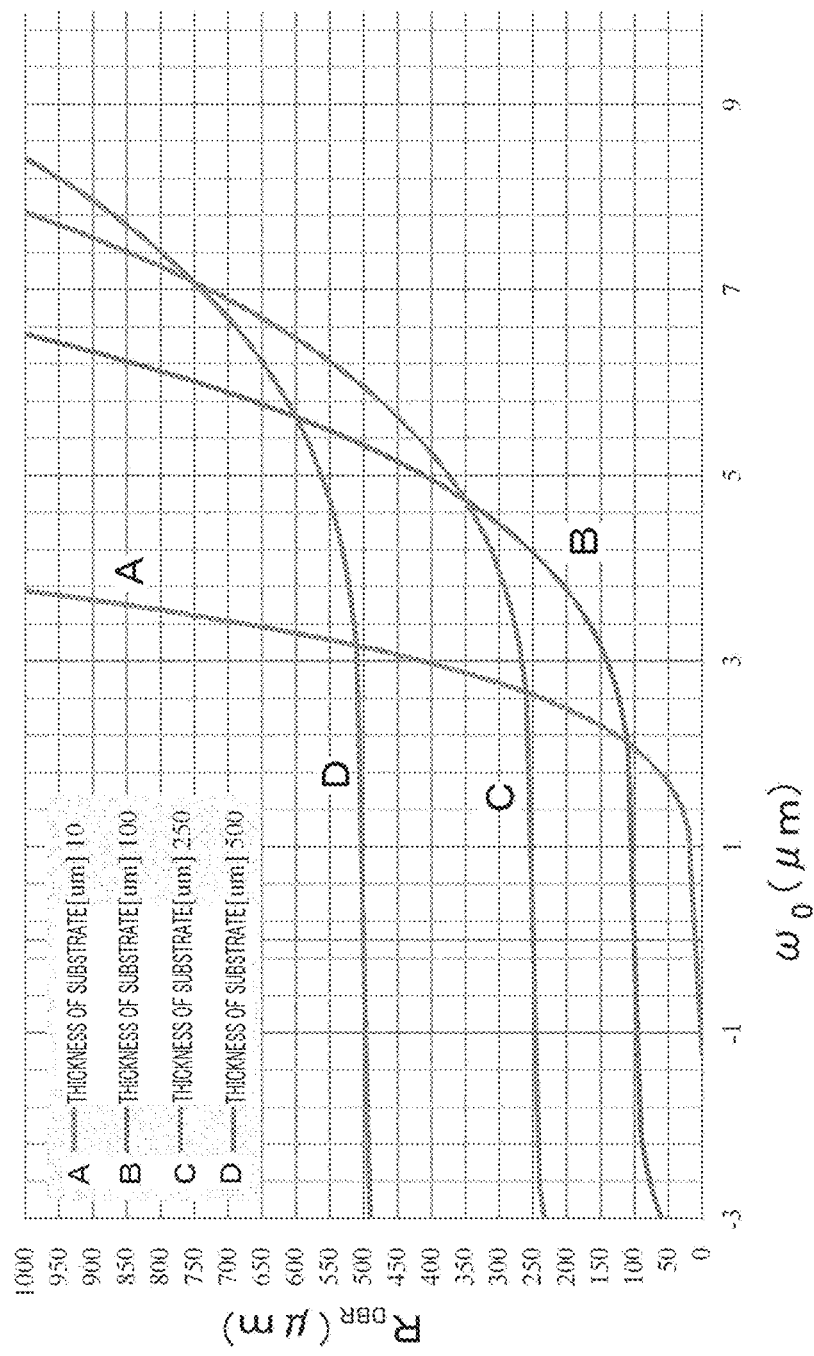
FIG. 24 is a graph showing the relationship between the value of $\omega 0$, the value of a resonator length LOR, and the value of the radius of curvature RDBR of the concave mirror portion of the first light reflecting layer.
Figure 25A:
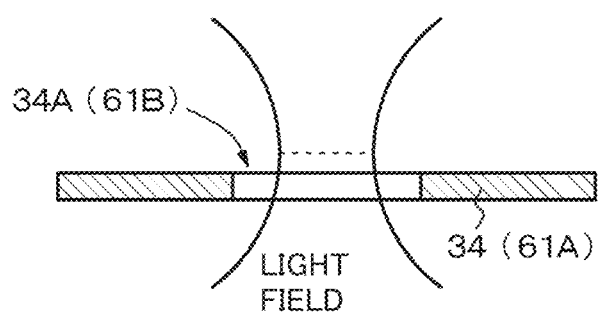
FIGS. 25A and 25B are diagrams schematically showing the focused state of the laser light when the value of $\omega 0$ is "positive" and the focused state of the laser light when the value of $\omega 0$ is "negative", respectively.
Figure 25B:
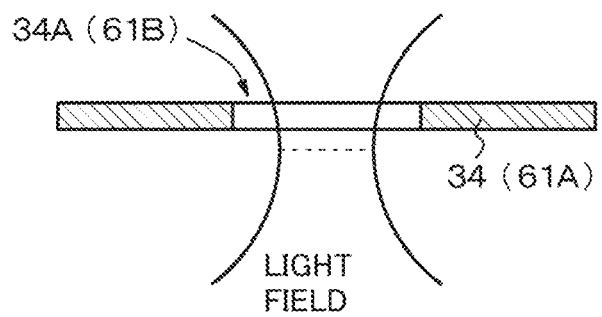

Here, the light emitting element having the first configuration has a concave mirror portion only on the first light reflecting layer side, but where the symmetry of the second light reflecting layer with respect to a flat mirror is considered, the resonator can be expanded to a Fabry-Perot type resonator sandwiched between two concave mirror portions having the same radius of curvature (see schematic view of FIG. 22). At this time, the resonator length of the virtual Fabry-Perot type resonator is twice the resonator length $L_{OR}$. Graphs showing the relationship between the value of $\omega_0$, the value of the resonator length $L_{OR}$, and the value of the radius of curvature $R_{DBR}$ of the concave mirror portion of the first light reflecting layer are shown in FIGS. 23 and 24. The value of $\omega_0$ being "positive" means that the laser light is schematically in the state shown in FIG. 25A, and the value of $\omega_0$ being "negative" means that the laser light is schematically in the state shown in FIG. 25B. The state of the laser light may be such as shown in FIG. 25A or such as shown in FIG. 25B. However, in the virtual Fabry-Perot type resonator having two concave mirror portions, where the radius of curvature $R_{DBR}$ becomes smaller than the resonator length $L_{OR}$, the state shown in FIG. 25B is realized, the confinement becomes excessive, and diffraction loss occurs. Therefore, the state shown in FIG. 25A in which the radius of curvature $R_{DBR}$ is larger than the resonator length $L_{OR}$ is preferable. Where the active layer is arranged close to a flat light reflecting layer, specifically, to the second light reflecting layer, among the two light reflecting layers, the light field is more collected in the active layer. That is, the light field confinement in the active layer is enhanced and laser oscillation is facilitated. The position of the active layer, that is, the distance from the surface of the second light reflecting layer facing the second compound semiconductor layer to the active layer is not limited, but $\lambda_0/2$ to $10\lambda_0$ can be exemplified.

Where the region where the light reflected by the first light reflecting layer is collected is not included in the current injection region corresponding to the region where the active layer has a gain by current injection, the stimulated emission of light from the carriers is hindered. As a result, laser oscillation may be hindered. By satisfying the above formulas (A) and (B), it is possible to guarantee that the region in which the light reflected by the first light reflecting layer is collected is included in the current injection region, and laser oscillation can be reliably achieved.

The light emitting element having the first configuration can have a configuration further including
  a mode loss action site that is provided on the second surface of the second compound semiconductor layer and constitutes a mode loss action region acting on a variation in an oscillation mode loss, and
  a second electrode formed to extend from above the second surface of the second compound semiconductor layer onto the mode loss action site, wherein
  the layered structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other.

In the light emitting element having the first configuration that includes such a preferable configuration, a radius $r'_{DBR}$ of the effective region of the first light reflecting layer is $\omega_0 \leq r'_{DBR} \leq 20\cdot\omega_0$, and preferably $\omega_0 \leq r'_{DBR} \leq 10\cdot\omega_0$. Alternatively, the value of $r'_{DBR}$ can be exemplified by $r'_{DBR} \leq 1\times10^{-4}$ m, and preferably $r'_{DBR} \leq 5\times10^{-5}$ m. Further, the light emitting element having the first configuration that includes such a preferable configuration can be configured to satisfy $D_{CI} \geq \omega_0$. Furthermore, the light emitting element having the first configuration that includes such a preferable configuration can be configured to satisfy $R_{DBR} \leq 1\times10^{-3}$ m, preferably $1\times10^{-5}$ m $\leq R_{DBR} \leq 1\times10^{-3}$ m, and more preferably $1\times10^{-5}$ m $\leq R_{DBR} \leq 5\times10^{-4}$ m.

Further, the light emitting element of the present disclosure can have a configuration further including
  a mode loss action site that is provided on the second surface of the second compound semiconductor layer and constitutes a mode loss action region acting on a variation in an oscillation mode loss, and
  a second electrode formed to extend from above the second surface of the second compound semiconductor layer onto the mode loss action site, wherein the layered structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other. Here, a light emitting element having such a configuration is referred to as a "light emitting element having a second configuration" for convenience.

In the light emitting element having the second configuration, the current non-injection region (general term for current non-injection inner region and current non-injection outer region) is formed in the layered structure, but specifically the current non-injection region may be formed in the region of the second compound semiconductor layer on the second electrode side in the thickness direction, may be formed in the entire second compound semiconductor layer, may be formed in the second compound semiconductor layer and the active layer, or may be formed to extend from the second compound semiconductor layer onto a part of the first compound semiconductor layer. The orthogonal projection image of the mode loss action region and the orthogonal projection image of the current non-injection outer region overlap with each other, but in a region sufficiently distant from the current injection region, the orthogonal projection image of the mode loss action region and the orthogonal projection image of the current non-injection outer region may not overlap with each other.

The light emitting element having the second configuration can have a configuration in which the current non-injection outer region is located below the mode loss action region.

The light emitting element having the second configuration including the above preferable configuration can have a configuration such that, assuming that the area of the orthogonal projection image of the current injection region is $S_1$ and the area of the orthogonal projection image of the current non-injection inner region is $S_2$, $$0.01 \leq S_1/(S_1+S_2) \leq 0.7$$

is satisfied.

The light emitting element having the second configuration that includes the above preferable configuration can have a configuration in which the current non-injection inner region and the current non-injection outer region are formed by ion implantation into the layered structure. For convenience, a light emitting element having such a configuration is referred to as a "light emitting element having the second-A configuration". In this case, a configuration is possible in which the ion species is at least one type of ion (that is, one type of ion or two or more types of ions) selected from the group consisting of boron, proton, phosphorus, arsenic, carbon, nitrogen, fluorine, oxygen, germanium, and silicon.

Alternatively, the light emitting element having the second configuration that includes the above preferable configuration can have a configuration in which the current non-injection inner region and the current non-injection outer region are formed by plasma irradiation of the second surface of the second compound semiconductor layer, by ashing treatment of the second surface of the second compound semiconductor layer, or by reactive ion etching treatment of the second surface of the second compound semiconductor layer. For convenience, the light emitting element having such a configuration is referred to as a "light emitting element having a second-B configuration". In these treatments, since the current non-injection inner region and the current non-injection outer region are exposed to plasma particles, the conductivity of the second compound semiconductor layer deteriorates, and the current non-injection inner region and the current non-injection outer region assume a high-resistance state. That is, a configuration can be obtained in which the current non-injection inner region and the current non-injection outer region are formed by exposure of the second surface of the second compound semiconductor layer to the plasma particles. Specific examples of the plasma particles include argon, oxygen, nitrogen and the like.

Alternatively, the light emitting element having the second configuration that includes the above preferable configuration can have a configuration in which the second light reflecting layer has a region that reflects or scatters the light from the first light reflecting layer toward the outside of the resonator structure configured of the first light reflecting layer and the second light reflecting layer. For convenience, the light emitting element having such a configuration is referred to as a "light emitting elements having a second-C configuration". Specifically, the region of the second light reflecting layer located above the side wall of the mode loss action site (the side wall of the opening provided in the mode loss action site) has a forward taper-shaped inclination. Further, a configuration can be obtained in which light is scattered at the boundary (side wall edge portion) between the top surface of the mode loss action site and the side wall of the opening provided in the mode loss action site, thereby scattering the light toward the outside of the resonator structure configured of the first light reflecting layer and the second light reflecting layer.

The light emitting element having the second-A configuration, the light emitting element having the second-B configuration, or the light emitting element having the second-C configuration described above can have a configuration such that, assuming that the optical distance from the active layer in the current injection region to the second surface of the second compound semiconductor layer is $L_2$ and the optical distance from the active layer in the mode loss action region to the top surface of the mode loss action site is $L_0$, $$L_0 > L_2$$

is satisfied. Further, the light emitting element having the second-A configuration, the light emitting element having the second-B configuration, or the light emitting element having the second-C configuration including such configuration can have a configuration in which the generated light having a higher order mode is dissipated toward the outside of the resonator structure configured of the first light reflecting layer and the second light reflecting layer by the mode loss action region, and thus the oscillation mode loss increases. That is, the resulting light field intensities in the fundamental mode and the higher order mode decrease as the distance from the Z axis increases in the orthogonal projection image of the mode loss action region due to the presence of the mode loss action region acting on a variation in the oscillation mode loss, and since the mode loss in the higher order mode is larger than a decrease in the light field intensity in the fundamental mode and makes it possible to further stabilize the fundamental mode and also suppress the mode loss as compared with the case where the current injection inner region is not present, the threshold current can be reduced.

Further, the light emitting element having the second-A configuration, the light emitting element having the second-B configuration, or the light emitting element having the second-C configuration described above can have a configuration in which the mode loss action site is composed of a dielectric material, a metal material, or an alloy material. The dielectric material can be exemplified by $SiO_X$, $SiN_X$, $AlN_X$, $AlO_X$, $TaO_X$, and $ZrO_X$, and the metal material or alloy material can be exemplified by titanium, gold, platinum and alloys thereof, but these materials are not limiting. Light can be absorbed and the mode loss can be increased by the mode loss action site configured of these materials. Alternatively, the mode loss can be controlled by disturbing the phase without directly absorbing light. In this case, a configuration can be used in which the mode loss action site is composed of a dielectric material, and the optical thickness to of the mode loss action site is a value deviating from an integral multiple of ¼ of the oscillation wavelength $\lambda_0$. That is, it is possible to break the standing wave by disturbing the phase of the light, which circulates in the resonator and forms the standing wave, at the mode loss action site, and to give a corresponding mode loss. Alternatively, a configuration can be used in which the mode loss action site is composed of a dielectric material, and the optical thickness to of the mode loss action site (refractive index is taken as $n_{m\text{-}loss}$) is an integral multiple of ¼ of the oscillation wavelength $\lambda_0$. That is, a configuration can be used in which the optical thickness to of the mode loss action site is such that does not disturb the phase of the light generated in the light emitting element and does not break the standing wave. However, this thickness does not have to be exactly an integral multiple of ¼ in a strict sense, and it is sufficient if $$(\lambda_0/4n_{m\text{-}loss}) \times m - (\lambda_0/8n_{m\text{-}loss}) \le t_0 \le (\lambda_0/4n_{m\text{-}loss}) \times 2m + (\lambda_0/8n_{m\text{-}loss})$$

is satisfied. Alternatively, by using a configuration in which the mode loss action site is composed of a dielectric material, a metal material, or an alloy material, the phase of the light passing through the mode loss action site can be disturbed or the light can be absorbed by the mode loss action site. By adopting these configurations, the oscillation mode loss can be controlled with a higher degree of freedom, and the design freedom of the light emitting element can be further increased.

Alternatively, the light emitting element having the second configuration including the above preferable configurations can have a configuration in which a projecting portion is formed on the second surface side of the second compound semiconductor layer, and
the mode loss action site is formed on a region of the second surface of the second compound semiconductor layer surrounding the projecting portion. For convenience, a light emitting element having such a configuration is referred to as a "light emitting element having a second-D configuration". The projecting portion occupies the current injection region and the current non-injection inner region. In this case, a configuration can be used such that, assuming that the optical distance from the active layer in the current injection region to the second surface of the second compound semiconductor layer is $L_2$ and the optical distance from the active layer in the mode loss action region to the top surface of the mode loss action site is $L_0$, $$L_0 < L_2$$

is satisfied. Furthermore, in these cases, a configuration can be used in which the generated light having the higher order mode is confined in the current injection region and the current non-injection inner region by the mode loss action region, and thus the oscillation mode loss is reduced. That is, the resulting light field intensities in the fundamental mode and the higher order mode increase in the orthogonal projection images of the current injection region and the current non-injection inner region due to the presence of the mode loss action region acting on a variation in the oscillation mode loss. Further, in these cases, a configuration can be used in which the mode loss action site is composed of a dielectric material, a metal material or an alloy material. Here, the dielectric material, the metal material, or the alloy material can be exemplified by the above-mentioned various materials.

Further, the light emitting elements and the like of the present disclosure including the preferable modes and configurations (including the light emitting element of the first configuration and the light emitting elements of the second configuration) described above can have a configuration in which the layered structure including the second electrode is formed with at least two light absorbing material layers in parallel with the virtual plane occupied by the active layer. Here, for convenience, a light emitting element having such a configuration is referred to as a "light emitting element having a third configuration". In the light emitting element having the third configuration, it is preferable that at least four light absorbing material layers are formed.

In the light emitting element having the third configuration including the above preferable configuration, assuming that the oscillation wavelength (the wavelength of the light mainly emitted from the light emitting element, which is the desired oscillation wavelength) is $\lambda_0$, the equivalent refractive index of the two light absorbing material layers and the entire portion of the layered structure located between the light absorbing material layer and the light absorbing material layer is $n_{eq}$, and the distance between the light absorbing material layer and the light absorbing material layer is $L_{Abs}$, $$0.9 \times \{(m \cdot \lambda_0)/(2 \cdot n_{eq})\} \le L_{Abs} \le 1.1 \times \{(m \cdot \lambda_0)/(2 \cdot n_{eq})\}$$

is preferably satisfied. Here, m is 1 or an integer of 2 or more including 1. Assuming that the thickness of each of two light absorbing material layers and each layer constituting the portion of the layered structure located between the light absorbing material layer and the light absorbing material layer is $t_i$ and the refractive index of each layer is $n_1$, the equivalent refractive index $n_{eq}$ is represented by $$n_{eq} = \Sigma(t_i \times n_i)/\Sigma(t_i).$$

Here, i=1, 2, 3 . . . , I, and "I" is the total number of layers including the two light absorbing material layers and layers constituting the portion of the layered structure located between the light absorbing material layer and the light absorbing material layer, and "Σ" means taking the sum from i=1 to i=I. The equivalent refractive index $n_{eq}$ may be calculated based on the known refractive index of each constituent material and the thickness obtained by the observation when observing the constituent materials in the cross section of the light emitting element with an electron microscope or the like. When m is 1, the distance between adjacent light absorbing material layers satisfies $$0.9 \times \{\lambda_0/(2 \cdot n_{eq})\} \le L_{Abs} \le 1.1 \times \{\lambda_0/(2 \cdot n_{eq})\}$$

in all of the plurality of light absorbing material layers. Further, when m is an arbitrary integer of 2 or more including 1, where m=1 and 2 as an example, in some light absorbing material layers, the distance between adjacent light absorbing material layers satisfies $$0.9 \times \{\lambda_0/(2 \cdot n_{eq})\} \le L_{Abs} \le 1.1 \times \{\lambda_0/(2 \cdot n_{eq})\}, \text{ and}$$

in the remaining light absorbing material layers, the distance between adjacent light absorbing material layers satisfies $$0.9 \times \{(2 \cdot \lambda_0)/(2 \cdot n_{eq})\} \le L_{Abs} \le 1.1 \times \{(2 \cdot \lambda_0)/(2 \cdot n_{eq})\}.$$

Broadly, in some light absorbing material layers, the distance between adjacent light absorbing material layers satisfies $$0.9 \times \{\lambda_0/(2 \cdot n_{eq})\} \le L_{Abs} \le 1.1 \times \{\lambda_0/(2 \cdot n_{eq})\}, \text{ and}$$

in the remaining light absorbing material layers, the distance between adjacent light absorbing material layers satisfies $$0.9 \times \{(m' \cdot \lambda_0)/(2 \cdot n_{eq})\} \le L_{Abs} \le 1.1 \times \{(m' \cdot \lambda_0)/(2 \cdot n_{eq})\}.$$

Here, m' is an arbitrary integer of 2 or more. Further, the distance between adjacent light absorbing material layers is the distance between the centers of gravity of adjacent light absorbing material layers. That is, in reality, it is the distance between the centers of each light absorbing material layer when cut in a virtual plane along the thickness direction of the active layer.

Further, in the light emitting element having the third configuration including the above-mentioned various preferable configurations, the thickness of the light absorbing material layer is preferably $\lambda_0/(4 \cdot n_{eq})$ or less. The lower limit of the thickness of the light absorbing material layer can be exemplified by 1 nm.

Further, the light emitting element having the third configuration including the above-mentioned various preferable configurations can have a configuration in which the light absorbing material layer is located at the lowest amplitude portion generated in the standing wave of light formed inside the layered structure.

Further, the light emitting element having the third configuration including the above-mentioned various preferable configurations can have a configuration in which the active layer is located at the maximum amplitude portion generated in the standing wave of light formed inside the layered structure.

Further, the light emitting element having the third configuration including the above-mentioned various preferable configurations can have a configuration in which the light absorbing material layer has a light absorption coefficient at least twice the light absorption coefficient of the compound semiconductor constituting the layered structure. Here, the light absorption coefficient of the light absorbing material layer and the light absorption coefficient of the compound semiconductors constituting the layered structure can be obtained by observing the constituent materials from the electron microscope observation or the like of the light emitting element cross section and inferring from the known evaluation results observed for each constituent material.

Further, the light emitting element having the third configuration including the above-mentioned various preferable configurations can have a configuration in which the light absorbing material layer is configured of at least one kind of material selected from the group consisting of a compound semiconductor material having a narrower bandgap than the compound semiconductor constituting the layered structure, a compound semiconductor material doped with an impurity, a transparent conductive material, and a light reflecting layer constituent material having a light absorption characteristic. For example, where the compound semiconductor constituting the layered structure is GaN, the compound semiconductor material having a narrower bandgap than the compound semiconductor constituting the layered structure can be exemplified by InGaN, the compound semiconductor material doped with an impurity can be exemplified by Si-doped n-GaN and B-doped n-GaN, the transparent conductive material can be exemplified by a transparent conductive material constituting electrodes, and the material constituting the light reflecting layer and having a light absorption characteristic can be exemplified by a material (for example, $SiO_X$, $SiN_X$, $TaO_X$, etc.) constituting the light reflecting layers. All of the light absorbing material layers may be configured of one of these materials. Alternatively, each of the light absorbing material layers may be configured of various materials selected from these materials, but from the viewpoint of simplifying the formation of the light absorbing material layers, it is preferable that one light absorbing material layer be configured of one kind of material. The light absorbing material layer may be formed in the first compound semiconductor layer, in the second compound semiconductor layer, or in the second light reflecting layer. However, an arbitrarily selected combination of these is also possible. Alternatively, the light absorbing material layer can also be used as an electrode composed of a transparent conductive material.

Hereinafter, Embodiment 3 to Embodiment 10 will be described.

Embodiment 3

Embodiment 3 is a modification of Embodiment 1 and Embodiment 2, and relates to a light emitting element having the first configuration. As described above, the insulating layer 34 having the opening 34A defines the current constriction region (current injection region 61A and current non-injection region 61B). That is, the opening 34A defines the current injection region 61A. That is, in the light emitting element of Embodiment 3, the second compound semiconductor layer 22 is provided with the current injection region 61A and the current non-injection region 61B surrounding the current injection region 61A, and the shortest distance Do from the area center of gravity of the current injection region 61A to a boundary 61C between the current injection region 61A and the current non-injection region 61B satisfies the above-mentioned formulas (A) and (B).

In the light emitting element of Embodiment 3, the radius r'DBR of the effective region 44 of the first light reflecting layer 41 satisfies $\omega_0 \leq r'_{DBR} \leq 20 \cdot \omega_0$.

Moreover, $D_{CI} \geq \omega_0$ is satisfied. Further, $R_{DBR} \leq 1 \times 10^{-3}$ m is satisfied.

Specifically, $D_{CI}$=4 μm $\omega_0$=1.5 μm $L_{OR}$=30 μm $R_{DBR}$=60 μm $\lambda_0$=525 nm can be exemplified. Further, the diameter of the opening 34A can be exemplified by 8 μm. A substrate in which a main surface is a surface with a c-plane inclined by about 75 degrees in the m-axis direction is used as the GaN substrate. That is, the GaN substrate has a {20-21} plane which is a semi-polar plane as a main surface. Such a GaN substrate can also be used in other embodiments.

A deviation between the central axis (Z axis) of the concave surface portion 12 and the current injection region 61A in the XY plane direction causes deterioration of the characteristics of the light emitting element. Lithography is often used for both patterning for forming the concave surface portion 12 and patterning for forming the opening 34A, but in this case, the positional relationship between the two often shifts within the XY plane depending on the performance of the exposure machine. In particular, the opening 34A (current injection region 61A) is positioned by performing alignment from the side of the second compound semiconductor layer 22. Meanwhile, the concave surface portion 12 is positioned by performing alignment from the side of the compound semiconductor substrate 11. Accordingly, in the light emitting element of Embodiment 3, by forming the opening 34A (current injection region 61) to be larger than the region where the light is focused by the concave surface portion 12, a structure is realized in which the oscillation characteristics are not affected even if a deviation occurs between the central axis (Z axis) of the concave surface portion 12 and the current injection region 61A in the XY plane direction.

That is, where the region in which the light reflected by the first light reflecting layer is collected is not included in the current injection region corresponding to the region where the active layer has a gain due to current injection, the stimulated emission of light from the carrier is inhibited. As a result, laser oscillation may be hindered. However, by satisfying the above formulas (A) and (B), it is possible to guarantee that the region in which the light reflected by the first light reflecting layer is collected is included in the current injection region and laser oscillation can be reliably achieved.

Embodiment 4

Figure 13:
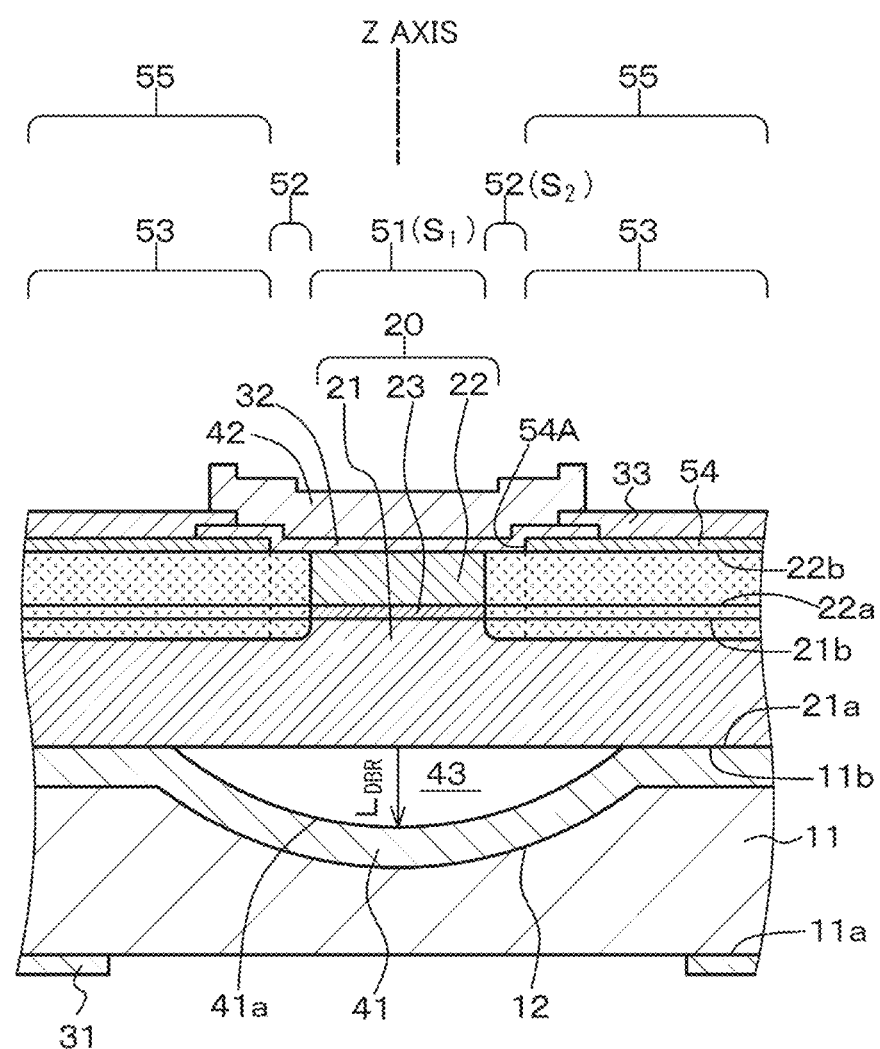
FIG. 13 is a schematic partial end view of a light emitting element of Embodiment 4.

Embodiment 4 is a modification of Embodiment 1 to Embodiment 3, and relates to a light emitting element having the second configuration, specifically, a light emitting element having the second-A configuration. A schematic partial end view of the light emitting element of Embodiment 4 is shown in FIG. 13.

In order to control the flow path (current injection region) of the current flowing between the first electrode and the second electrode, a current non-injection region is formed so as to surround the current injection region. In a GaAs-based surface-emitting laser element (a surface-emitting laser element configured of a GaAs-based compound semiconductor), a current non-injection region surrounding the current injection region can be formed by oxidizing the active layer from the outside along the XY plane. The refractive index of the oxidized region of the active layer (current non-injection region) decreases with respect to that of the non-oxidized region (current injection region). As a result, the optical path length of the resonator (represented by the product of the refractive index and the physical distance) is shorter in the current non-injection region than in the current injection region. As a consequence, a kind of "lens effect" is generated, and the action of confining the laser light in the central portion of the surface-emitting laser element is brought about. In general, since light tends to spread due to the diffraction effect, the laser light reciprocating in the resonator gradually dissipates to the outside of the resonator (diffraction loss), and an adverse effect such as an increase in threshold current is generated. However, since the lens effect compensates for this diffraction loss, it is possible to suppress an increase in the threshold current and the like.

However, in a light emitting element configured of a GaN-based compound semiconductor, it is difficult to oxidize the active layer from the outside (from the lateral direction) along the XY plane due to the characteristics of the material. Therefore, as described in Embodiment 1 to Embodiment 3, the insulating layer 34 composed of $SiO_2$ and having the opening 34A is formed on the second compound semiconductor layer 22, the second electrode 32 composed of a transparent conductive material is formed to extend from the second compound semiconductor layer 22 exposed at the bottom of the opening 34A onto the insulating layer 34, and the second light reflecting layer 42 composed of a layered structure of insulating materials is formed on the second electrode 32. By forming the insulating layer 34 in this way, the current non-injection region 61B is formed. The portion of the second compound semiconductor layer 22 located in the opening 34A provided in the insulating layer 34 becomes the current injection region 61A.

Where the insulating layer 34 is formed on the second compound semiconductor layer 22, the resonator length in the region where the insulating layer 34 is formed (current non-injection region 61B) is larger by the optical thickness of the insulating layer 34 than the resonator length in the region where the insulating layer 34 is not formed (current injection region 61A). Therefore, an action causing the laser light reciprocating in the resonator formed by the two light reflecting layers 41 and 42 of the surface-emitting laser element (light emitting element) to diverge and dissipate to the outside of the resonator is generated. For convenience, such an action is referred to as a "reverse lens effect". As a result, an oscillation mode loss is generated in the laser light, the threshold current may be increased, or the slope efficiency may be worsened. Here, the "oscillation mode loss" is a physical quantity that causes a variation in the light field intensity in the fundamental mode and higher order mode in the oscillating laser light, and different oscillation mode losses are defined for the individual modes. The "light field intensity" is a light field intensity that is a function of the distance L from the Z axis in the XY plane. In general, in the fundamental mode, the light field intensity decreases monotonically as the distance L increases, but in the higher order mode, the light field intensity repeats an increase and a decrease once or a plurality of times and is eventually reduced as the distance L increases (see the conceptual diagram of FIG. 15A). In FIGS. 15A, 15B, and 15C, a solid line represents the light field intensity distribution in the fundamental mode, and a broken line represents the light field intensity distribution in the higher order mode. Further, in FIGS. 15A, 15B, and 15C, the first light reflecting layer 41 is displayed in a flat state for convenience, but is actually formed on the concave surface portion 12.

The light emitting element of Embodiment 4 or the light emitting element of Embodiment 5 to Embodiment 7 described hereinbelow comprises:

(A) the layered structure 20 composed of a GaN-based compound semiconductor in which
the first compound semiconductor layer 21 having the first surface 21a and the second surface 21b that is opposite to the first surface 21a,
the active layer (light emitting layer) 23 facing the second surface 21b of the first compound semiconductor layer 21, and
the second compound semiconductor layers 22 having the first surface 22a facing the active layer 23, and the second surface 22b that is opposite to the first surface 22a
are layered, (B) a mode loss action site (mode loss action layer) 54 that is provided on the second surface 22b of the second compound semiconductor layer 22 and that constitutes a mode loss action region 55 acting on a variation in the oscillation mode loss, (C) the second electrode 32 formed to extend from above the second surface 22b of the second compound semiconductor layer 22 onto the mode loss action site 54, (D) the second light reflecting layer 42 formed on the second electrode 32, (E) the first light reflecting layer 41, and (F) the first electrode 31.

The layered structure 20 is formed with a current injection region 51, a current non-injection inner region 52 surrounding the current injection region 51, and a current non-injection outer region 53 surrounding the current non-injection inner region 52, and the orthogonal projection image of the mode loss action region 55 and the orthogonal projection image of the current non-injection outer region 53 overlap with each other. That is, the current non-injection outer region 53 is located below the mode loss action region 55. In a region sufficiently distant from the current injection region 51 into which a current is injected, the orthogonal projection image of the mode loss action region 55 and the orthogonal projection image of the current non-injection outer region 53 do not have to overlap with each other. Here, the current non-injection regions 52 and 53 in which no current is injected are formed in the layered structure 20, but in the illustrated example, these regions are formed to extend in the thickness direction from the second compound semiconductor layer 22 onto a part of the first compound semiconductor layer 21. However, the current non-injection regions 52 and 53 may be formed in a region on the second electrode side of the second compound semiconductor layer 22 in the thickness direction, may be formed in the entire second compound semiconductor layer 22, or may be formed in the second compound semiconductor layer 22 and the active layer 23.

The mode loss action site (mode loss action layer) 54 is composed of a dielectric material such as $SiO_2$, and in the light emitting elements of Embodiment 4 or Embodiment 5 to Embodiment 7 described hereinbelow, the mode loss action site is formed between the second electrode 32 and the second compound semiconductor layer 22. The optical thickness of the mode loss action site 54 can be set to a value deviating from an integral multiple of ¼ of the oscillation wavelength $\lambda_0$. Alternatively, the optical thickness to of the mode loss action site 54 can be an integral multiple of ¼ of the oscillation wavelength $\lambda_0$. That is, the optical thickness to of the mode loss action site 54 can be set to a thickness that does not disturb the phase of light generated in the light emitting element and does not break the standing wave. However, this thickness does not have to be exactly an integral multiple of ¼ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss})$$

is satisfied. Specifically, the optical thickness to of the mode loss action site 54 is preferably about 25 to 250 when the value of ¼ of the wavelength of the light generated by the light emitting element is "100". By adopting these configurations, it is possible to change the phase difference (control the phase difference) between the laser light passing through the mode loss action site 54 and the laser light passing through the current injection region 51, to control the oscillation mode loss with a higher degree of freedom, and to further increase the design freedom of the light emitting element.

In Embodiment 4 the shape of the boundary between the current injection region 51 and the current non-injection inner region 52 was circular (diameter: 8 µm), and the shape of the boundary between the current non-injection inner region 52 and the current non-injection outer region 53 was circular (diameter: 12 µm). That is, assuming that the area of the orthogonal projection image of the current injection region 51 is $S_1$ and the area of the orthogonal projection image of the current non-injection inner region 52 is $S_2$, $$0.01 \leq S_1/(S_1+S_2) \leq 0.7$$

is satisfied. Specifically, $$S_1/(S_1+S_2) = 8^2/12^2 = 0.44.$$

In the light emitting elements of Embodiment 4 or Embodiment 5 and Embodiment 6 described hereinbelow, assuming that the optical distance from the active layer 23 in the current injection region 51 to the second surface of the second compound semiconductor layer 22 is L2, and the optical distance from the active layer 23 in the mode loss action region 55 to the top surface (the surface that is opposite to the second electrode 32) of the mode loss action site 54 is L0, $$L0 > L2$$

is satisfied. Specifically, $$L0/L2 = 1.5.$$

The generated laser light having a higher order mode is dissipated toward the outside of the resonator structure composed of the first light reflecting layer 41 and the second light reflecting layer 42 by the mode loss action region 55, whereby the oscillation mode loss is increased. That is, the resulting light field intensities in the fundamental mode and the higher order mode decrease as the distance from the Z axis increases in the orthogonal projection image of the mode loss action region 55 due to the presence of the mode loss action region 55 acting on a variation in the oscillation mode loss (see the conceptual diagram of FIG. 15B), but a decrease in the light field intensity in the higher order mode is larger than a decrease in the light field intensity in the fundamental mode, the fundamental mode can be further stabilized, the threshold current can be reduced and the relative light field intensity in the fundamental mode can be increased. Moreover, since a portion of the skirt of the light field intensity in the higher order mode is located farther from the current injection region than in the conventional light emitting element (see FIG. 15A), the influence of the reverse lens effect can be reduced. In the first place, in the case where the mode loss action site 54 composed of SiO2 is not provided, mixing of oscillation modes is generated.

The first compound semiconductor layer 21 is composed of an n-GaN layer, the active layer 23 is composed a five-layer multiple quantum well structure in which an $In_{0.04}Ga_{0.96}N$ layer (barrier layer) and an $In_{0.16}Ga_{0.84}N$ layer (well layer) are layered, and the second compound semiconductor layer 22 is composed of a p-GaN layer. Further, the first electrode 31 is composed of Ti/Pt/Au, and the second electrode 32 is composed of a transparent conductive material, specifically ITO. A circular opening 54A is formed in the mode loss action site 54, and the second compound semiconductor layer 22 is exposed at the bottom of the opening 54A. On the edge of the first electrode 31, a pad electrode (not shown) composed of, for example, Ti/Pt/Au or V/Pt/Au and serving for electrically connecting to an external electrode or circuit is formed or connected. On the edge of the second electrode 32, a pad electrode 33 composed of, for example, Ti/Pd/Au or Ti/Ni/Au and serving for electrically connecting to an external electrode or circuit is formed or connected. The first light reflecting layer 41 and the second light reflecting layer 42 have a layered structure of a SiN layer and a $SiO_2$ layer (total number of dielectric films layered: 20 layers).

In the light emitting element of Embodiment 4, the current non-injection inner region 52 and the current non-injection outer region 53 are formed by ion implantation into the layered structure 20. For example, boron was selected as the ion species, but the boron ion is not limiting.

An outline of a method for manufacturing the light emitting element of Embodiment 4 will be described below.
[Step-400]

In manufacturing the light emitting element of Embodiment 4, first, steps similar to [Step-100] to [Step-120] of Embodiment 1 are carried out.

[Step-410]

Next, the current non-injection inner region 52 and the current non-injection outer region 53 are formed in the layered structure 20 on the basis of an ion implantation method using boron ions.

[Step-420]

Figure 14A:
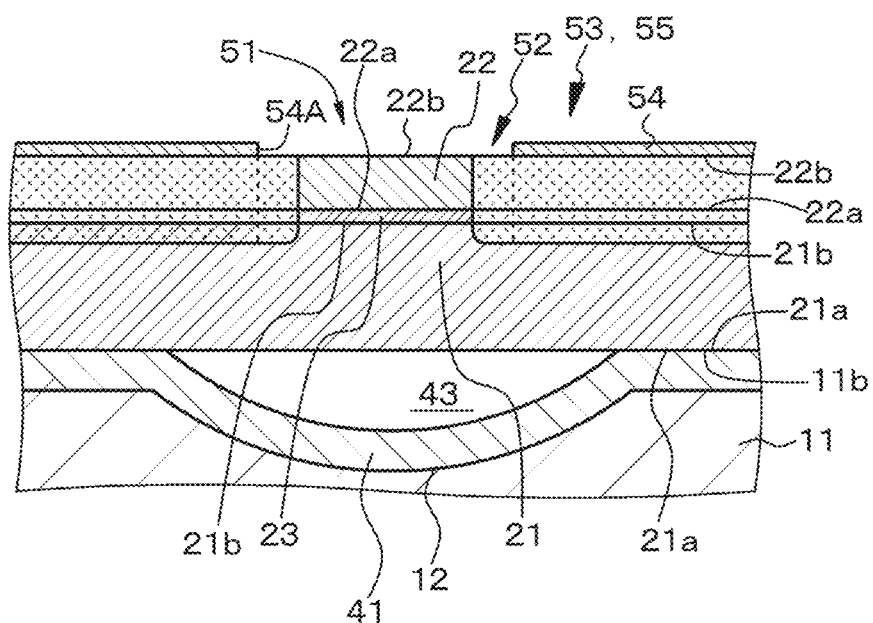
FIGS. 14A and 14B are schematic partial end views of a layered structure and the like for explaining a method for manufacturing the light emitting element of Embodiment 4.

Then, in a step similar to [Step-130] of Embodiment 1, the mode loss action site (mode loss action layer) 54 having the opening 54A and composed of $SiO_2$ is formed on the second surface 22b of the second compound semiconductor layer 22 on the basis of a well-known method (see FIG. 14A).

[Step-430]

Figure 14B:
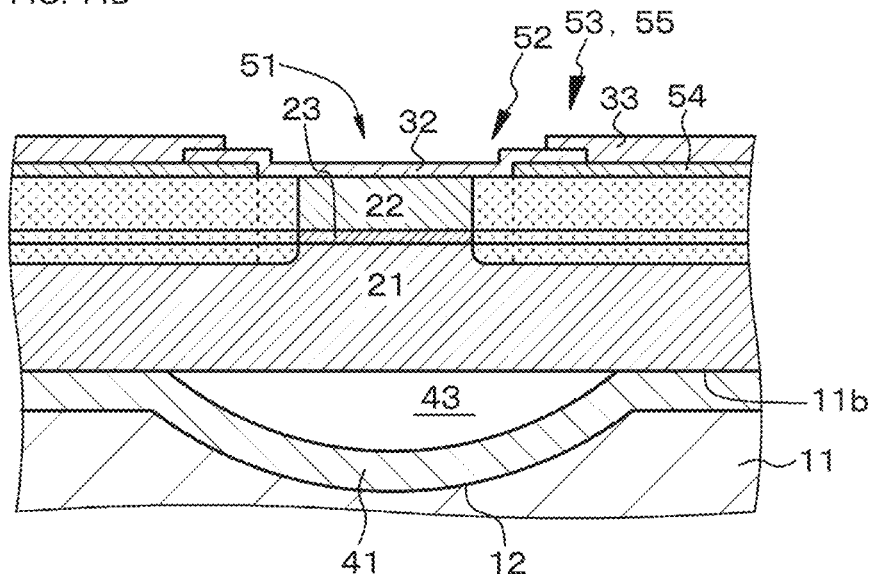
Figure 16:
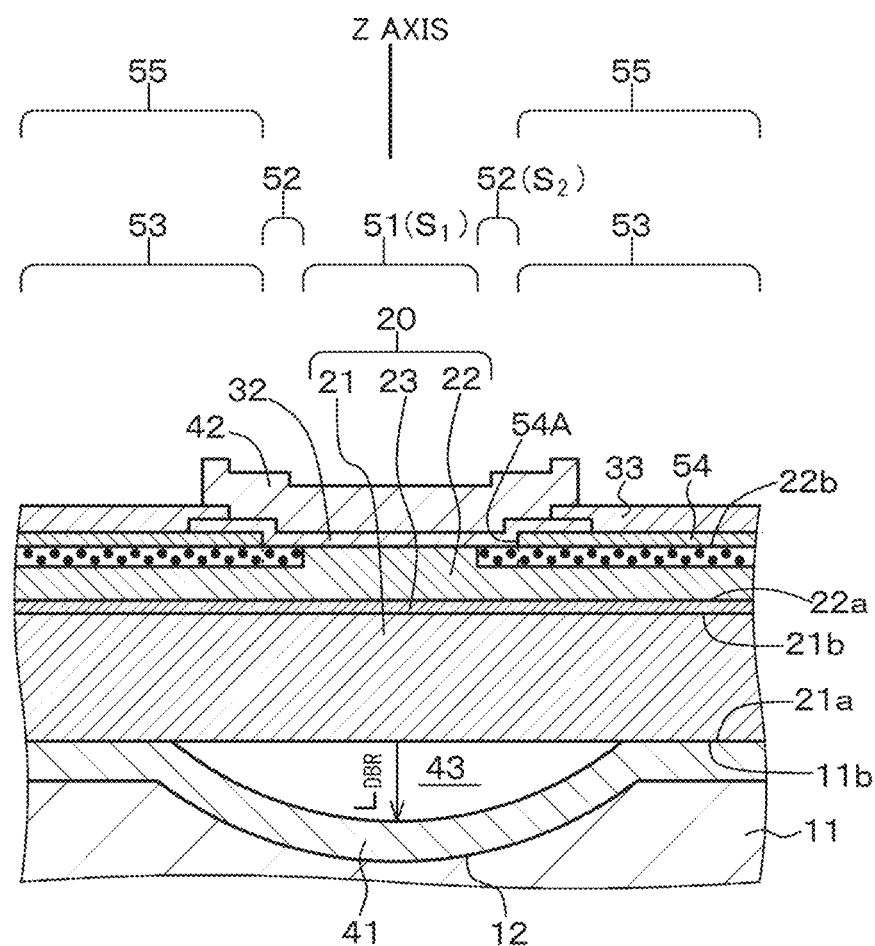
FIG. 16 is a schematic partial end view of a light emitting element of Embodiment 5.
Figure 17:
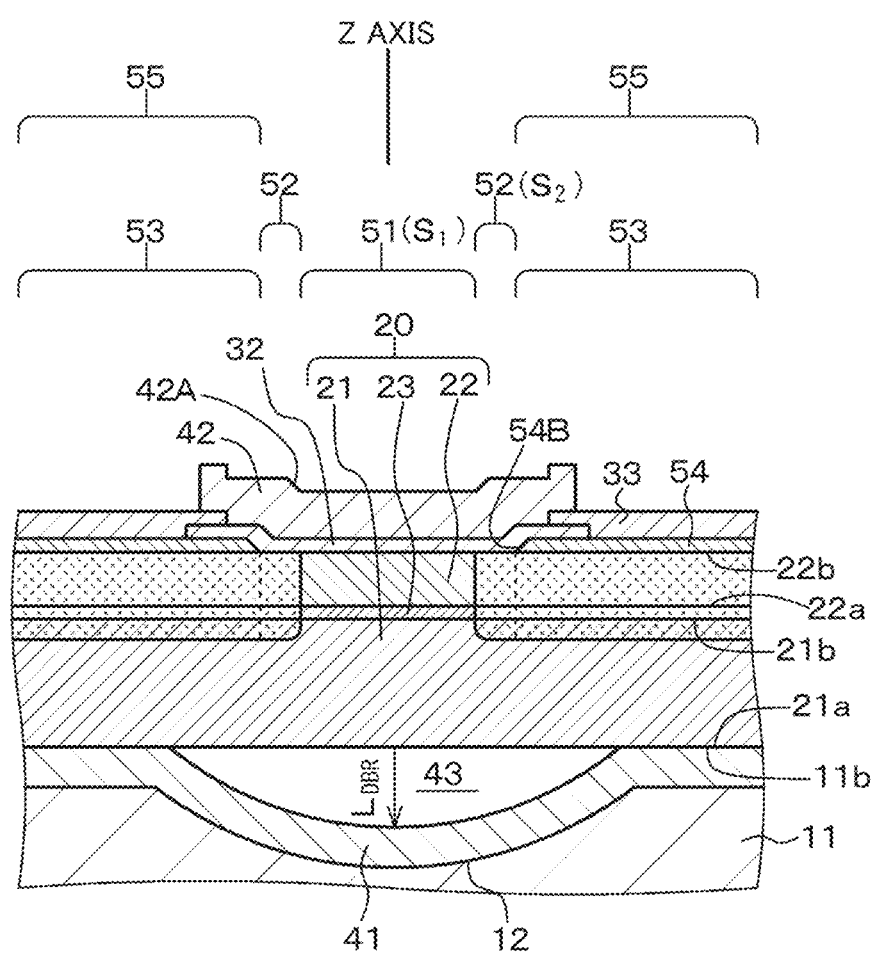
FIG. 17 is a schematic partial end view of a light emitting element of Embodiment 6.

After that, the light emitting element of Embodiment 4 can be obtained by carrying out steps similar to [Step-140] to [Step-150] of Embodiment 1. The structure obtained in the course of a step similar to [Step-130] is shown in FIG. 14B.

In the light emitting element of Embodiment 4, the layered structure is formed with the current injection region, the current non-injection inner region surrounding the current injection region, and the current non-injection outer region surrounding the current non-injection inner region, and the orthogonal projection image of the mode loss action region and the orthogonal projection image of the current non-injection outer region overlap with each other. That is, the current injection region and the mode loss action region are partitioned (separated) from each other by the current non-injection inner region. Therefore, as shown in a conceptual diagram of FIG. 15B, a variation (specifically, an increase in Embodiment 4) in an oscillation mode loss can be set to a desired state. Alternatively, the variation in the oscillation mode loss can be set to a desired state by determining, as appropriate, the positional relationship between the current injection region and the mode loss action region, the thickness of the mode loss action site constituting the mode loss action region, and the like. As a result, it is possible to solve problems in the conventional light emitting element, such as an increase in the threshold current and a deterioration in the slope efficiency. For example, the threshold current can be reduced by reducing the oscillation mode loss in the fundamental mode. Moreover, since the region where the oscillation mode loss is caused and the region into which the current is injected and which contributes to light emission can be controlled independently, that is, since control of the oscillation mode loss and control of the light emitting state of the light emitting element can be performed independently, the degree of freedom of control and the degree of freedom in designing the light emitting element can be increased. Specifically, by setting the current injection region, the current non-injection region, and the mode loss action region in the above-mentioned predetermined arrangement relationship, the magnitude relationship of the oscillation mode loss caused by the mode loss action region with respect to the fundamental mode and the higher order mode can be controlled, and the fundamental mode can be further stabilized by relatively increasing the oscillation mode loss caused to the higher order mode with respect to the oscillation mode loss caused to the fundamental mode. Moreover, since the light emitting element of Embodiment 4 has the concave surface portion 12, generation of diffraction loss can be suppressed more reliably.

Embodiment 5

Embodiment 5 is a modification of Embodiment 4 and relates to a light emitting element having the second-B configuration. As shown in a schematic partial cross-sectional view in FIG. 16, in the light emitting element of Embodiment 5, the current non-injection inner region 52 and the current non-injection outer region 53 are formed by plasma irradiation of the second surface of the second compound semiconductor layer 22, by ashing treatment of the second surface of the second compound semiconductor layer 22, or by reactive ion etching (RIE) treatment of the second surface of the second compound semiconductor layer 22. Since the current non-injection inner region 52 and the current non-injection outer region 53 are thus exposed to plasma particles (specifically, argon, oxygen, nitrogen, and the like), conductivity of the second compound semiconductor layer 22 is deteriorated, and the current non-injection inner region 52 and the current non-injection outer region 53 are brought into a high-resistance state. That is, the current non-injection inner region 52 and the current non-injection outer region 53 are formed by exposure of the second surface 22b of the second compound semiconductor layer 22 to plasma particles. In FIG. 16, FIG. 17, FIG. 18, FIG. 19, and FIG. 20, illustration of the first electrode 31 is omitted.

In Embodiment 5, the shape of the boundary between the current injection region 51 and the current non-injection inner region 52 is circular (diameter: 10 μm), and the shape of the boundary between the current non-injection inner region 52 and the current non-injection outer region 53 is circular (diameter: 15 μm). That is, assuming that the area of the orthogonal projection image of the current injection region 51 is $S_1$ and the area of the orthogonal projection image of the current non-injection inner region 52 is $S_2$, $$0.01 \leq S_1/(S_1+S_2) \leq 0.7$$

is satisfied. Specifically, $$S_1/(S_1+S_2) = 10^2/15^2 = 0.44.$$

In Embodiment 5, the current non-injection inner region 52 and the current non-injection outer region 53 may be formed in the layered structure 20 on the basis of plasma irradiation of the second surface of the second compound semiconductor layer 22, ashing treatment of the second surface of the second compound semiconductor layer 22, or reactive ion etching treatment of the second surface of the second compound semiconductor layer 22 instead of [Step-410] of Embodiment 4.

Except for the above-mentioned points, the configuration and structure of the light emitting element of Embodiment 5 can be the same as the configuration and structure of the light emitting element of Embodiment 4, and thus detailed description thereof is omitted.

In the light emitting element of Embodiment 5 or Embodiment 6 described hereinbelow, the magnitude relationship of the oscillation mode loss that is caused by the mode loss action region to the fundamental mode and the higher order mode can also be controlled by setting the current injection region, the current non-injection region, and the mode loss action region into the above-mentioned predetermined arrangement relationship, and by relatively increasing the oscillation mode loss caused to the higher order mode with respect to the oscillation mode loss caused to the fundamental mode, the fundamental mode can be further stabilized.

Embodiment 6

Embodiment 6 is a modification of Embodiment 4 and Embodiment 5 and relates to a light emitting element having the second-C configuration. As shown by a schematic partial cross-sectional view in FIG. 17, in the light emitting element of Embodiment 6, the second light reflecting layer 42 has a region that reflects or dissipates the light from the first light reflecting layer 41 toward the outside of the resonator structure configured of the first light reflecting layer 41 and the second light reflecting layer 42 (that is, toward the mode loss action region 55). Specifically, a portion of the second light reflecting layer 42 located above the side wall (side wall of the opening 54B) of the mode loss action site (mode loss action layer) 54 has a forward-tapered inclined portion 42A, or has a region that is convexly curved toward the first light reflecting layer 41.

In Embodiment 6, the shape of the boundary between the current injection region 51 and the current non-injection inner region 52 was circular (diameter: 8 μm), and the shape of the boundary between the current non-injection inner region 52 and the current non-injection outer region 53 was circular (diameter: 10 μm to 20 μm).

In Embodiment 6, in a step similar to [Step-420] of Embodiment 4, the opening 54B having the forward-tapered side wall may be formed when forming the mode loss action site (mode loss action layer) 54 having the opening 54B and composed of $SiO_2$. Specifically, a resist layer is formed on the mode loss action layer formed on the second surface 22b of the second compound semiconductor layer 22, and an opening is provided on the basis of photolithography technique in a portion of the resist layer on which the opening 54B is to be formed. The side wall of this opening region is tapered forward on the basis of a well-known method. Then, by performing etch back, the opening 54B having the forward-tapered side wall can be formed at the mode loss action site (mode loss action layer) 54. Further, the second light reflecting layer 42 can be provided with the forward-tapered inclined portion 42A by forming the second electrode 32 and the second light reflecting layer 42 on such a mode loss action site (mode loss action layer) 54.

Except for the above-mentioned points, the configuration and structure of the light emitting element of Embodiment 6 can be the same as the configuration and structure of the light emitting elements of Embodiment 4 and Embodiment 5, so detailed description thereof will be omitted.

Embodiment 7

Figure 18:
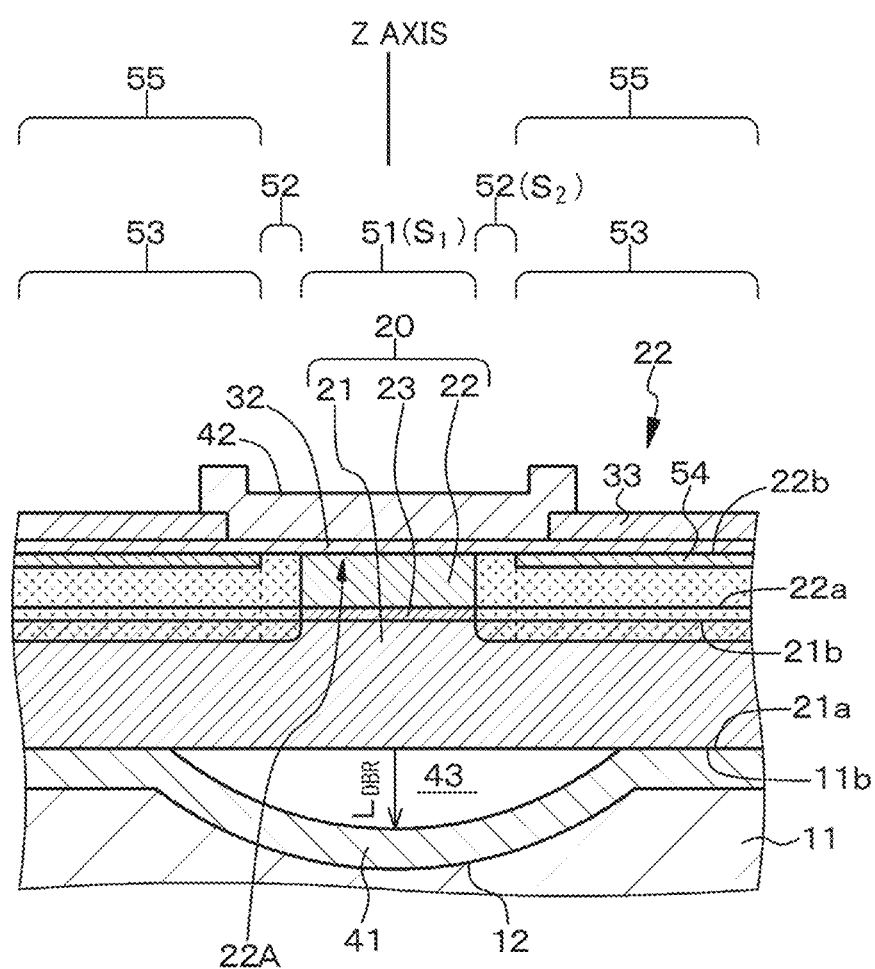
FIG. 18 is a schematic partial end view of a light emitting element of Embodiment 7.
Figure 19:
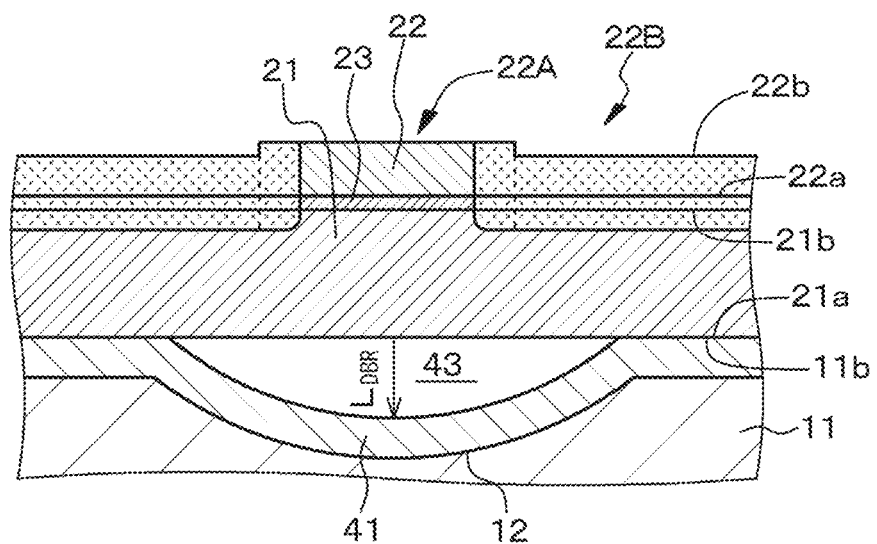
FIG. 19 is a schematic partial end view in which the main part of the light emitting element of Embodiment 7 shown in FIG. 18 is cut out.

Embodiment 7 is a modification of Embodiment 4 to Embodiment 6, and relates to a light emitting element having the second-D configuration. As shown in a schematic partial cross-sectional view of the light emitting element of Embodiment 7 in FIG. 18 and as shown in a schematic partial cross-sectional view obtained by cutting out an essential part in FIG. 19, a projecting portion 22A is formed on the second surface 22b side of the second compound semiconductor layer 22. Then, as shown in FIGS. 18 and 19, the mode loss action site (mode loss action layer) 54 is formed on the region 22B of the second surface 22b of the second compound semiconductor layer 22 surrounding the projecting portion 22A. The projecting portion 22A occupies the current injection region 51, the current injection region 51, and the current non-injection inner region 52. The mode loss action site (mode loss action layer) 54 is composed of, for example, a dielectric material such as $SiO_2$, as in Embodiment 4. The region 22B is provided with the current non-injection outer region 53. Assuming that the optical distance from the active layer 23 in the current injection region 51 to the second surface of the second compound semiconductor layer 22 is $L_2$, and the optical distance from the active layer 23 in the mode loss action region 55 to the top surface (surface that is opposite to the second electrode 32) of the mode loss action site 54 is $L_0$, $$L_0 < L_2$$

is satisfied. Specifically, $$L_2/L_0 = 1.5.$$

As a result, a lens effect is generated in the light emitting element.

In the light emitting element of Embodiment 7, the generated laser light having a higher order mode is confined in the current injection region 51 and the current non-injection inner region 52 by the mode loss action region 55, and thus the oscillation mode loss is reduced. That is, the resulting light field intensities in the fundamental mode and the higher order mode increase in the orthogonal projection image of the current injection region 51 and the current non-injection inner region 52 due to the presence of the mode loss action region 55 acting on a variation in the oscillation mode loss.

In Embodiment 7, the shape of the boundary between the current injection region 51 and the current non-injection inner region 52 was circular (diameter: 8 μm), and the shape of the boundary between the current non-injection inner region 52 and the current non-injection outer region 53 was circular (diameter: 30 μm).

In Embodiment 7, the projecting portion 22A may be formed by removing a part of the second compound semiconductor layer 22 from the second surface 22b side between [Step-410] and [Step-420] of Embodiment 4.

Except for the above-mentioned points, the configuration and structure of the light emitting element of Embodiment 7 can be the same as the configuration and structure of the light emitting element of Embodiment 4, and thus detailed description thereof will be omitted. In the light emitting element of Embodiment 7, it is possible to suppress the oscillation mode loss caused by the mode loss action region for various modes, and not only induce the transverse mode oscillations in multiple modes, but also reduce the threshold value of laser oscillation. Further, as shown by the conceptual diagram of FIG. 15C, the resulting light field intensities in the fundamental mode and the higher order mode can be increased in the orthogonal projection images of the current injection region and the current non-injection inner region due to the presence of the mode loss action region acting on a variation (specifically, a decrease in Embodiment 7) in an oscillation mode loss.

Embodiment 8

Embodiment 8 is a modification of Embodiment 1 to Embodiment 7 and relates to a light emitting element having the third configuration.

Assuming that the equivalent refractive index of the entire layered structure is $n_{eq}$ and the wavelength of laser light to be emitted from a surface emitting laser element (light emitting element) is $\lambda_0$, the resonator length $L_{OR}$ in the layered structure configured of two DBR layers and the layered structure formed therebetween is represented by $$L = (m \cdot \lambda_0)/(2 \cdot n_{eq}).$$

Here, m is a positive integer. The wavelength that can be oscillated in the surface emitting laser element (light emitting element) is determined by the resonator length $L_{OR}$. The individual oscillation modes in which oscillations are possible are called longitudinal modes. Among the longitudinal modes, laser oscillations can occur in the mode that matches the gain spectrum determined by the active layer. The interval $\Delta\lambda$ of the longitudinal mode is represented by $$\lambda_0^2/(2n_{eff} \cdot L),$$

where $n_{eff}$ is the effective refractive index. That is, the longer the resonator length $L_{OR}$, the narrower the interval $\Delta\lambda$ of the longitudinal mode. Therefore, where the resonator length $L_{OR}$ is long, a plurality of longitudinal modes can be present in the gain spectrum, so that oscillations can occur in a plurality of longitudinal modes. The equivalent refractive index $n_{eq}$ and the effective refractive index $n_{eff}$ have the following relationship when the oscillation wavelength is $\lambda_0$.

$$n_{eff} = n_{eq} - \lambda_0 \cdot (dn_{eq}/d\lambda_0)$$

Figure 26A:
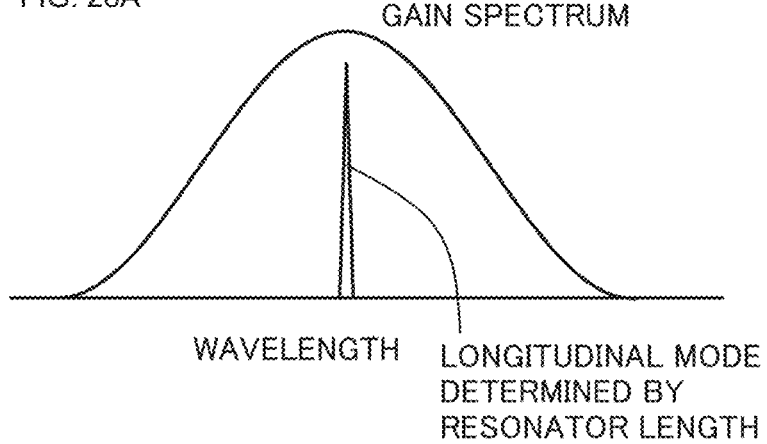
FIGS. 26A and 26B are conceptual diagrams schematically showing the longitudinal modes present in the gain spectrum determined by the active layer.
Figure 26B:
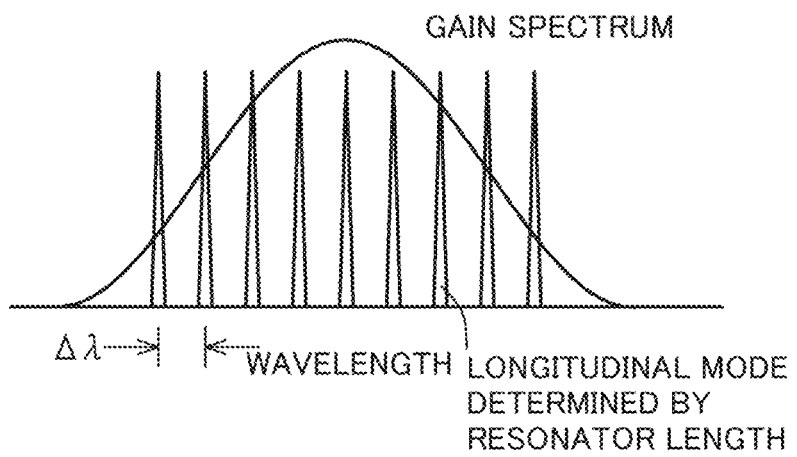

Here, where the layered structure is configured of a GaAs-based compound semiconductor layer, the resonator length $L_{OR}$ is usually as short as 1 μm or less, and there is one type (one wavelength) of laser light in the longitudinal mode emitted from the surface emitting laser element (see the conceptual diagram of FIG. 26A). Therefore, it is possible to accurately control the oscillation wavelength of the laser light in the longitudinal mode emitted from the surface emitting laser element. Meanwhile, when the layered structure is composed of a GaN-based compound semiconducting layer, the resonator length $L_{OR}$ is usually several times as long as the wavelength of the laser light emitted from the surface emitting laser element. Therefore, there is a plurality of types of laser light in the longitudinal mode that can be emitted from the surface emitting laser element (see the conceptual diagram of FIG. 26B).

Figure 20:
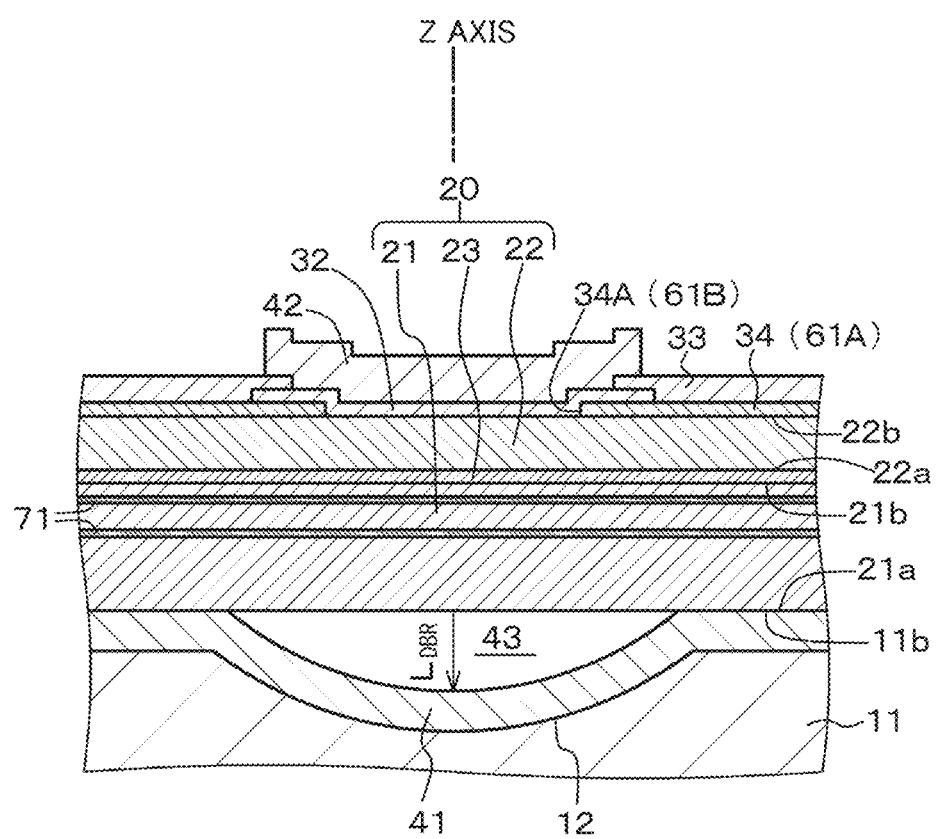
FIG. 20 is a schematic partial end view of a light emitting element of Embodiment 8.

As shown by a schematic partial end view in FIG. 20, in the light emitting element of Embodiment 8 or the light emitting elements of Embodiment 9 and Embodiment 10 described hereinbelow, in the layered structure 20 including the second electrode 32, at least two light absorbing material layers 71, preferably at least four light absorbing material layers 71, and specifically twenty light absorbing material layers 71 are formed in parallel with the virtual plane occupied by the active layer 23 in Embodiment 8. In order to simplify the drawing, only two light absorbing material layers 71 are shown in the drawing.

In Embodiment 8, the oscillation wavelength (desirable oscillation wavelength emitted from the light emitting element) $\lambda_0$ is 450 nm. Twenty light absorbing material layers 71 are composed of a compound semiconductor material having a narrower bandgap than the compound semiconductor constituting the layered structure 20, specifically, of n-$In_{0.2}Ga_{0.8}N$, and are formed inside the first compound semiconductor layer 21. The thickness of the light absorbing material layer 71 is $\lambda_0/(4 \cdot n_{eq})$ or less, specifically 3 nm. The light absorption coefficient of the light absorbing material layer 71 is at least twice, specifically, $1 \times 10^3$ times the light absorption coefficient of the first compound semiconductor layer 21 composed of the n-GaN layer.

Further, the light absorbing material layer 71 is located in the lowest amplitude portion appearing in the light standing wave formed inside the layered structure, and the active layer 23 is located in the maximum amplitude portion appearing in the light standing wave formed inside the layered structure. The distance between the center in the thickness direction of the active layer 23 and the center in the thickness direction of the light absorbing material layer 71 adjacent to the active layer 23 is 46.5 nm. Further, assuming that the overall equivalent refractive index of the two light absorbing material layers 71 and the portion of the layered structure located between the light absorbing material layer 71 and the light absorbing material layer 71 (specifically, the first compound semiconductor layer 21 in Embodiment 8) is $n_{eq}$, and the distance between the light absorbing material layer 71 and the light absorbing material layer 71 is $L_{Abs}$, $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied. Here, m is 1 or an arbitrary integer of 2 or more including 1.

However, in Embodiment 8, m=1 was set. Therefore, the distance between the adjacent light absorbing material layers 71 in the entire plurality of light absorbing material layers 71 (twenty light absorbing material layers 71) is $$0.9 \times \{\lambda_0/(2 \cdot n_{eq})\} \leq L_{Abs} \leq 1.1 \times \{\lambda_0/(2 \cdot n_{eq})\}.$$

Where the value of the equivalent refractive index $n_{eq}$ is specifically 2.42 and m=1 is set, specifically, $$L_{Abs} = 1 \times 450/(2 \times 2.42) = 93.0 \text{ nm}.$$

In some of the light absorbing material layers 71 among the twenty light absorbing material layers 71, m may be an arbitrary integer of 2 or more.

In the manufacture of the light emitting element of Embodiment 8, the layered structure 20 is formed in a step similar to [Step-120] of Embodiment 1, but at this time, twenty light absorbing material layers 71 are all together formed inside the first compound semiconductor layer 21. Except for this point, the light emitting element of Embodiment 8 can be manufactured by a method similar to that of the light emitting element of Embodiment 1.

Figure 21:
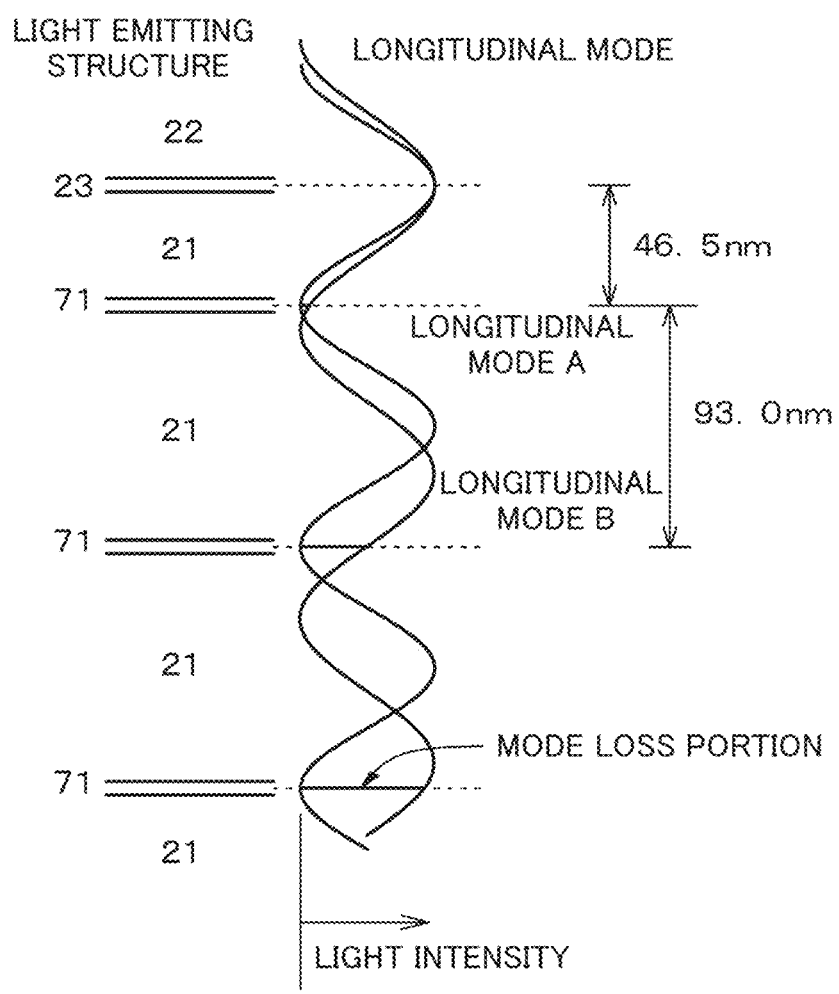
FIG. 21 is a schematic partial end view of a light emitting element of Embodiment 8 and a diagram in which two longitudinal modes of a longitudinal mode A and a longitudinal mode B are superimposed.

FIG. 21 schematically represents the case where a plurality of longitudinal modes occurs in the gain spectrum determined by the active layer 23. In FIG. 21, two longitudinal modes, a longitudinal mode A and a longitudinal mode B, are shown. In this case, it is assumed that the light absorbing material layer 71 is located in the lowest amplitude portion of the longitudinal mode A and is not located in the lowest amplitude portion of the longitudinal mode B. Accordingly, the mode loss in the longitudinal mode A is minimized, but the mode loss in the longitudinal mode B is large. In FIG. 21, the mode loss portion of the longitudinal mode B is schematically shown by a solid line. Therefore, oscillations are more likely to occur in the longitudinal mode A than the longitudinal mode B. Therefore, by using such a structure, that is, by controlling the position and period of the light absorbing material layer 71, a specific longitudinal mode can be stabilized and oscillation can be facilitated. Meanwhile, since the mode loss for the other undesired longitudinal modes can be increased, it is possible to suppress the oscillation in the other undesired longitudinal modes.

As described above, in the light emitting element of Embodiment 8, since at least two light absorbing material layers are formed inside the layered structure, the oscillation of laser light in an undesired longitudinal mode, in the laser light in a plurality of types of longitudinal modes that can be emitted from the surface-emitting laser element, can be suppressed more effectively. As a result, it becomes possible to control the oscillation wavelength of the emitted laser light more accurately. Moreover, since the light emitting element of Embodiment 8 also has the concave surface portion 12, the occurrence of diffraction loss can be reliably suppressed.

Embodiment 9

Embodiment 9 is a modification of Embodiment 8. In Embodiment 8, the light absorbing material layer 71 was configured of a compound semiconductor material having a narrower bandgap than the compound semiconductor constituting the layered structure 20. Meanwhile, in Embodiment 9, the ten light absorbing material layers 71 are configured of a compound semiconductor material doped with an impurity, specifically, a compound semiconductor material (specifically, n-GaN:Si) having an impurity concentration (impurity: Si) of $1\times10^{19}/cm^3$ (impurity: Si). Further, in Embodiment 9, the oscillation wavelength $\lambda_0$ was set to 515 nm. The composition of the active layer 23 is $In_{0.3}Ga_{0.7}N$. In Embodiment 9, m=1, the value of $L_{Abs}$ is 107 nm, the distance between the center in the thickness direction of the active layer 23 and the center in the thickness direction of the light absorbing material layer 71 adjacent to the active layer 23 is 53.5 nm, and the thickness of the light absorbing material layer 71 is 3 nm. Except for the above points, the configuration and structure of the light emitting element of Embodiment 9 can be the same as the configuration and structure of the light emitting element of Embodiment 8, and therefore detailed description thereof will be omitted. For some of the light absorbing material layers 71 among the ten light absorbing material layers 71, m may be an arbitrary integer of 2 or more.

Embodiment 10

Embodiment 10 is also a modification of Embodiment 8. In Embodiment 10, the five light absorbing material layers (referred to as "first light absorbing material layer" for convenience) have the same configuration as the light absorbing material layer 71 of Embodiment 8, that is, are configured of $n-In_{0.3}Ga_{0.7}N$. Furthermore, in Embodiment 10, one light absorbing material layer (referred to as a "second light absorbing material layer" for convenience) was configured of a transparent conductive material. Specifically, the second light absorbing material layer was also used as the second electrode 32 composed of ITO. In Embodiment 10, the oscillation wavelength $\lambda_0$ was set to 450 nm. Further, m=1 and 2 were set. Where m=1, the value of $L_{Abs}$ is 93.0 nm, the distance between the center of the active layer 23 in the thickness direction and the center in the thickness direction of the first light absorbing material layer adjacent to the active layer 23 is 46.5 nm, and the thickness of the five first light absorbing material layers is 3 nm. That is, in the five first light absorbing material layers, $$0.9\times\{\lambda_0/(2\cdot n_{eq})\} \leq L_{Abs} \leq 1.1\times\{\lambda_0/(2\cdot n_{eq})\}$$

is satisfied. Further, the first light absorbing material layer adjacent to the active layer 23 and the second light absorbing material layer were set to m=2. That is, $$0.9\times\{(2\cdot\lambda_0)/(2\cdot n_{eq})\} \leq L_{Abs} \leq 1.1\times\{(2\cdot\lambda_0)/(2\cdot n_{eq})\}$$

is satisfied.

The light absorption coefficient of the second light absorbing material layer that also serves as the second electrode 32 is 2000 $cm^{-1}$, the thickness is 30 nm, and the distance from the active layer 23 to the second light absorbing material layer is 139.5 nm. Except for the above points, the configuration and structure of the light emitting element of Embodiment 10 can be the same as the configuration and structure of the light emitting element of Embodiment 8, and therefore detailed description thereof will be omitted. In some first light absorbing material layers of the five first light absorbing material layers, m may be set to an arbitrary integer of at least 2. Unlike Embodiment 8, the number of the light absorbing material layers 71 can be set to 1. In this case, the positional relationship between the second light absorbing material layer that also serves as the second electrode 32 and the light absorbing material layer 71 also needs to satisfy the following formula:

$$0.9\times\{(m\cdot\lambda_0)/(2\cdot n_{eq})\} \leq L_{Abs} \leq 1.1\times\{(m\cdot\lambda_0)/(2\cdot n_{eq})\}$$

While the present disclosure has been described based on preferred embodiments, the present disclosure is not to be limited to these embodiments. The configurations and structures of the light emitting elements described in the embodiments are merely illustrative and can be modified, as appropriate, and methods for manufacturing the light emitting elements can also be modified, as appropriate. In some cases, the second light reflecting layer may be supported by a support substrate. Further, a surface-emitting laser element in which light is emitted from the top surface of the second compound semiconductor layer via the second light reflecting layer can be realized by suitably selecting the bonding layer and the support substrate.

The present disclosure may also have the following configurations.

[A01]
<Light Emitting Element: First Mode>
A light emitting element comprising:
a layered structure in which
a first compound semiconductor layer having a first surface and a second surface that is opposite to the first surface,
an active layer facing the second surface of the first compound semiconductor layer, and
a second compound semiconductor layer having a first surface facing the active layer and a second surface that is opposite to the first surface
are layered;
a substrate;
a first light reflecting layer arranged on the first surface side of the first compound semiconductor layer; and
a second light reflecting layer arranged on the second surface side of the second compound semiconductor layer, wherein
the second light reflecting layer has a flat shape;
a concave surface portion is formed on a substrate surface;
the first light reflecting layer is formed on at least the concave surface portion;
the first compound semiconductor layer is formed to extend from the substrate surface onto the concave surface portion; and
a cavity is present between the first light reflecting layer formed on the concave surface portion and the first compound semiconductor layer.

[A02]
<Light Emitting Element: Second Mode>
A light emitting element comprising:
a layered structure in which
a first compound semiconductor layer having a first surface and a second surface that is opposite to the first surface,
an active layer facing the second surface of the first compound semiconductor layer, and
a second compound semiconductor layer having a first surface facing the active layer and a second surface that is opposite to the first surface are layered;
a substrate;
a first light reflecting layer arranged on the first surface side of the first compound semiconductor layer; and a second light reflecting layer arranged on the second surface side of the second compound semiconductor layer, wherein the second light reflecting layer has a flat shape;

a concave surface portion is formed on a substrate surface;

the first light reflecting layer is formed on at least the concave surface portion;

the first compound semiconductor layer is formed to extend from the substrate surface onto the concave surface portion; and a material different from a material constituting the first compound semiconductor layer is filled between the first light reflecting layer formed on the concave surface portion and the first compound semiconductor layer.

[A03]

<Light Emitting Element: Third Mode>

A light emitting element comprising:

a layered structure in which a first compound semiconductor layer having a first surface and a second surface that is opposite to the first surface, an active layer facing the second surface of the first compound semiconductor layer, and a second compound semiconductor layer having a first surface facing the active layer and a second surface that is opposite to the first surface are layered;

a substrate;

a first light reflecting layer arranged on the first surface side of the first compound semiconductor layer; and a second light reflecting layer arranged on the second surface side of the second compound semiconductor layer, wherein the second light reflecting layer has a flat shape;

a concave surface portion is formed on a substrate surface;

the first light reflecting layer is formed on at least the concave surface portion;

the first compound semiconductor layer is formed to extend from the substrate surface onto the concave surface portion;

a material having a refractive index $n_2$ is filled between the first light reflecting layer formed on the concave surface portion and the first compound semiconductor layer; and assuming that a refractive index of a material constituting the first compound semiconductor layer is $n_1$, $n_1 \neq n_2$ is satisfied.

[A04]

The light emitting element as described in [A03], wherein $|n_2-n_1| \geq 1.0$ is satisfied.

[A05]

The light emitting element as described in [A03] or [A04], wherein the material having the refractive index $n_2$ is different from the material constituting the first compound semiconductor layer.

[A06]

<Light Emitting Element: Fourth Mode>

A light emitting element comprising:

a layered structure in which a first compound semiconductor layer having a first surface and a second surface that is opposite to the first surface, an active layer facing the second surface of the first compound semiconductor layer, and a second compound semiconductor layer having a first surface facing the active layer and a second surface that is opposite to the first surface are layered;

a substrate;

a first light reflecting layer arranged on the first surface side of the first compound semiconductor layer; and a second light reflecting layer arranged on the second surface side of the second compound semiconductor layer, wherein the second light reflecting layer has a flat shape;

a concave surface portion is formed on a substrate surface;

the first light reflecting layer is formed on at least the concave surface portion;

the first compound semiconductor layer is formed to extend from the substrate surface onto the concave surface portion;

a resonator structure is configured of the first reflecting layer formed on the concave surface portion and a portion of the first compound semiconductor layer above the concave surface portion; and a length of the resonator structure is such that main light having an oscillation wavelength $\lambda_0$ emitted from the active layer satisfies a resonance condition of the resonator structure, and light having a wavelength $\lambda'$ adjacent to the oscillation wavelength $\lambda_0$ does not satisfy the resonance condition of the resonator structure.

[A07]

The light emitting element as described in any one of [A01] to [A06], wherein the substrate is configured of a compound semiconductor substrate.

[A08]

The light emitting element as described in any one of [A01] to [A07], wherein the layered structure is composed of a GaN-based compound semiconductor.

[A09]

The light emitting element as described in any one of [A01] to [A08], wherein a meeting portion in which many crystal defects are present is not present on the normal line passing through the center of the concave surface portion.

[A10]

The light emitting element as described in [A09], wherein an orthogonal projection image of the meeting portion on the substrate is not included in the concave surface portion.

[A11]

The light emitting element as described in any one of [A01] to [A10], wherein a figure drawn by a surface of a portion of the first light reflecting layer that is in contact with the concave mirror portion when the first light reflecting layer is cut in a virtual plane including the layering direction of the layered structure, this surface being opposite to the first compound semiconductor layer, is a part of a circle or a part of a parabola.

[B01]

<Light Emitting Element Having First Configuration>

The light emitting element as described in any one of [A01] to [A11], wherein a current injection region and a current non-injection region surrounding the current injection region are provided in the second compound semiconductor layer, and the shortest distance Do from an area center of gravity of the current injection region to the boundary between the current injection region and the current non-injection region satisfies the following formula.

$$D_{CI} \geq \omega_0/2$$

where $$\omega_0^2 \equiv (\lambda_0/\pi)\{L_{OR}(R_{DBR}-L_{OR})\}^{1/2}$$

here
$\lambda_0$: oscillation wavelength
$L_{OR}$: resonator length
$R_{DBR}$: radius of curvature of the concave mirror portion of the first light reflecting layer.

[B02]
The light emitting element as described in [B01], further including
 a mode loss action site that is provided on the second surface of the second compound semiconductor layer and constitutes a mode loss action region acting on a variation in an oscillation mode loss, and
 a second electrode formed to extend from above the second surface of the second compound semiconductor layer onto the mode loss action site, wherein
 the layered structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other.

[B03]
The light emitting element as described in [B01] or [B02], wherein the radius $r'_{DBR}$ of an effective region of the first light reflecting layer satisfies $$\omega_0 \leq r'_{DBR} \leq 20 \cdot \omega_0.$$

[B04]
The light emitting element as described in any one of [B01] to [B03], wherein $$D_{CI} \geq \omega_0$$

is satisfied.

[B05]
The light emitting element as described in any one of [B01] to [B04], wherein $$R_{DBR} \leq 1 \times 10^3 \, m$$

is satisfied.

[C01]
<Light Emitting Element Having Second Configuration>
A light emitting element as described in any one of [A01] to [A11], further including
 a mode loss action site that is provided on the second surface of the second compound semiconductor layer and constitutes a mode loss action region acting on a variation in an oscillation mode loss, and
 a second electrode formed to extend from above the second surface of the second compound semiconductor layer onto the mode loss action site, and
 the layered structure is formed with a current injection region, a current non-injection inner region surrounding the current injection region, and a current non-injection outer region surrounding the current non-injection inner region, and
 an orthogonal projection image of the mode loss action region and the orthogonal projection image of the current non-injection outer region overlap with each other.

[C02]
The light emitting element as described in [C01], wherein the current non-injection outer region is located below the mode loss action region.

[C03]
The light emitting element as described in [C01] or [C02], wherein assuming that the area of the orthogonal projection image of the current injection region is $S_1$ and the area of the orthogonal projection image of the current non-injection inner region is $S_2$, $$0.01 \leq S_1/(S_1+S_2) \leq 0.7$$

is satisfied.

[C04]
<Light Emitting Element Having Second-A Configuration>
The light emitting element as described in any one of [C01] to [C03], wherein the current non-injection inner region and the current non-injection outer region are formed by ion implantation into the layered structure.

[C05]
The light emitting element as described in [C04], wherein the ion species is at least one kind of ion selected from the group consisting of boron, proton, phosphorus, arsenic, carbon, nitrogen, fluorine, oxygen, germanium and silicon.

[C06]
<Light Emitting Element Having Second-B Configuration>
The light emitting element as described in any one of [C01] to [C05], wherein the current non-injection inner region and the current non-injection outer region are formed by plasma irradiation of the second surface of the second compound semiconductor layer, by ashing treatment of the second surface of the second compound semiconductor layer, or by reactive ion etching treatment of the second surface of the second compound semiconductor layer.

[C07]
<Light Emitting Element Having Second-C Configuration>
The light emitting element as described in any one of [C01] to [C06], wherein the second light reflecting layer has a region that reflects or scatters the light from the first light reflecting layer toward the outside of the resonator structure configured of the first light reflecting layer and the second light reflecting layer.

[C08]
The light emitting element as described in any one of [C04] to [C07], wherein assuming that the optical distance from the active layer in the current injection region to the second surface of the second compound semiconductor layer is $L_2$ and the optical distance from the active layer in the mode loss action region to the top surface of the mode loss action site is $L_0$, $$L_0 > L_2$$

is satisfied.

[C09]
The light emitting element as described in any one of [C04] to [C08], wherein
 the generated light having a higher order mode is scattered toward the outside of the resonator structure configured of the first light reflecting layer and the second light reflecting layer by the mode loss action region, and thus the oscillation mode loss increases.

[C10]

The light emitting element as described in any one of [C04] to [C09], wherein
the mode loss action site is composed of a dielectric material, a metal material, or an alloy material.

[C11]
The light emitting element as described in [C10], wherein
the mode loss action site is composed of a dielectric material, and
the optical thickness of the mode loss action site is a value deviating from an integral multiple of ¼ of the wavelength of light generated in the light emitting element.

[C12]
The light emitting element as described in [C10], wherein
the mode loss action site is composed of a dielectric material, and
the optical thickness of the mode loss action site is an integral multiple of ¼ of the wavelength of light generated in the light emitting element.

[C13]
<Light Emitting Element Having Second-D Configuration>
The light emitting element as described in any one of [C01] to [C03], wherein
a projecting portion is formed on the second surface side of the second compound semiconductor layer, and
the mode loss action site is formed on a region of the second surface of the second compound semiconductor layer surrounding the projecting portion.

[C14]
The light emitting element as described in [C13], wherein
assuming that the optical distance from the active layer in the current injection region to the second surface of the second compound semiconductor layer is $L_2$ and the optical distance from the active layer in the mode loss action region to the top surface of the mode loss action site is $L_0$, $$L_0 < L_2$$

is satisfied.

[C15]
The light emitting element as described in [C13] or [C14], wherein
the generated light having a higher order mode is confined in the current injection region and the current non-injection inner region by the mode loss action region, and thus the oscillation mode loss is reduced.

[C16]
The light emitting element as described in any one of [C13] to [C15], wherein the mode loss action site is composed of a dielectric material, a metal material, or an alloy material.

[C17]
The light emitting element as described in any one of [C01] to [C16], wherein the second electrode is composed of a transparent conductive material.

[D01]
<Light Emitting Element Having Third Configuration>
The light emitting element as described in any one of [A01] to [C17], wherein in the layered structure including the second electrode, at least two light absorbing material layers are formed in parallel with a virtual plane occupied by the active layer.

[D02]
The light emitting element as described in [D01], wherein at least four light absorbing material layers are formed.

[D03]
The light emitting element as described in [D01] or [D02], wherein assuming that the oscillation wavelength is $\lambda_0$, the equivalent refractive index of two light absorbing material layers and the entire portion of the layered structure located between the light absorbing material layer and the light absorbing material layer is $n_{eq}$, and the distance between the light absorbing material layer and the light absorbing material layer is $L_{Abs}$, $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied.

Here, m is 1 or any integer of 2 or more including 1.

[D04]
The light emitting element as described in any one of [D01] and [D03], wherein the thickness of the light absorbing material layer is $\lambda_0/(4 \cdot n_{eq})$ or less.

[D05]
The light emitting element as described in any one of [D01] to [D04], wherein the light absorbing material layer is located at the lowest amplitude portion generated in a standing wave of light formed inside the layered structure.

[D06]
The light emitting element as described in any one of [D01] to [D05], wherein the active layer is located at the maximum amplitude portion generated in a standing wave of light formed inside the layered structure.

[D07]
The light emitting element as described in any one of [D01] to [D06], wherein the light absorbing material layer has a light absorption coefficient at least twice the light absorption coefficient of the compound semiconductor constituting the layered structure.

[D08]
The light emitting element as described in any one of [D01] to [D07], wherein the light absorbing material layer is configured of at least one kind of material selected from the group consisting of a compound semiconductor material having a narrower bandgap than the compound semiconductors constituting the layered structure, a compound semiconductor material doped with an impurity, a transparent conductive material, and a light reflecting layer constituent material having a light absorption characteristic.

[E01]
<Method for Manufacturing Light Emitting Element>
A method for manufacturing a light emitting element comprising the steps of: forming a concave surface portion on a surface of a substrate, then forming a first light reflecting layer on at least the concave surface portion, next forming a layered structure, in which a first compound semiconductor layer, an active layer, and a second compound semiconductor layer are layered, on the substrate surface and above the concave surface portion, and then forming a second light reflecting layer on the second compound semiconductor layer.

[E02]
The method for manufacturing a light emitting element as described in [E01], wherein a cavity is present between the first light reflecting layer formed on the concave surface portion and the first compound semiconductor layer.

[E03]
The method for manufacturing a light emitting element as described in [E01], including a step of filling a material different from a material constituting the first compound semiconductor layer between the first light reflecting layer formed on the concave surface portion and the first compound semiconductor layer.

[E04]
The method for manufacturing a light emitting element as described in [E01], including a step of filling a material having a refractive index $n_2$, which is different from a refractive index $n_1$ of a material constituting the first compound semiconductor layer, between the first light reflecting layer formed on the concave surface portion and the first compound semiconductor layer.

[E05]

The method for manufacturing a light emitting element as described in [E01], wherein
a resonator structure is configured of the first light reflecting layer formed on the concave surface portion and a portion of the first compound semiconductor layer above the concave surface portion, and
a length of the resonator structure is such that main light having an oscillation wavelength $\lambda_0$ emitted from the active layer satisfies a resonance condition of the resonator structure, and light having a wavelength $\lambda'$ adjacent to the oscillation wavelength $\lambda_0$ does not satisfy the resonance condition of the resonator structure.

REFERENCE SIGNS LIST

11 Substrate
11a First surface of substrate
11b Second surface of substrate
12 Convex surface portion
20 Layered structure
21 First compound semiconductor layer
21a First surface of first compound semiconductor layer
21b Second surface of first compound semiconductor layer
22 Second compound semiconductor layer
22a First surface of second compound semiconductor layer
22b Second surface of second compound semiconductor layer
23 Active layer (light emitting layer)
31 First electrode
32 Second electrode
33 Pad electrode
34 Insulating layer (current constriction layer)
34A Opening provided in insulating layer (current constriction layer)
41 First light reflecting layer
42 Second light reflecting layer
43 Void
44 Effective region of first light reflecting layer
45 Filling material
51, 61 Current injection region
52 Current non-injection inner region
53 Current non-injection outer region
54 Mode loss action site (mode loss action layer)
54A, 54B Opening formed at mode loss action site
55 Mode loss action region
71 Light absorbing material layer
81 Resist layer
82 Recess
83 Portion where first light reflecting layer has been removed
84 Meeting portion
85, 86 Hole

The invention claimed is:

1. A light emitting element, comprising:
a layered structure that includes:
a first compound semiconductor layer having a first surface and a second surface opposite to the first surface,
an active layer that faces the second surface of the first compound semiconductor layer, and
a second compound semiconductor layer having a third surface that faces the active layer, and a fourth surface opposite to the third surface;
a substrate;
a first light reflecting layer on a side of the first surface of the first compound semiconductor layer;
a second light reflecting layer on a side of the fourth surface of the second compound semiconductor layer, wherein
the second light reflecting layer has a flat shape,
a surface of the substrate has a concave surface portion,
the first light reflecting layer is on at least the concave surface portion, and
the first compound semiconductor layer extends from the surface of the substrate on the concave surface portion; and
a cavity between the first light reflecting layer and the first compound semiconductor layer.

2. A light emitting element, comprising:
a layered structure that includes:
a first compound semiconductor layer having a first surface and a second surface opposite to the first surface,
an active layer that faces the second surface of the first compound semiconductor layer, and
a second compound semiconductor layer having a third surface that faces the active layer, and a fourth surface opposite to the third surface;
a substrate;
a first light reflecting layer on a side of the first surface of the first compound semiconductor layer; and
a second light reflecting layer on a side of the fourth surface of the second compound semiconductor layer, wherein
the second light reflecting layer has a flat shape,
a surface of the substrate has a concave surface portion,
the first light reflecting layer is on at least the concave surface portion,
the first compound semiconductor layer extends from the surface of the substrate on the concave surface portion,
the first light reflecting layer and a portion of the first compound semiconductor layer on the concave surface portion form a resonator structure,
the active layer is configured to emit first light that have an oscillation wavelength $\lambda_0$,
the oscillation wavelength $\lambda_0$ satisfies a resonance condition of the resonator structure based on a length of the resonator, and
second light having a wavelength $\lambda'$ adjacent to the oscillation wavelength $\lambda_0$ does not satisfy the resonance condition of the resonator structure based on the length of the resonator.

3. The light emitting element according to claim 1, wherein the substrate comprises a compound semiconductor substrate.

4. The light emitting element according to claim 1, wherein the layered structure comprises a GaN-based compound semiconductor.

5. The light emitting element according to claim 1, wherein
a meeting portion is not on a normal line that passes through a center of the concave surface portion; and
the meeting portion includes a plurality of crystal defects.

6. The light emitting element according to claim 5, wherein an orthogonal projection image of the meeting portion on the substrate is not in the concave surface portion.

7. A method for manufacturing a light emitting element, the method comprising:
- forming a concave surface portion on a surface of a substrate;
- forming a first light reflecting layer on at least the concave surface portion;
- forming a layered structure on the surface of the substrate and the concave surface portion, wherein the layered structure includes a first compound semiconductor layer, an active layer, and a second compound semiconductor layer;
- forming a second light reflecting layer on the second compound semiconductor layer.

8. The method for manufacturing the light emitting element according to claim 7, further comprising forming a cavity between the first light reflecting layer and the first compound semiconductor layer.

9. The method for manufacturing the light emitting element according to claim 7, wherein
- the first light reflecting layer and a portion of the first compound semiconductor layer on the concave surface portion forms a resonator structure;
- the active layer is configured to emit first light that have an oscillation wavelength $\lambda_0$;
- the oscillation wavelength $\lambda_0$ satisfies a resonance condition of the resonator structure based on a length of the resonator; and
- second light having a wavelength $\lambda'$ adjacent to the oscillation wavelength $\lambda_0$ does not satisfy the resonance condition of the resonator structure based on the length of the resonator.

* * * * *